(12) United States Patent
Shin et al.

(10) Patent No.: US 12,382,780 B2
(45) Date of Patent: Aug. 5, 2025

(54) ORGANIC LIGHT EMITTING DIODE AND ORGANIC LIGHT EMITTING DEVICE INCLUDING THE SAME

(71) Applicant: LG DISPLAY CO., LTD., Seoul (KR)

(72) Inventors: Ji-Cheol Shin, Paju-si (KR); Seong-Su Jeon, Paju-si (KR); Shin-Han Kim, Paju-si (KR); Seon-Keun Yoo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 903 days.

(21) Appl. No.: 17/551,804

(22) Filed: Dec. 15, 2021

(65) Prior Publication Data

US 2022/0209126 A1     Jun. 30, 2022

(30) Foreign Application Priority Data

Dec. 21, 2020  (KR) .................. 10-2020-0179675

(51) Int. Cl.
*H10K 50/13* (2023.01)
*H10K 50/17* (2023.01)
*H10K 59/12* (2023.01)
*H10K 85/60* (2023.01)
*H10K 50/12* (2023.01)
*H10K 50/125* (2023.01)

(52) U.S. Cl.
CPC .......... *H10K 50/131* (2023.02); *H10K 50/17* (2023.02); *H10K 59/12* (2023.02); *H10K 85/624* (2023.02); *H10K 85/626* (2023.02); *H10K 85/633* (2023.02); *H10K 50/12* (2023.02); *H10K 50/125* (2023.02)

(58) Field of Classification Search
None
See application file for complete search history.

(56) References Cited

U.S. PATENT DOCUMENTS

| | | | |
|---|---|---|---|
| 2010/0288362 A1 | 11/2010 | Hatwar et al. | |
| 2019/0326542 A1 | 10/2019 | Yang et al. | |
| 2020/0044177 A1 | 2/2020 | Kim et al. | |
| 2020/0144552 A1* | 5/2020 | Kim | H10K 85/631 |
| 2021/0159462 A1* | 5/2021 | Hamer | H10K 59/876 |

FOREIGN PATENT DOCUMENTS

| | | |
|---|---|---|
| CN | 102439746 A | 5/2012 |
| CN | 110495005 A | 11/2019 |
| CN | 110783375 A | 2/2020 |
| KR | 10-2015-0014380 A | 2/2015 |
| KR | 10-2018-0061948 A | 6/2018 |
| KR | 10-2018-0131100 A | 12/2018 |
| KR | 10-2019-0123829 A | 11/2019 |

OTHER PUBLICATIONS

Office Action dated Oct. 17, 2024, issued in corresponding Korean Intellectual Application No. 10-2020-0179675.
First Office Action dated Nov. 26, 2024 issued in Chinese Patent Application No. 202111527443.2.

* cited by examiner

*Primary Examiner* — Robert S Loewe
(74) *Attorney, Agent, or Firm* — Morgan, Lewis & Bockius LLP

(57) ABSTRACT

The present disclosure relates to an organic light emitting diode including a first electrode; a second electrode facing the first electrode; a first p-type doping layer between the first and second electrodes; a second p-type doping layer between the first p-type doping layer and the second electrode; a third p-type doping layer between the second p-type doping layer and the second electrode; a first emitting material layer between the first and second p-type doping layers; a second emitting material layer between the second and third p-type doping layers; and a third emitting material layer between the third p-type doping layer and the second electrode, wherein an electrical conductivity of the third p-type doping layer is greater than an electrical conductivity of the first p-type doping layer and is equal to or smaller than an electrical conductivity of the second p-type doping layer.

18 Claims, 4 Drawing Sheets

ORGANIC LIGHT EMITTING DIODE AND ORGANIC LIGHT EMITTING DEVICE INCLUDING THE SAME

CROSS-REFERENCE TO RELATED APPLICATIONS

The present application claims the benefit of Korean Patent Application No. 10-2020-0179675 filed in the Republic of Korea on Dec. 21, 2020, which is hereby incorporated by reference in its entirety.

BACKGROUND

Technical Field

The present disclosure relates to an organic light emitting diode (OLED), and more particularly, to an OLED having low driving voltage and high emitting efficiency and lifespan and an organic light emitting device including the OLED.

Discussion of the Related Art

Recently, requirement for flat panel display devices having small occupied area is increased. Among the flat panel display devices, a technology of an organic light emitting display device, which includes an OLED, is rapidly developed.

The OLED emits light by injecting electrons from a cathode as an electron injection electrode and holes from an anode as a hole injection electrode into an organic emitting layer, combining the electrons with the holes, generating an exciton, and transforming the exciton from an excited state to a ground state. A flexible transparent substrate, for example, a plastic substrate, can be used as a base substrate where elements are formed. In addition, the OLED can be operated at a voltage (e.g., 10V or below) lower than a voltage required to operate other display devices and has low power consumption. Moreover, the light from the OLED has excellent color purity.

The OLED may include a first electrode as an anode, a second electrode as cathode facing the first electrode and an organic emitting layer between the first and second electrodes.

To improve the emitting efficiency of the OLED, the organic emitting layer may include a hole injection layer (HIL), a hole transporting layer (HTL), an emitting material layer (EML), an electron transporting layer (ETL) and an electron injection layer (EIL) sequentially stacked on the first electrode.

In the OLED, the hole from the first electrode as the anode is transferred into the EML through the HIL and the HTL, and the electron from the second electrode as the cathode is transferred into the EML through the EIL and the ETL. The hole and the electron are combined in the EML to form the exciton, and the exciton is transformed from an excited state to a ground state to emit the light.

To provide low driving voltage and sufficient emitting efficiency and lifespan of the OLED, sufficient hole injection efficiency and sufficient hole transporting efficiency are required.

SUMMARY

The embodiments of the present disclosure are directed to an OLED and an organic light emitting device that substantially obviate one or more of the problems associated with the limitations and disadvantages of the related conventional art.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, an organic light emitting diode comprises a first electrode; a second electrode facing the first electrode; a first p-type doping layer between the first and second electrodes; a second p-type doping layer between the first p-type doping layer and the second electrode; a third p-type doping layer between the second p-type doping layer and the second electrode; a first emitting material layer between the first and second p-type doping layers; a second emitting material layer between the second and third p-type doping layers; and a third emitting material layer between the third p-type doping layer and the second electrode, wherein an electrical conductivity of the third p-type doping layer is greater than an electrical conductivity of the first p-type doping layer and is equal to or smaller than an electrical conductivity of the second p-type doping layer.

In another aspect, an organic light emitting device comprises a substrate; an organic light emitting diode positioned on the substrate and including a first electrode; a second electrode facing the first electrode; a first p-type doping layer between the first and second electrodes; a second p-type doping layer between the first p-type doping layer and the second electrode; a third p-type doping layer between the second p-type doping layer and the second electrode; a first emitting material layer between the first and second p-type doping layers; a second emitting material layer between the second and third p-type doping layers; and a third emitting material layer between the third p-type doping layer and the second electrode; and an encapsulation film covering the organic light emitting diode, wherein an electrical conductivity of the third p-type doping layer is greater than an electrical conductivity of the first p-type doping layer and is equal to or smaller than an electrical conductivity of the second p-type doping layer.

It is to be understood that both the foregoing general description and the following detailed description are exemplary and explanatory and are intended to further explain the present disclosure as claimed.

BRIEF DESCRIPTION OF THE DRAWINGS

The accompanying drawings, which are included to provide a further understanding of the present disclosure and are incorporated in and constitute a part of this application, illustrate embodiments of the present disclosure and together with the description serve to explain various principles of the present disclosure.

DETAILED DESCRIPTION

Reference will now be made in detail to embodiments of the present disclosure, examples of which are illustrated in the accompanying drawings.

The present disclosure relates an OLED and an organic light emitting device including the OLED. For example, the organic light emitting device may be an organic light emitting display device or an organic lightening device. As an example, an organic light emitting display device, which is a display device including the OLED of the present disclosure, will be mainly described.

Figure 1:
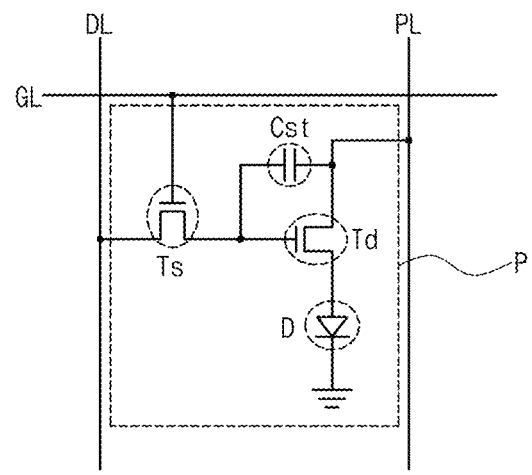
FIG. 1 is a schematic circuit diagram of an organic light emitting display device of the present disclosure.

FIG. 1 is a schematic circuit diagram illustrating an organic light emitting display device of the present disclosure.

As illustrated in FIG. 1, a gate line GL and a data line DL, which cross each other to define a pixel (pixel) P, and a power line PL are formed in an organic light display device. A switching thin film transistor (TFT) Ts, a driving TFT Td, a storage capacitor Cst and an OLED D are formed in the pixel P. The pixel P may include a red pixel, a green pixel and a blue pixel. In addition, the pixel P may further include a white pixel.

The switching thin film transistor Ts is connected to the gate line GL and the data line DL, and the driving thin film transistor Td and the storage capacitor Cst are connected between the switching thin film transistor Ts and the power line PL. The OLED D is connected to the driving thin film transistor Td. When the switching thin film transistor Ts is turned on by the gate signal applied through the gate line GL, the data signal applied through the data line DL is applied into a gate electrode of the driving thin film transistor Td and one electrode of the storage capacitor Cst through the switching thin film transistor Ts.

The driving thin film transistor Td is turned on by the data signal applied into the gate electrode so that a current proportional to the data signal is supplied from the power line PL to the OLED D through the driving thin film transistor Tr. The OLED D emits light having a luminance proportional to the current flowing through the driving thin film transistor Td. In this case, the storage capacitor Cst is charged with a voltage proportional to the data signal so that the voltage of the gate electrode in the driving thin film transistor Td is kept constant during one frame. Therefore, the organic light emitting display device can display a desired image.

Figure 2:
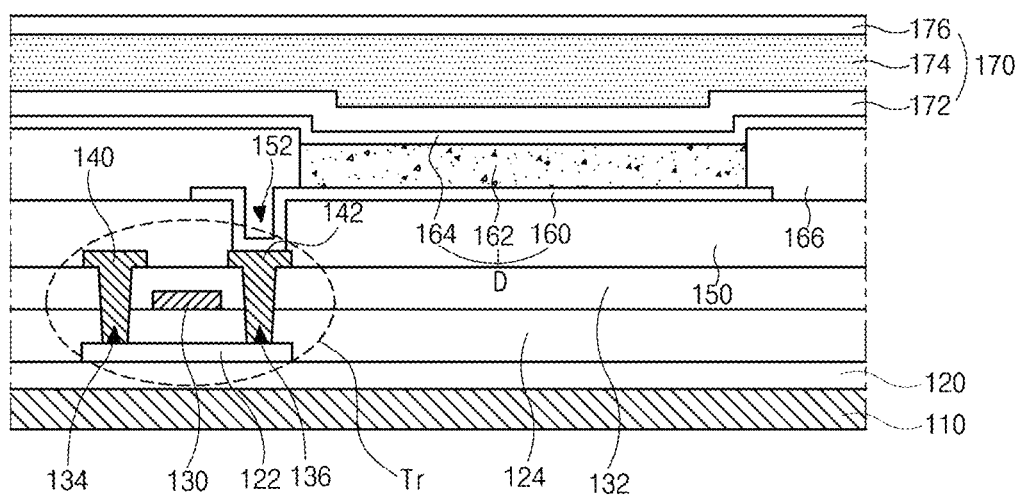
FIG. 2 is a schematic cross-sectional view of an organic light emitting device according to a first embodiment of the present disclosure.

FIG. 2 is a schematic cross-sectional view illustrating an organic light emitting display device according to a first embodiment of the present disclosure.

As illustrated in FIG. 2, the organic light emitting display device 100 includes a substrate 110, a TFT Tr and an OLED D disposed on a planarization layer 150 and connected to the TFT Tr. For example, the organic light emitting display device 100 may include a red pixel, a green pixel and a blue pixel, and the OLED D may be formed in each of the red, green and blue pixels. Namely, the OLEDs D emitting red light, green light and blue light may be provided in the red, green and blue pixels, respectively. Alternatively, the OLED D in the red, green and blue pixels may emit the same color light, e.g., white light.

The substrate 110 may be a glass substrate or a flexible substrate. For example, the flexible substrate may be a polyimide (PI) substrate, a polyethersulfone (PES) substrate, a polyethylenenaphthalate (PEN) substrate, a polyethylene terephthalate (PET) substrate or a polycarbonate (PC) substrate.

A buffer layer 120 is formed on the substrate, and the TFT Tr is formed on the buffer layer 120. The buffer layer 120 may be omitted.

A semiconductor layer 122 is formed on the buffer layer 120. The semiconductor layer 122 may include an oxide semiconductor material or polycrystalline silicon.

When the semiconductor layer 122 includes the oxide semiconductor material, a light-shielding pattern (not shown) may be formed under the semiconductor layer 122. The light to the semiconductor layer 122 is shielded or blocked by the light-shielding pattern such that thermal degradation of the semiconductor layer 122 can be prevented. On the other hand, when the semiconductor layer 122 includes polycrystalline silicon, impurities may be doped into both sides of the semiconductor layer 122.

A gate insulating layer 124 is formed on the semiconductor layer 122. The gate insulating layer 124 may be formed of an inorganic insulating material such as silicon oxide or silicon nitride.

A gate electrode 130, which is formed of a conductive material, e.g., metal, is formed on the gate insulating layer 124 to correspond to a center of the semiconductor layer 122.

In FIG. 2, the gate insulating layer 124 is formed on an entire surface of the substrate 110. Alternatively, the gate insulating layer 124 may be patterned to have the same shape as the gate electrode 130.

An interlayer insulating layer 132, which is formed of an insulating material, is formed on the gate electrode 130. The interlayer insulating layer 132 may be formed of an inorganic insulating material, e.g., silicon oxide or silicon nitride, or an organic insulating material, e.g., benzocyclobutene or photo-acryl.

The interlayer insulating layer 132 includes first and second contact holes 134 and 136 exposing both sides of the semiconductor layer 122. The first and second contact holes 134 and 136 are positioned at both sides of the gate electrode 130 to be spaced apart from the gate electrode 130.

The first and second contact holes 134 and 136 are formed through the gate insulating layer 124. Alternatively, when the gate insulating layer 124 is patterned to have the same shape as the gate electrode 130, the first and second contact holes 134 and 136 are formed only through the interlayer insulating layer 132.

A source electrode 140 and a drain electrode 142, which are formed of a conductive material, e.g., metal, are formed on the interlayer insulating layer 132.

The source electrode 140 and the drain electrode 142 are spaced apart from each other with respect to the gate electrode 130 and respectively contact both sides of the semiconductor layer 122 through the first and second contact holes 134 and 136.

The semiconductor layer 122, the gate electrode 130, the source electrode 140 and the drain electrode 142 constitute the TFT Tr. The TFT Tr serves as a driving element. Namely, the TFT Tr may correspond to the driving TFT Td (of FIG. 1).

In the TFT Tr, the gate electrode 130, the source electrode 140, and the drain electrode 142 are positioned over the semiconductor layer 122. Namely, the TFT Tr has a coplanar structure.

Alternatively, in the TFT Tr, the gate electrode may be positioned under the semiconductor layer, and the source and drain electrodes may be positioned over the semiconductor layer such that the TFT Tr may have an inverted staggered structure. In this instance, the semiconductor layer may include amorphous silicon.

Although not shown, the gate line and the data line cross each other to define the pixel, and the switching TFT is formed to be connected to the gate and data lines. The switching TFT is connected to the TFT Tr as the driving element.

In addition, the power line, which may be formed to be parallel to and spaced apart from one of the gate and data lines, and the storage capacitor for maintaining the voltage of the gate electrode of the TFT Tr in one frame may be further formed.

A planarization layer 150, which includes a drain contact hole 152 exposing the drain electrode 142 of the TFT Tr, is formed to cover the TFT Tr.

A first electrode 160, which is connected to the drain electrode 142 of the TFT Tr through the drain contact hole 152, is separately formed in each pixel and on the planarization layer 150. The first electrode 160 may be an anode and may be formed of a conductive material, e.g., a transparent conductive oxide (TCO), having a relatively high work function. For example, the first electrode 160 may be formed of indium-tin-oxide (ITO), indium-zinc-oxide (IZO), indium-tin-zinc-oxide (ITZO), tin oxide (SnO), zinc oxide (ZnO), indium-copper-oxide (ICO) or aluminum-zinc-oxide (Al:ZnO, AZO).

When the organic light emitting display device 100 is operated in a bottom-emission type, the first electrode 160 may have a single-layered structure of the transparent conductive oxide. When the organic light emitting display device 100 is operated in a top-emission type, a reflection electrode or a reflection layer may be formed under the first electrode 160. For example, the reflection electrode or the reflection layer may be formed of silver (Ag) or aluminum-palladium-copper (APC) alloy. In this instance, the first electrode 160 may have a triple-layered structure of ITO/Ag/ITO or ITO/APC/ITO.

A bank layer 166 is formed on the planarization layer 150 to cover an edge of the first electrode 160. Namely, the bank layer 166 is positioned at a boundary of the pixel and exposes a center of the first electrode 160 in the pixel.

An organic emitting layer 162 is formed on the first electrode 160, and a second electrode 164 is formed over the substrate 110 where the organic emitting layer 162 is formed. The second electrode 164 covers an entire surface of the display area and may be formed of a conductive material having a relatively low work function to serve as a cathode. For example, the second electrode 164 may be formed of aluminum (Al), magnesium (Mg), silver (Ag) or their alloy, e.g., Al—Mg alloy (AlMg) or Ag—Mg alloy (MgAg). In the top-emission type organic light emitting display device 100, the second electrode 164 may have a thin profile (small thickness) to provide a light transmittance property (or a semi-transmittance property).

Namely, one of the first and second electrodes 160 and 164 is a transparent (or semi-transparent) electrode, and the other one of the first and second electrodes 160 and 164 is a reflection electrode.

Although not shown, the organic emitting layer 162 includes a first p-type doping layer positioned between the first electrode 160 and the second electrode 164, a second p-type doping layer positioned between the first p-type doping layer and the second electrode 164 and a third p-type doping layer positioned between the first and second p-type doping layers, and the third p-type doping layer has an electric conductivity being greater than the first p-type doping layer and being equal to or smaller than the second p-type doping layer. As a result, in the OLED D and the organic light emitting display device 100, the driving voltage is decreased, and the emitting efficiency and the lifespan are increased.

The first electrode 160, the organic emitting layer 162 and the second electrode 164 constitute the OLED D.

An encapsulation film 170 is formed on the second electrode 164 to prevent penetration of moisture into the OLED D. The encapsulation film 170 includes a first inorganic insulating layer 172, an organic insulating layer 174 and a second inorganic insulating layer 176 sequentially stacked, but it is not limited thereto. The encapsulation film 170 may be omitted.

The organic light emitting display device 100 may further include a color filter layer (not shown). The color filter layer may include a red color filter, a green color filter and a blue color filter respectively corresponding to the red pixel, the green pixel and the blue pixel. The color purity of the organic light emitting display device 100 may be improved by the color filter layer.

The organic light emitting display device 100 may further include a polarization plate (not shown) for reducing an ambient light reflection. For example, the polarization plate may be a circular polarization plate. In the bottom-emission type organic light emitting display device 100, the polarization plate may be disposed under the substrate 110. In the top-emission type organic light emitting display device 100, the polarization plate may be disposed on or over the encapsulation film 170.

In addition, in the top-emission type organic light emitting display device 100, a cover window (not shown) may be attached to the encapsulation film 170 or the polarization plate. In this instance, the substrate 110 and the cover window have a flexible property such that a flexible organic light emitting display device may be provided.

Figure 3:
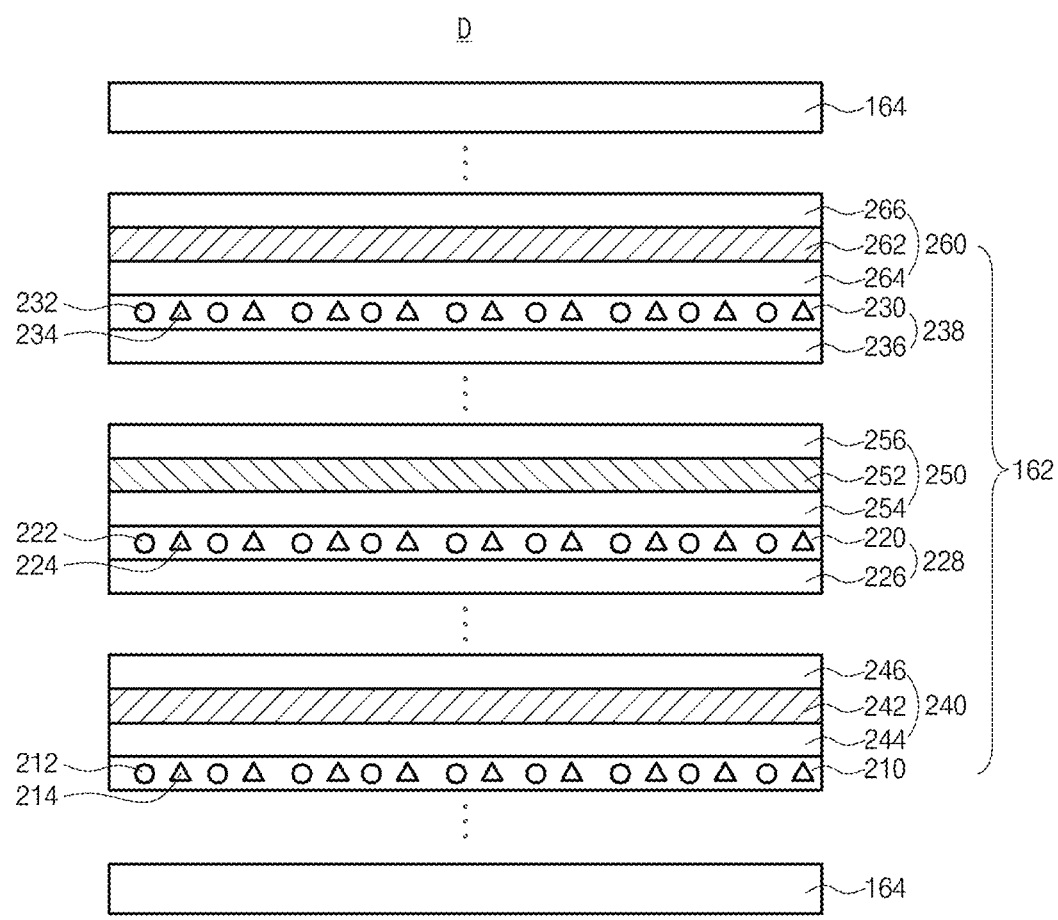
FIG. 3 is a schematic cross-sectional view of an OLED according to a second embodiment of the present disclosure.

FIG. 3 is a schematic cross-sectional view illustrating an OLED according to a second embodiment.

As shown in FIG. 3, the OLED D includes the first and second electrodes 160 and 164 facing each other and the organic emitting layer 162 between the first and second electrodes 160 and 164. The organic emitting layer 162 includes a first emitting part 240, an m-th emitting part 250, an n-th emitting part 260, a first p-type doping layer 210 between the first emitting part 240 and the first electrode 160, an m-th p-type doping layer 220 between the first emitting part 240 and the m-th emitting part 250 and an n-th p-type doping layer 230 between the m-th emitting part 250 and the n-th emitting part 260.

Namely, the OLED D of the present disclosure includes at least three emitting parts and at least three p-type doping layers.

The first electrode 160 is an anode, and the second electrode 164 is a cathode. One of the first and second electrodes 160 and 164 is a transparent electrode (or a semi-transparent electrode), and the other one of the first and second electrodes 160 and 164 is a reflection electrode.

The first emitting part 240 includes a first emitting material layer (EML) 242.

In addition, the first emitting part 240 may further include at least one of a first hole auxiliary layer 244 disposed under the first EML 242 and a first electron auxiliary layer 246 disposed over the first EML 242. Namely, the first hole auxiliary layer 244 may be positioned between the first p-type doping layer 210 and the first EML 242, and the first electron auxiliary layer 246 may be positioned between the first EML 242 and the m-th p-type doping layer 220. For example, the first hole auxiliary layer 244 may be a hole transporting layer (HTL), and the first electron auxiliary layer 246 may be an electron transporting layer (ETL).

Although not shown, the first emitting part 240 may further include at least one of an electron blocking layer (EBL) between the first hole auxiliary layer 244 and the first EML 242 and a hole blocking layer (HBL) between the first EML 242 and the first electron auxiliary layer 246.

The m-th emitting part 250 includes an m-th EML 252.

In addition, the m-th emitting part 250 may further include at least one of an m-th hole auxiliary layer 254 disposed under the m-th EML 252 and an m-th electron auxiliary layer 256 disposed over the m-th EML 252. Namely, the m-th hole auxiliary layer 254 may be positioned between the m-th p-type doping layer 220 and the m-th EML 252, and the m-th electron auxiliary layer 256 may be positioned between the m-th EML 252 and the n-th p-type doping layer 230. For example, the m-th hole auxiliary layer 254 may be an HTL, and the m-th electron auxiliary layer 256 may be an ETL.

The n-th emitting part 260 includes an n-th EML 262.

In addition, the n-th emitting part 260 may further include at least one of an n-th hole auxiliary layer 264 disposed under the n-th EML 262 and an n-th electron auxiliary layer 266 disposed over the n-th EML 262. Namely, the n-th hole auxiliary layer 264 may be positioned between the n-th p-type doping layer 230 and the n-th EML 262, and the n-th electron auxiliary layer 266 may be positioned between the n-th EML 262 and the second electrode 164. For example, the n-th hole auxiliary layer 264 may be a hole transporting layer (HTL), and the n-th electron auxiliary layer 266 may include at least one of an ETL and an electron injection layer (EIL).

Although not shown, the n-th emitting part 260 may further include at least one of an EBL between the n-th hole auxiliary layer 264 and the n-th EML 262 and an HBL between the n-th EML 262 and the n-th electron auxiliary layer 266.

The HTL may include at least one compound selected from the group consisting of N,N'-diphenyl-N,N'-bis(3-methylphenyl)-1,1'-biphenyl-4,4'-diamine (TPD), N,N'-diphenyl-N,N'-bis(1-naphthyl)-1,1'-biphenyl-4,4"-diamine (NPD), 4,4'-bis(N-carbazolyl)-1,1'-biphenyl (CBP), poly[N,N'-bis(4-butylphenyl)-N,N'-bis(phenyl)-benzidine] (poly-TPD), (poly[(9,9-dioctylfluorenyl-2,7-diyl)-co-(4,4'-(N-(4-sec-butylphenyl)diphenylamine))] (TFB), di-[4-(N,N-di-p-tolyl-amino)-phenyl]cyclohexane (TAPC), 3,5-di(9H-carbazol-9-yl)-N,N-diphenylaniline (DCPA), N-(biphenyl-4-yl)-9,9-dimethyl-N-(4-(9-phenyl-9H-carbazol-3-yl)phenyl)-9H-fluoren-2-amine, and N-(biphenyl-4-yl)-N-(4-(9-phenyl-9H-carbazol-3-yl)phenyl)biphenyl-4-amine, but it is not limited thereto.

For example, the HTL may include NPD and may have a thickness of 5 to 150 nm, preferably 10 to 120 nm. Preferably, a first HTL of the first hole auxiliary layer 244, an m-th HTL of the m-th hole auxiliary layer 254 and an n-th HTL of the n-th hole auxiliary layer 264 may include the same material, e.g., NPD. In addition, a thickness of the n-th HTL of the n-th hole auxiliary layer 264 may be smaller than that of the first HTL of the first hole auxiliary layer 244 and may be greater than that of the m-th HTL of the m-th hole auxiliary layer 254.

The EBL may include at least one compound selected from the group consisting of tris(4-carbazoyl-9-yl-phenyl) amine (TCTA), tris[4-(diethylamino)phenyl]amine, N-(biphenyl-4-yl)-9,9-dimethyl-N-(4-(9-phenyl-9H-carbazol-3-yl)phenyl)-9H-fluoren-2-amine, TAPC, 4,4',4"-tris(3-methylphenylamino)triphenylamine (MTDATA), 1,3-bis (carbazol-9-yl)benzene (mCP), 3,3'-bis(N-carbazolyl)-1,1'-biphenyl (mCBP), copper phthalocyanine (CuPc), N,N'-bis [4-[bis(3-methylphenyl)amino]phenyl]-N,N'-diphenyl-[1,1'-biphenyl]-4,4'-diamine (DNTPD), 1,3,5-tris[4-(diphenylamino)phenyl]benzene (TDAPB), DCDPA, and 2,8-bis(9-phenyl-9H-carbazol-3-yl)dibenzo[b,d]thiophene), but it is not limited thereto. The EBL may have a thickness of 1 to 35 nm, preferably 10 to 20 nm.

The HBL may include at least one compound selected from the group consisting of tris-(8-hydroxyquinoline) aluminum ($Alq_3$), 2-biphenyl-4-yl-5-(4-t-butylphenyl)-1,3,4-oxadiazole (PBD), spiro-PBD, lithium quinolate (Liq), 2,2',2"-(1,3,5-benzenetriyl)-tris(1-phenyl-1-H benzimidazole) (TPBi), bis(2-methyl-8-quinolinolato-N1,O8)-(1,1'-biphenyl-4-olato)aluminum (BAlq), 4,7-diphenyl-1,10-phenanthroline (Bphen), 2,9-bis(naphthalene-2-yl)4,7-diphenyl-1,10-phenanthroline (NBphen), 2,9-dimethyl-4,7-diphenyl-1,10-phenanthroline (BCP), 3-(4-biphenyl)-4-phenyl-5-tert-butylphenyl-1,2,4-triazole (TAZ), 4-(naphthalen-1-yl)-3,5-diphenyl-4H-1,2,4-triazole (NTAZ), 1,3,5-trip-pyrid-3-yl-phenyl)benzene (TpPyPB), 2,4,6-tris(3'-(pyridin-3-yl)biphenyl-3-yl)1,3,5-triazine (TmPPPyTz), Poly[9,9-bis(3'-((N,N-dimethyl)-N-ethylammonium)-propyl)-2,7-fluorene]-alt-2,7-(9,9-dioctylfluorene)] (PFNBr), tris(phenylquinoxaline (TPQ), and diphenyl-4-triphenylsilyl-phenylphosphine oxide (TSPO1), but it is not limited thereto. For example, the HBL may have a thickness of 1 to 35 nm, preferably 10 to 20 nm.

The ETL may include at least one compound selected from the group consisting of 1,3,5-tri(m-pyridin-3-ylphenyl) benzene (TmPyPB), 2,2',2"-(1,3,5-benzinetriyl)-tris(1-phenyl-1-H benzimidazole)(TPBi), tris(8-hydroxy-quinolinato) aluminum ($Alq_3$), 2-(4-biphenyl)-5-(4-tert-butylphenyl)-1,3,4-oxadiazole (PBD), 3-(4-biphenyl)-4-phenyl-5-tert-butylphenyl-1,2,4-triazole (TAZ), 2-biphenyl-4-yl-4,6-bis-(4'-pyridin-2-yl-biphenyl-4-yl)-[1,3,5]triazine (DPT), and bis(2-methyl-8-quinolinolate)-4-(phenylphenolato)aluminum (BAlq), but it is not limited thereto. For example, the ETL may include an azine-based compound, e.g., TmPyPB, or an imidazole-based compound, e.g., TPBi, and may have a thickness of 50 to 350 Å, preferably 10 to 40 nm.

For example, each of a first ETL of the first electron auxiliary layer 246 and an n-th ETL of the n-th electron auxiliary layer 266 may include the azine-based compound, e.g., TmPyPB, and an m-th ETL of the m-th electron auxiliary layer 256 may include the imidazole-based compound, e.g., TPBi. Each of the first ETL of the first electron auxiliary layer 246 and the m-th ETL of the m-th electron auxiliary layer 256 may have the same thickness, and the n-th ETL of the n-th electron auxiliary layer 266 may have a thickness being greater than that of each of the first ETL of the first electron auxiliary layer 246 and the m-th ETL of the m-th electron auxiliary layer 256.

The EIL, which may be included in the n-th electron auxiliary layer 266, may include at least one of an alkali metal, e.g., Li, an alkali halide compound, such as LiF, CsF, NaF, or $BaF_2$, and an organo-metallic compound, such as Liq, lithium benzoate, or sodium stearate, but it is not limited thereto. For example, the EIL may have a thickness of 1 to 10 nm, preferably 1 to 5 nm.

The first EML 242, the m-th EML 252 and the n-th EML 262 may emit the light having the same color or different colors. Alternatively, two of the first EML 242, the m-th EML 252 and the n-th EML 262 may emit a first color, i.e., the same color, and the other one of the first EML 242, the m-th EML 252 and the n-th EML 262 may emit a second color being different the first color.

When one of the first EML 242, the m-th EML 252 and the n-th EML 262 is a red EML, the red EML include a host and a red dopant. When one of the first EML 242, the m-th EML 252 and the n-th EML 262 is a green EML, the green EML include a host and a green dopant. When one of the first EML 242, the m-th EML 252 and the n-th EML 262 is a blue EML, the blue EML include a host and a blue dopant. Each of the red dopant, the green dopant and the blue dopant may be a fluorescent compound, a phosphorescent compound or a delayed fluorescent compound.

For example, in the red EML, the host may be 4,4'-bis(carbazol-9-yl)biphenyl (CBP), and the red dopant may be selected from the group consisting of bis(1-phenylisoquinoline)acetylacetonate iridium (PIQIr(acac)), bis(1-phenylquinoline)acetylacetonate iridium (PQIr(acac)), tris(1-phenylquinoline)iridium (PQIr), and octaethylporphyrin platinum (PtOEP). The EML in the red pixel may provide the light having a wavelength range (e.g., an emission wavelength range) of about 600 to 650 nm.

In the green EML, the host may be CBP, and the green dopant may be fac-tris(2-phenylpyridine)iridium (Ir(ppy)$_3$) or tris(8-hydroxyquinolino)aluminum (Alq$_3$). The EML in the green pixel may provide the light having a wavelength range of about 510 to 570 nm.

In the blue EML, the host may be an anthracene derivative, and the blue dopant may be a pyrene derivative. For example, the host may be 9,10-di(naphtha-2-yl)anthracene, and the blue dopant may be 1,6-bis(diphenylamino)pyrene. In the blue EML, the blue dopant may have a weight % of 0.1 to 20, preferably 1 to 10. The blue EML may have a thickness of 50 to 350 Å, preferably 100 to 300 Å and may provide the light having a wavelength range of about 440 to 480 nm.

The first p-type doping layer 210 provides a hole into the first emitting part 240, the m-th p-type doping layer 220 provides a hole into the m-th emitting part 250, and the n-th p-type doping layer 230 provides a hole into the n-th emitting part 260.

For example, the hole is provided from the first p-type doping layer 210 into the first EML 242 through the first hole auxiliary layer 244, and the hole is provided from the m-th p-type doping layer 220 into the m-th EML 252 through the m-th hole auxiliary layer 254. In addition, the hole is provided from the n-th p-type doping layer 230 into the n-th EML 262 through the n-th hole auxiliary layer 264.

The first p-type doping layer 210 may contact the first electrode 160 and may be a hole injection layer. Alternatively, an n-type charge generation layer (not shown) is disposed under the first p-type doping layer 210, and the first p-type doping layer 210 may be a p-type charge generation layer. In this instance, the first p-type doping layer 210 and the n-type charge generation layer under the first p-type doping layer 210 constitute a charge generation layer (CGL).

An n-type CGL 226 is disposed under the m-th p-type doping layer 220, and the m-th p-type doping layer 220 may be a p-type CGL. In this instance, the m-th p-type doping layer 220 and the n-type CGL 226 under the m-th p-type doping layer 220 constitute a CGL 228.

An n-type CGL 236 is disposed under the n-th p-type doping layer 230, and the n-th p-type doping layer 230 may be a p-type CGL. In this instance, the n-th p-type doping layer 230 and the n-type CGL 236 under the n-th p-type doping layer 230 constitute a CGL 238.

The n-type CGLs 226 and 236 provide an electron into the electron auxiliary layers 246 and 256, and the electron is provided into the first emitting part 240 and the m-th emitting part 250 through the electron auxiliary layers 246 and 256. As a result, the driving voltage of the OLED D having a multi-tandem structure is reduced, and the emitting efficiency of the OLED D is improved.

Each of the n-type CGLs 226 and 236 includes an n-type charge generation material and may have a thickness of 10 to 20 nm. For example, the n-type charge generation material may be selected from the group consisting of tris-(8-hydroxyquinoline) aluminum (Alq3), 2-biphenyl-4-yl-5-(4-t-butylphenyl)-1,3,4-oxadiazole (PBD), spiro-PBD, lithium quinolate (Liq), 1,3,5-tris(N-phenylbenzimidazol-2-yl)benzene (TPBi), bis(2-methyl-8-quinolinolato-N1,O8)-(1,1'-biphenyl-4-olato)aluminum (BAlq), 4,7-diphenyl-1,10-phenanthroline (Bphen), 2,9-bis(naphthalene-2-yl)4,7-diphenyl-1,10-phenanthroline (NBphen), 2,9-dimethyl-4,7-diphenyl-1,10-phenanthroline (BCP), 3-(4-biphenyl)-4-phenyl-5-tert-butylphenyl-1,2,4-triazole (TAZ), 4-(naphthalen-1-yl)-3,5-diphenyl-4H-1,2,4-triazole (NTAZ), 1,3,5-tri(p-pyrid-3-yl-phenyl)benzene (TpPyPB), 2,4,6-tris(3'-(pyridin-3-yl)biphenyl-3-yl)1,3,5-triazine (TmPPPyTz), poly[9,9-bis(3'-((N,N-dimethyl)-N-ethylammonium)-propyl)-2,7-fluorene]-alt-2,7-(9,9-dioctylfluorene)] (PFNBr), tris(phenylquinoxaline) (TPQ), and diphenyl-4-triphenylsilyl-phenylphosphine oxide (TSPO1). In one embodiment of the present disclosure, the n-type charge generation material may be phenanthroline derivative, e.g., bathophenanthroline (Bphen).

In addition, each of the n-type CGLs 226 and 236 may further include an auxiliary n-type charge generation material. For example, the auxiliary n-type charge generation material may be alkali metal, e.g., Li, Cs, K, Rb, Na or Fr, or alkali earth metal, e.g., Be, Mg, Ca, Sr, Ba or Ra. In each of the n-type CGLs 226 and 236, the auxiliary n-type charge generation material may have a weight % of about 0.1 to 20, preferably about 1 to 10.

The first p-type doping layer 210 has a first electrical conductivity, the m-th p-type doping layer 220 has a second electrical conductivity, and the n-th p-type doping layer 230 has a third electrical conductivity. Each of the second and third electrical conductivities is greater than the first electrical conductivity, and the second electrical conductivity is equal to or greater than the third electrical conductivity. Preferably, the second electrical conductivity may be greater than the third electrical conductivity.

Namely, the electric conductivity of the first p-type doping layer 210 being closer to the first electrode 160 as the anode is smaller than that of each of the m-th and n-th p-type doping layers 220 and 230 being farther from the first electrode 160. In addition, the electrical conductivity of the n-th p-type doping layer 230 being closer to the second electrode 164 as the cathode is equal to or smaller than that of the m-th p-type doping layer 220 positioned between the first p-type doping layer 210 and the n-th p-type doping layer 230.

In other words, the n-th p-type doping layer 230 has the electrical conductivity being greater than the first p-type doping layer 210 and being equal to or smaller than the m-th p-type doping layer 220.

For example, the electrical conductivity of the first p-type doping layer 210 may have a range of $1*10^{-5} \sim 1*10^{-4}$ S/cm, the electrical conductivity of the m-th p-type doping layer 220 may have a range of $1*10^{-4} \sim 1*10^{-3}$ S/cm, and the electrical conductivity of the n-th p-type doping layer 230 may have a range of $3*10^{-5} \sim 6*10^{-4}$ S/cm.

Each of the first p-type doping layer 210, the m-th p-type doping layer 220 and the n-th p-type doping layer 230 includes a p-type dopant 212, 222 and 232 and a host 214, 224 and 234, respectively. In each of the first p-type doping layer 210, the m-th p-type doping layer 220 and the n-th p-type doping layer 230, the p-type dopant 212, 222 and 232 has a weight % being smaller than the host 214, 224 and 234.

The p-type dopant 212, 222 and 232 of each of the first p-type doping layer 210, the m-th p-type doping layer 220 and the n-th p-type doping layer 230 may be a first organic compound being an indacene derivative (e.g., indacene compound) substituted with malononitrile group. The first organic compound may be represented by Formula 1-1.

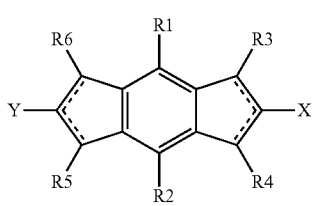

[Formula 1-1]

In Formula 1-1, each of R1 and R2 is independently selected from the group consisting of hydrogen (H), deuterium (D), halogen and cyano. Each of R3 to R6 is independently selected from the group consisting of halogen, cyano, malononitrile, C1 to C10 haloalkyl group and C1 to C10 haloalkoxy group, and at least one of R3 and R4 and at least one of R5 and R6 are malononitrile. Each of X and Y is independently phenyl substituted with at least one of C1 to C10 alkyl group, halogen, cyano, malononitrile, C1 to C10 haloalkyl group and C1 to C10 haloalkoxy group.

For example, the C1 to C10 haloalkyl group may be trifluoromethyl, and the C1 to C10 haloalkoxy group may be trifluoromethoxy. In addition, halogen may be one of F, Cl, Br and I.

In Formula 1-1, one of R3 and R4 and one of R5 and R6 may be malononitrile, and the other one of R3 and R4 and the other one of R5 and R6 may be cyano.

For example, in Formula 1-1, R3 and R6 may be malononitrile. Alternatively, in Formula 1-1, R4 and R6 may be malononitrile. Namely, the first organic compound in Formula 1-1 may be represented by Formula 1-2 or 1-3.

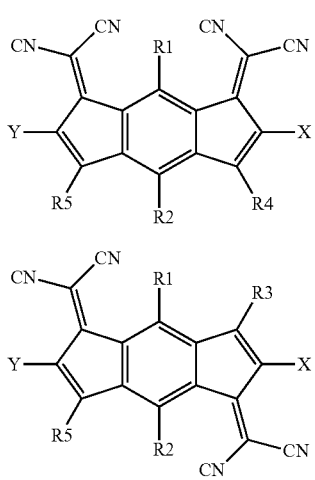

[Formula 1-2]

[Formula 1-3]

In Formula 1-1, the substituents at a first side of the indacene core may be same as the substituents at a second side of the indacene core so that the first organic compound in Formula 1-1 may have a symmetric structure.

Alternatively, in Formula 1-1, the substituents at a first side of the indacene core may be different from the substituents at a second side of the indacene core so that the first organic compound in Formula 1-1 may have an asymmetric structure. For example, each of X and Y may be independently phenyl substituted with at least one of C1 to C10 alkyl group, halogen, cyano, malononitrile, C1 to C10 haloalkyl group and C1 to C10 haloalkoxy group, and X and Y may have a difference in at least one of the substituent and the position of the substituent. Namely, a phenyl moiety being X and a phenyl moiety being Y may have different substituents and/or may have same substituent or different substituents at different positions.

For example, the organic compound in Formula 1-1 may be represented by Formula 1-4.

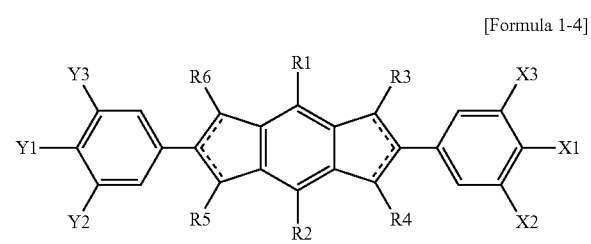

[Formula 1-4]

In Formula 1-4, each of X1 to X3 and each of Y1 to Y3 are independently selected from the group consisting of H, C1 to C10 alkyl group, halogen, cyano, malononitrile, C1 to C10 haloalkyl group and C1 to C10 haloalkoxy group and satisfy at least one of i) X1 and Y1 are different and ii) X2 is different from Y2 and Y3 or X3 is different from Y2 and Y3.

The first organic compound being the p-type dopant 212, 222 and 232 has excellent hole injection, transporting and/or generation property, and thus the hole injection and/or transporting efficiency of the hole toward the first to third emitting parts 240, 250 and 260 are improved.

The host 214, 224 and 234 of each of the first p-type doping layer 210, the m-th p-type doping layer 220 and the n-th p-type doping layer 230 may be a second organic compound being a fluorene derivative (e.g., spiro-fluorene derivative). The second organic compound may be represented by Formula 2-1.

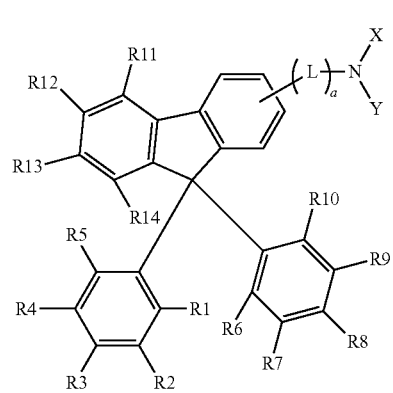

[Formula 2-1]

In Formula 2-1, each of X and Y is independently selected from the group consisting of C6 to C30 aryl group and C5 to C30 heteroaryl group, L is selected from the group consisting of C6 to C30 arylene group and C5 to C30 heteroarylene group, and a is 0 or 1. Each of R1 to R14 is independently selected from the group consisting of H, D, C1 to C10 alkyl group, C6 to C30 aryl group and C5 to C30 heteroaryl group, or adjacent two of R1 to R14 are connected (combined or joined) to each other to form a fused ring.

In Formula 2-1, C6 to C30 aryl (or arylene) may be selected from the group consisting of phenyl, biphenyl, terphenyl, naphthyl, anthracenyl, pentaenyl, indenyl, indenoindenyl, heptalenyl, biphenylenyl, indacenyl, phenanthrenyl, benzophenanthrenyl, dibenzophenanthrenyl, azulenyl, pyrenyl, fluoranthenyl, triphenylenyl, chrysenyl, tetraphenyl, tetrasenyl, picenyl, pentaphenyl, pentacenyl, fluorenyl, indenofluorenyl and spiro-fluorenyl.

In Formula 2-1, C5 to C30 heteroaryl (or heteroarylene) may be selected from the group consisting of pyrrolyl, pyridinyl, pyrimidinyl, pyrazinyl, pyridazinyl, triazinyl, tetrazinyl, imidazolyl, pyrazolyl, indolyl, isoindolyl, indazolyl, indolizinyl, pyrrolizinyl, carbazolyl, benzocarbazolyl, dibenzocarbazolyl, indolocarbazolyl, indenocarbazolyl, benzofurocarbazolyl, benzothienocarbazolyl, quinolinyl, isoquinolinyl, phthalazinyl, quinoxalinyl, cinnolinyl, quinazolinyl, quinazolinyl, quinolinyl, purinyl, phthalazinyl, quinoxalinyl, benzoquinolinyl, benzoisoquinolinyl, benzoquinazolinyl, benzoquinoxalinyl, acridinyl, phenanthrolinyl, perimidinyl, phenanthridinyl, pteridinyl, cinnolinyl, naphthridinyl, furanyl, oxazinyl, oxazolyl, oxadiazolyl, triazolyl, dioxinyl, benzofuranyl, dibenzofuranyl, thiopyranyl, xantenyl, chromanyl, isochromanyl, thioazinyl, thiophenyl, benzothiophenyl, dibenzothiophenyl, difuropyrazinyl, benzofurodibenzofuranyl, benzothienobenzothiophenyl, benzothienodibenzothiophenyl, benzothienobenzofuranyl, and benzothienodibenzofuranyl.

In Formula 2-1, each of C6 to C30 aryl and C5 to C30 heteroaryl may include substituted one and unsubstituted one. Namely, each of C6 to C30 aryl and C5 to C30 heteroaryl may be unsubstituted or substituted with C1 to C10 alkyl group, e.g., methyl, ethyl or tert-butyl.

In Formula 2-1, X and Y may be same or different. Each of X and Y may be selected from fluorenyl, spiro-fluorenyl, phenyl, biphenyl, terphenyl, tert-butyl phenyl, fluorenylphenyl, carbazolyl and carbazolylphenyl, and L may be phenylene. Each of R1 to R14 may be selected from H, D, C1 to C10 alkyl group, e.g., tert-butyl, and C6 to C30 aryl group, e.g., phenyl, and adjacent two of R1 to R14, e.g., R1 and R6, may be connected to form a fused ring. The fused ring may be one of aromatic ring, alicyclic ring and heteroaromatic ring.

The second organic compound in Formula 2-1 may be represented by Formula 2-2 or 2-3.

[Formula 2-2]

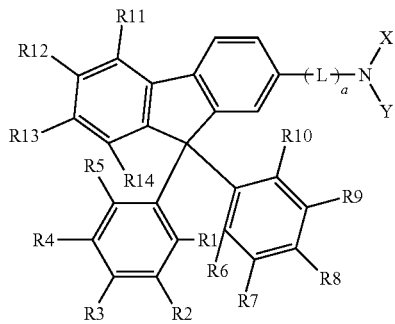

[Formula 2-3]

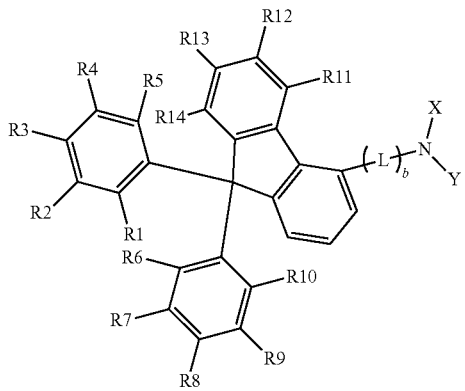

The second organic compound in Formula 2-2 and the second organic compound in Formula 2-3 have a difference in a position of the amino group (or the linker L1). Namely, in the second organic compound of Formula 2-2, the amino group (or the linker L1) is connected to a second position of the fluorene moiety or the spiro-fluorene moiety, while in the second organic compound of Formula 2-3, the amino group (or the linker L1) is connected to a third position of the fluorene moiety or the spiro-fluorene moiety.

The first organic compound in Formula 1-1 may be one of the compounds in Formula 3.

[Formula 3]

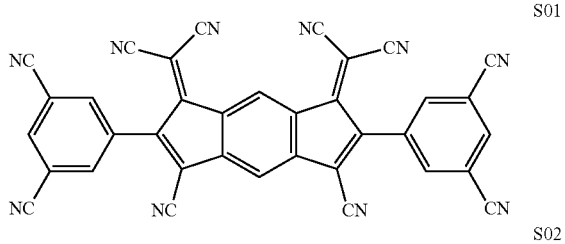

S01

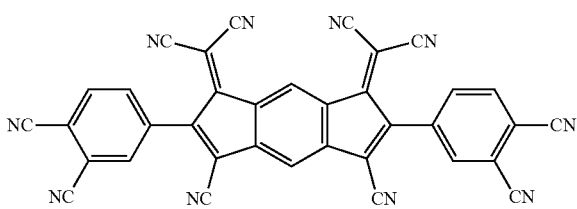

S02

S03
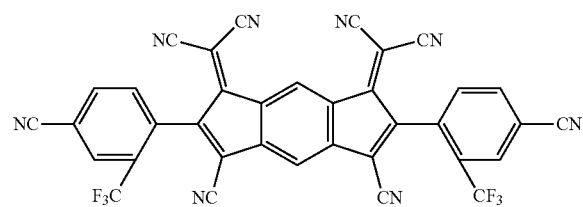
S04
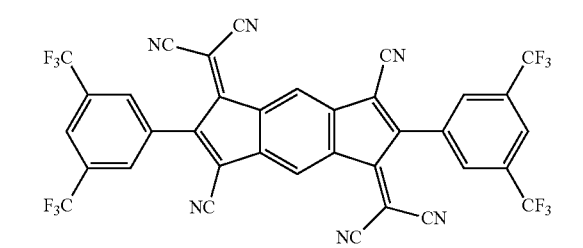
S05
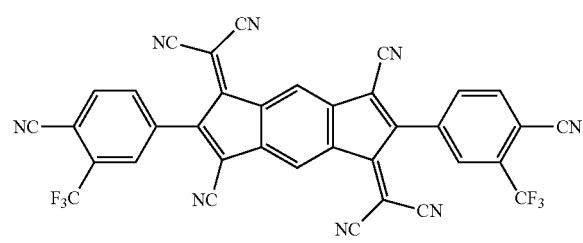
S06
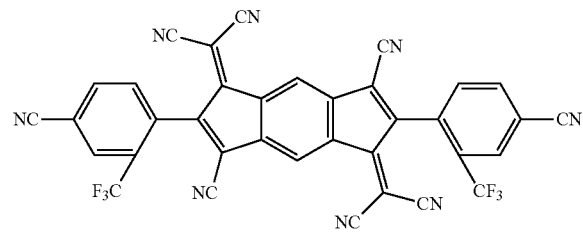
S07
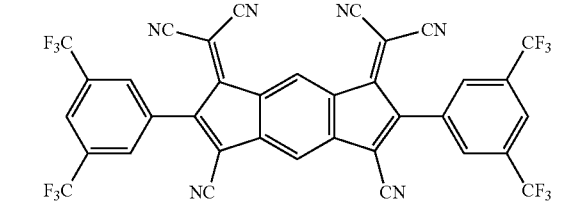
S08
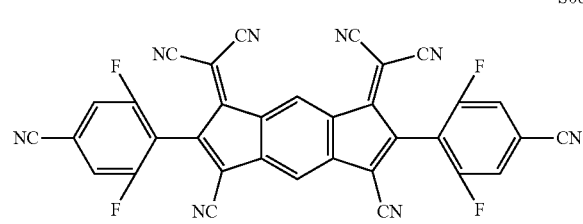
S09
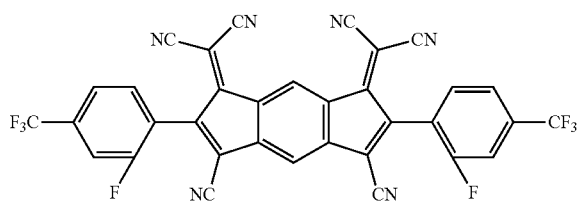
S10
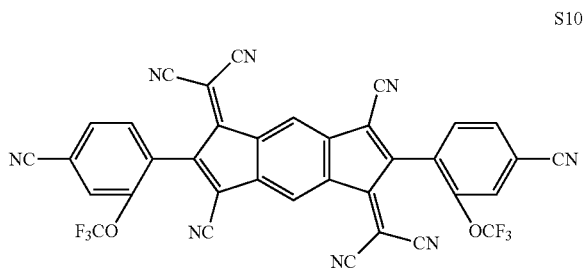
S11
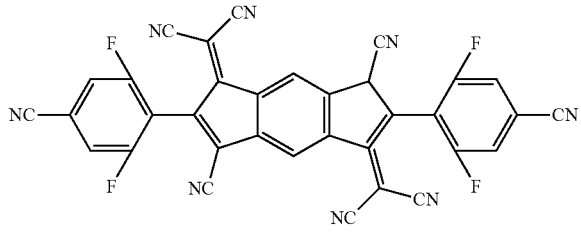
S12
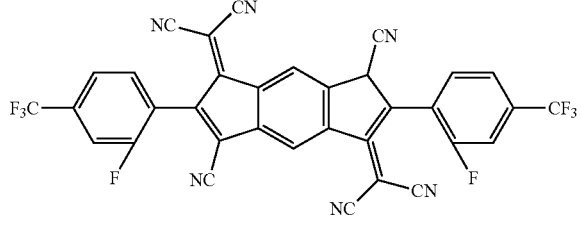
S13
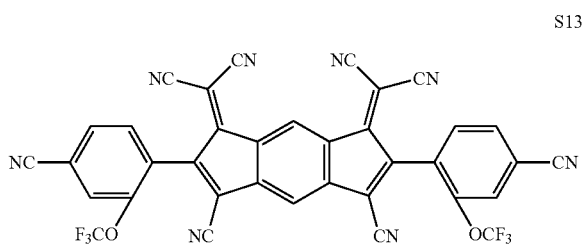
S14
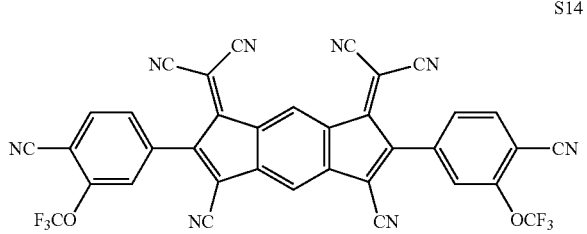 [SMILES: N#CC(C#N)=C1C(c2ccc(C(F)(F)F)c(C#N)c2)=C(C#N)c2cc3c(cc21)C(=C(C#N)C#N)C(c1ccc(C#N)c(C(F)(F)F)c1)=C3C#N]

-continued
S15
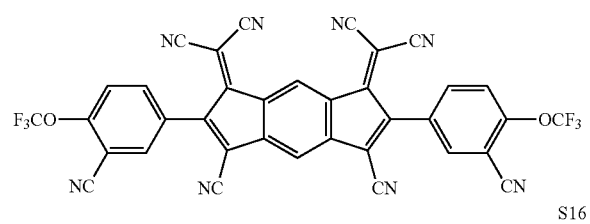
S16
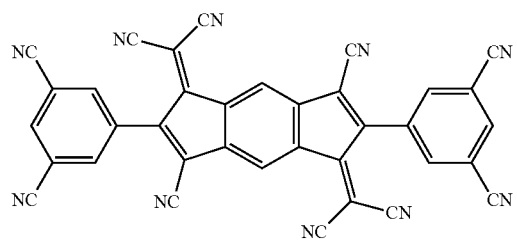
S17
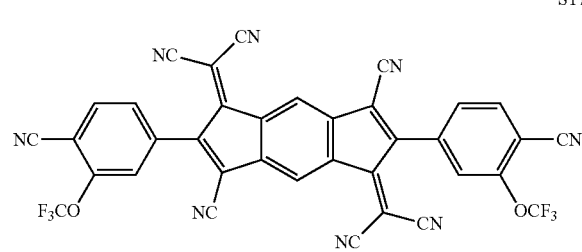
S18
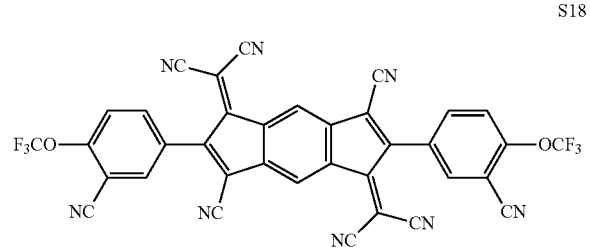
S19
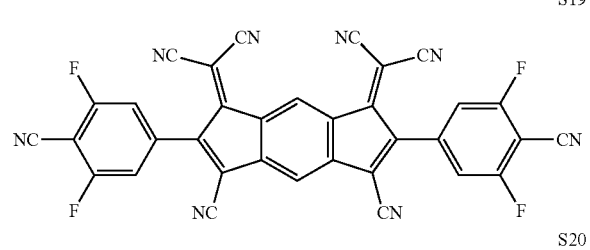
S20
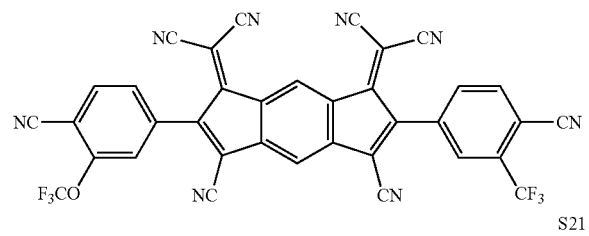
S21
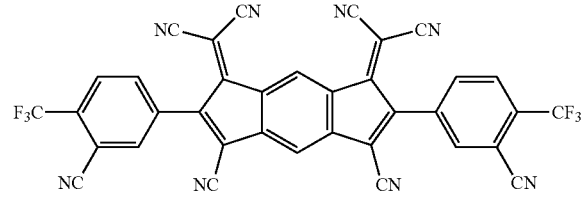
-continued
S22
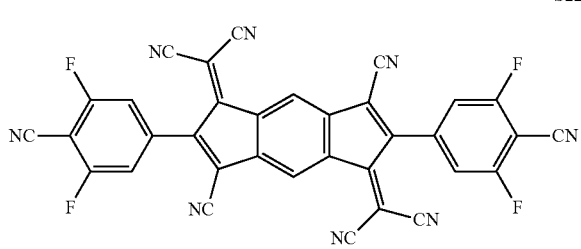
S23
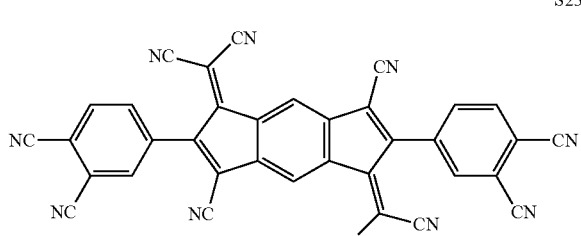
S24
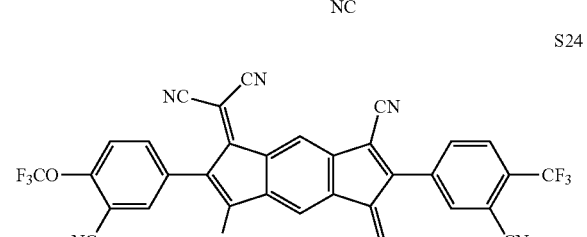
S25
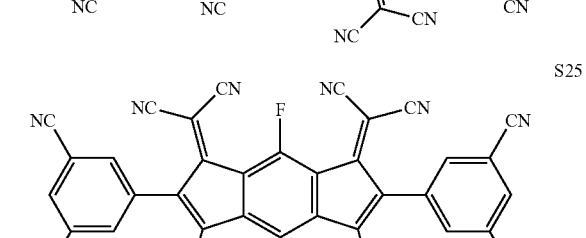
S26
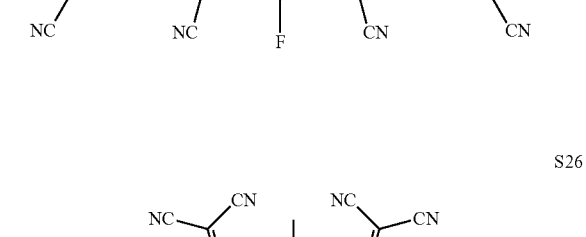
S27
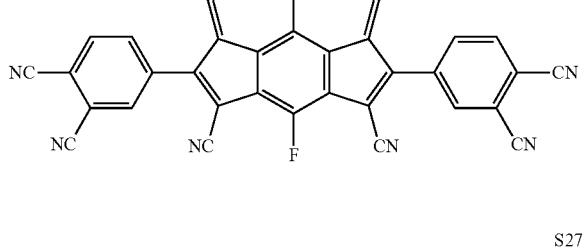
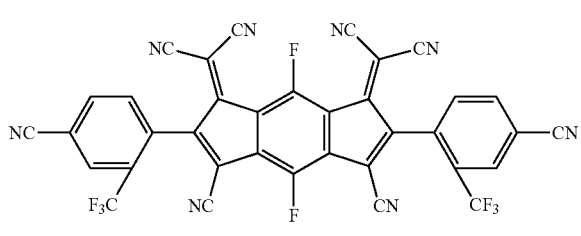

-continued
S28
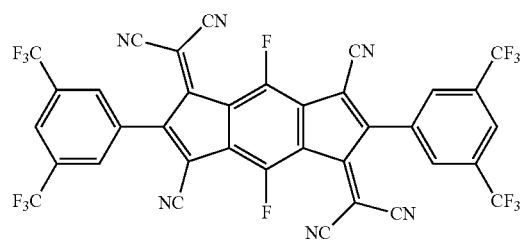
S29
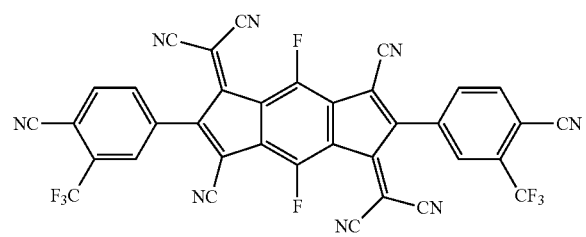
S30
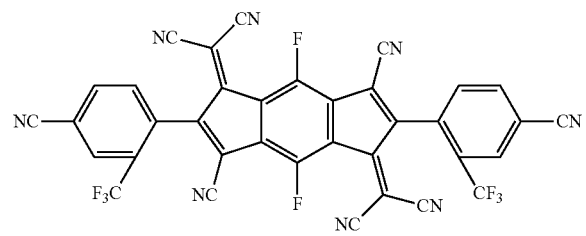
S31
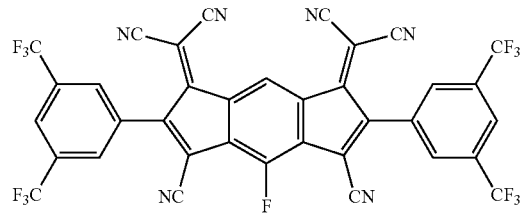
S32
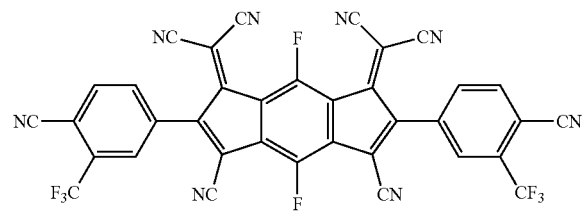
S33
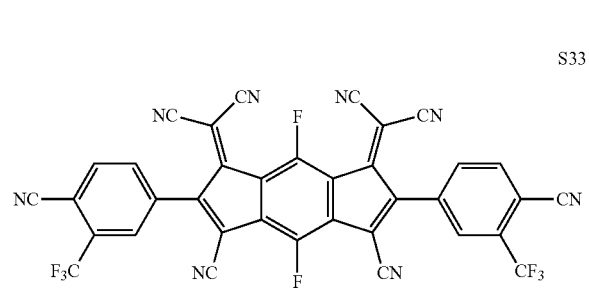
-continued
S34
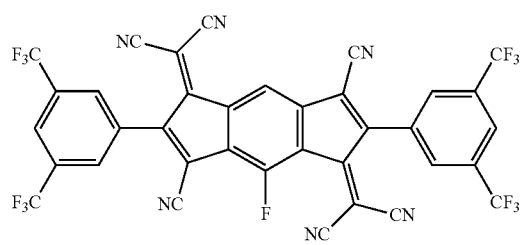
S35
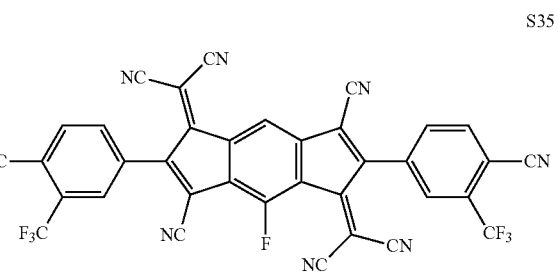
S36
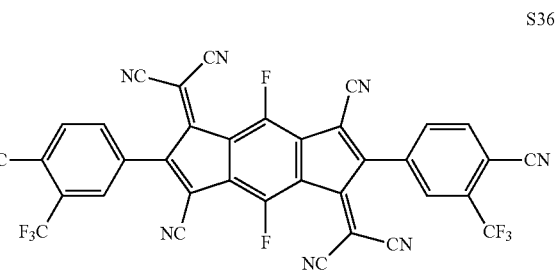
S38
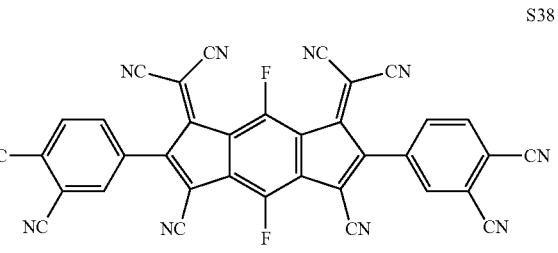
S39
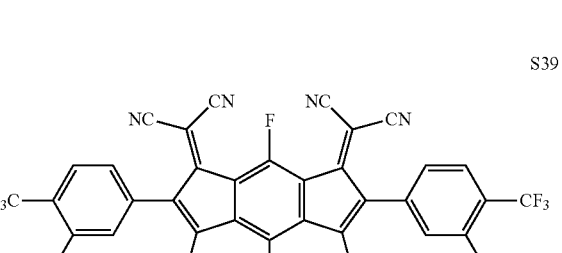
S40
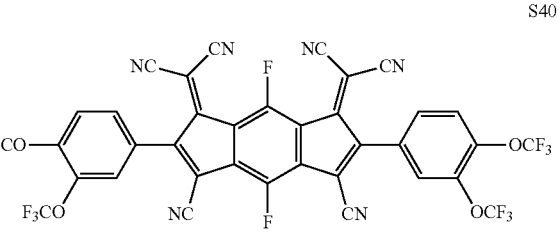

-continued
S41
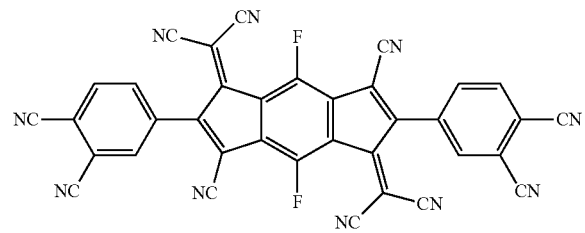
S42
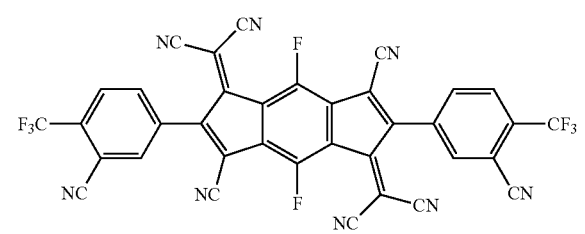
S43
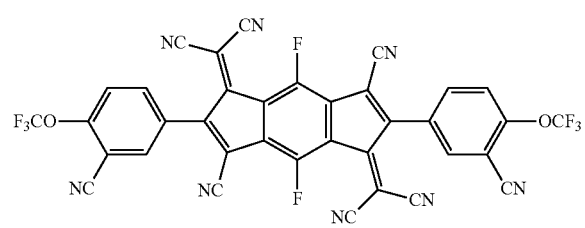
S44
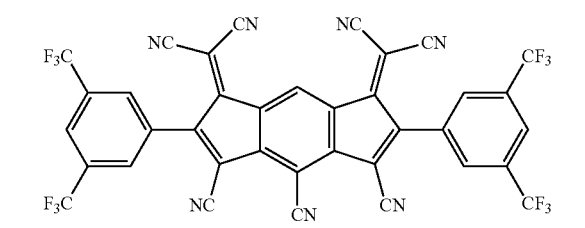
S45
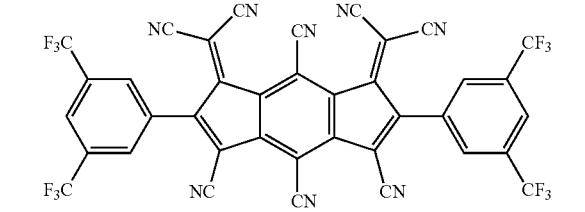
S46
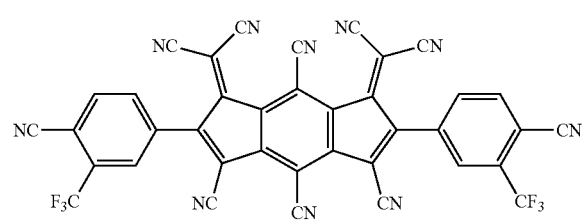
-continued
S47
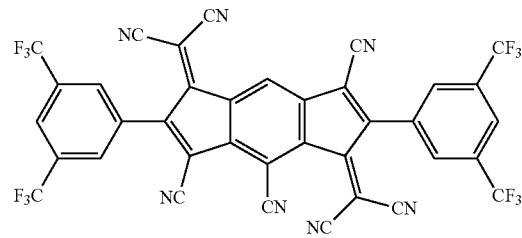
S48
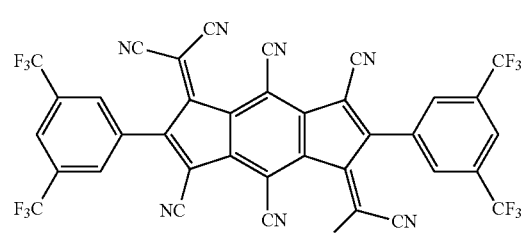
S49
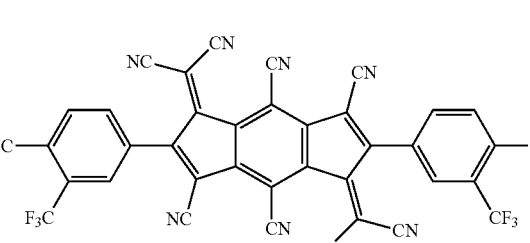
A01
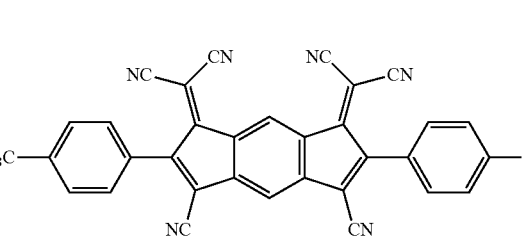
A02
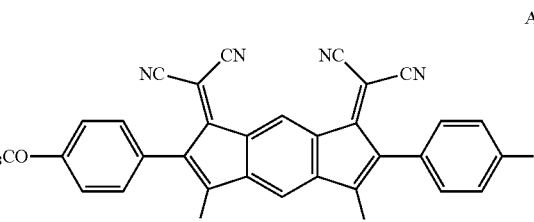
A03
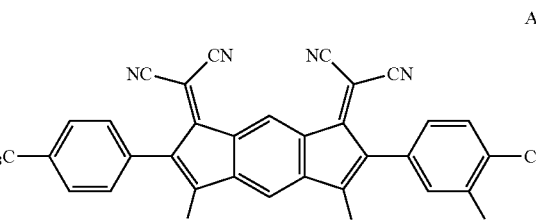

A04
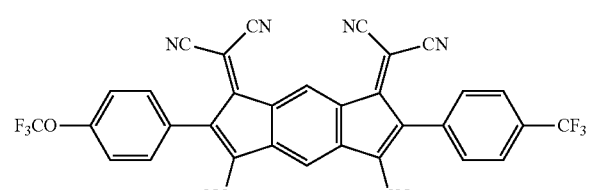
A05
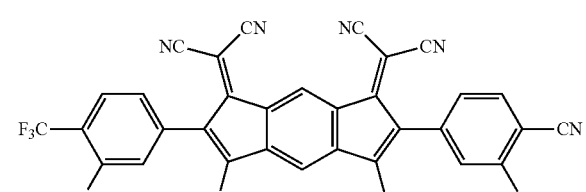
A06
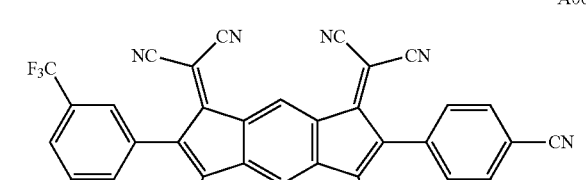
A07
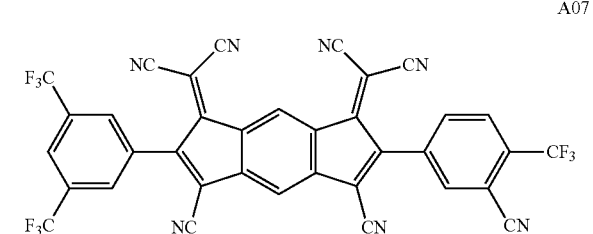
A08
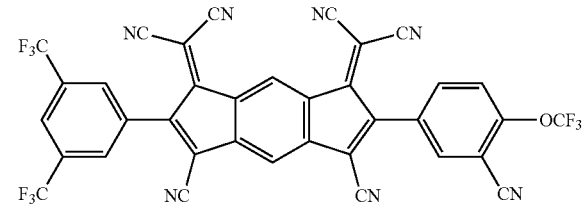
A09
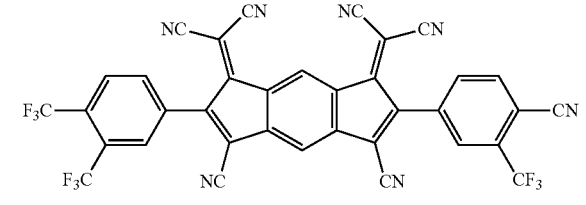
A10
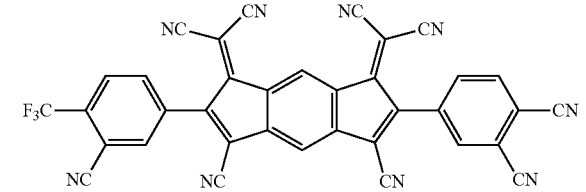
A11
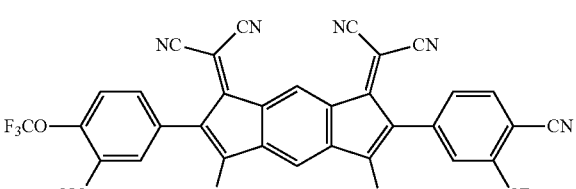
A12
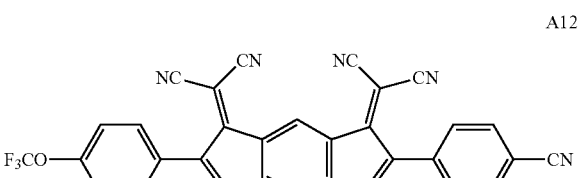
A13
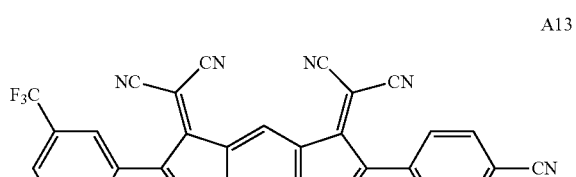
A14
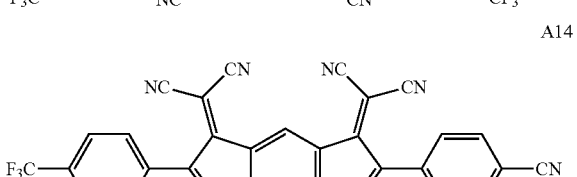
A15
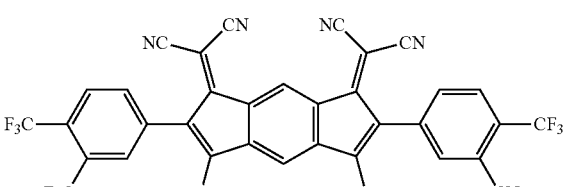
A16
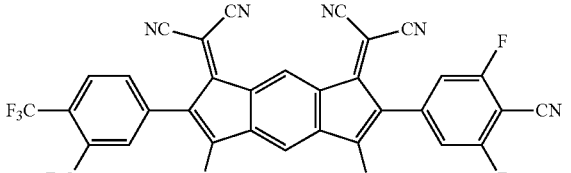
A17
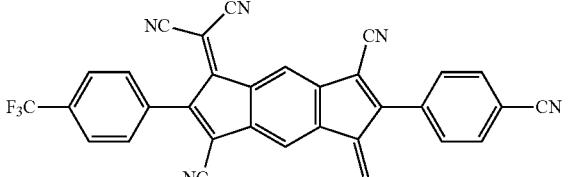

A18
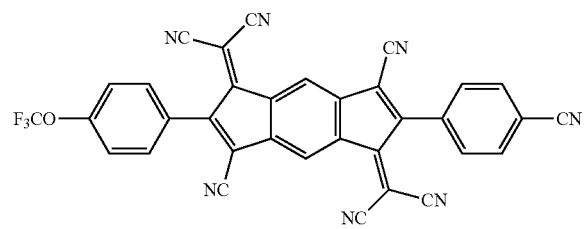
A19
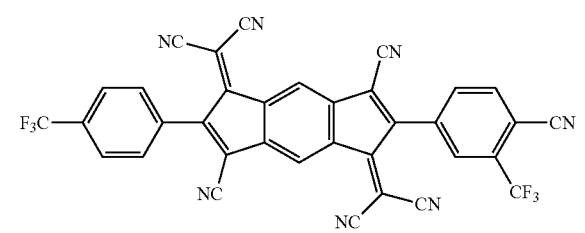
A20
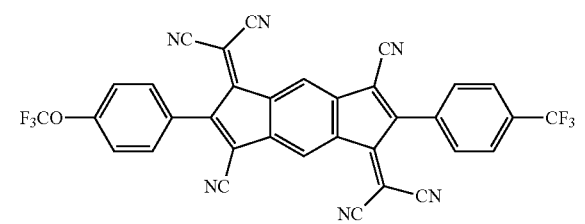
A21
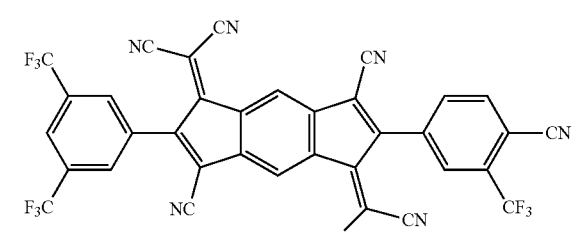
A22
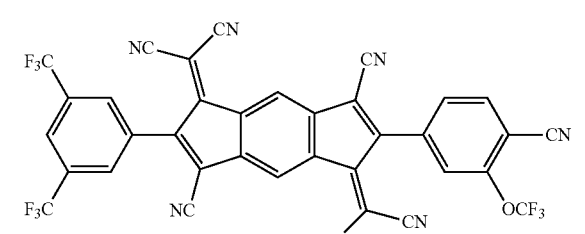
A23
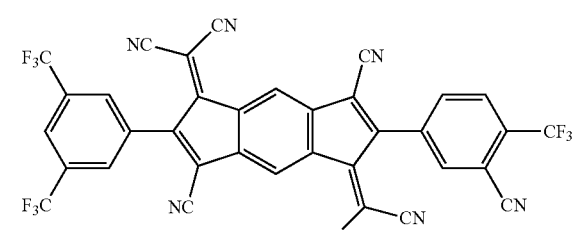
A24
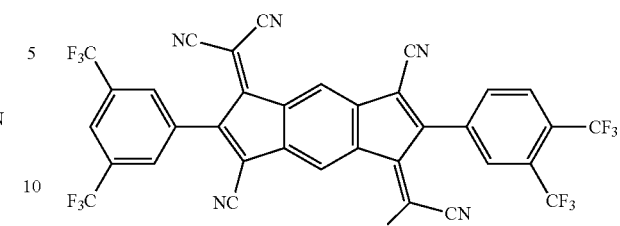
A25
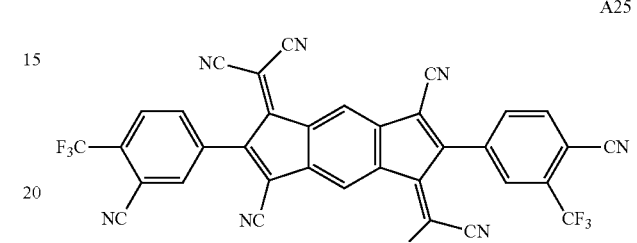
A26
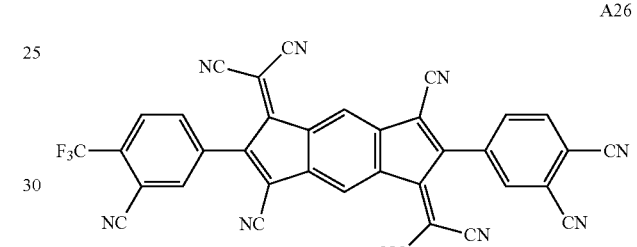
A27
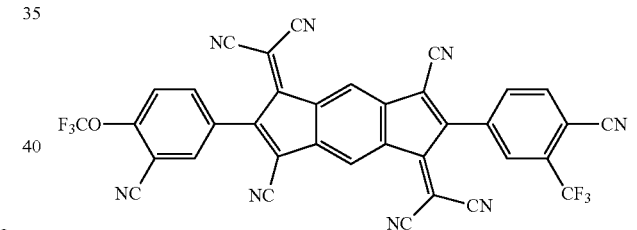
A28
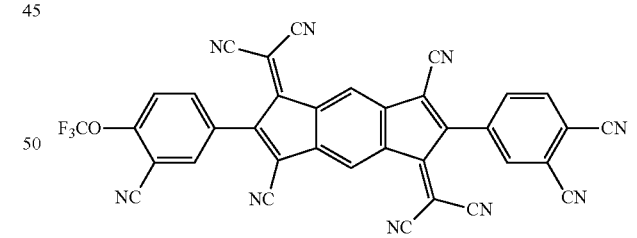
A29
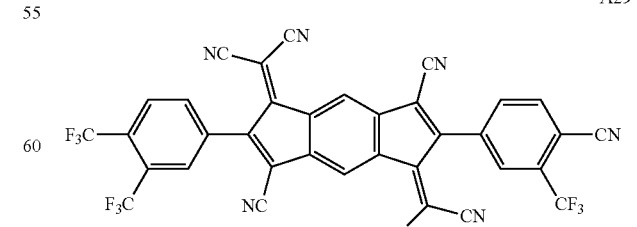

A30
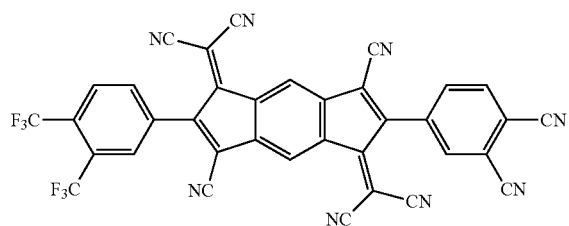
A31
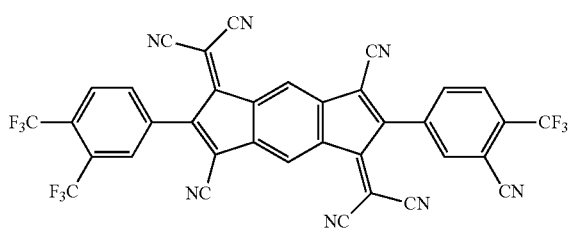
A32
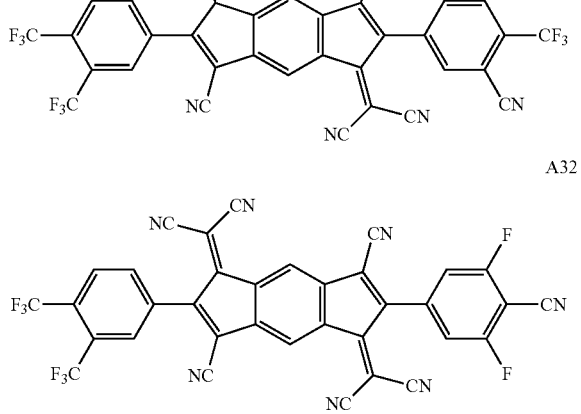
A33
A34
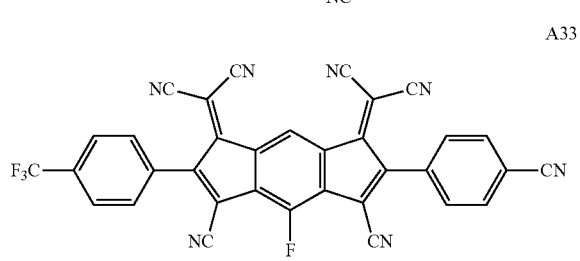
A35
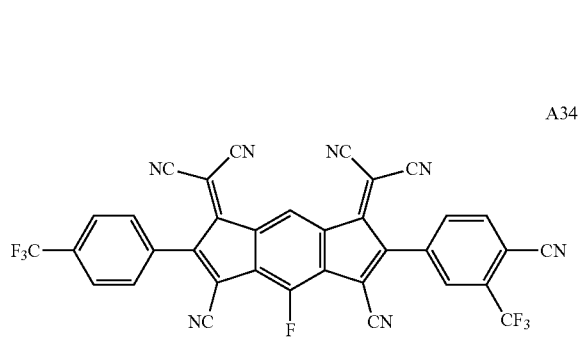
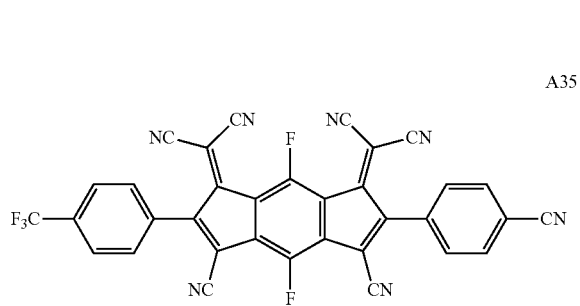
A36
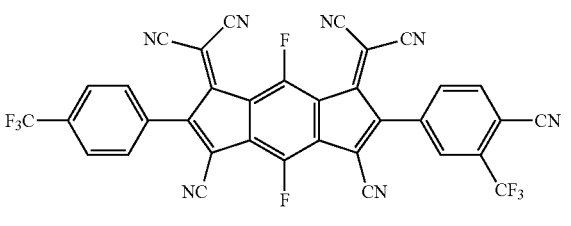
A37
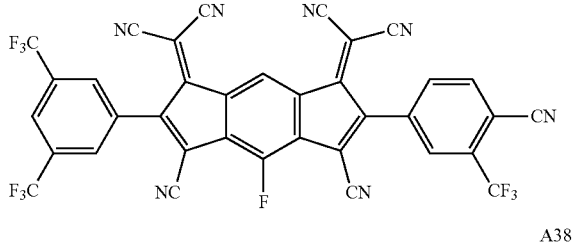
A38
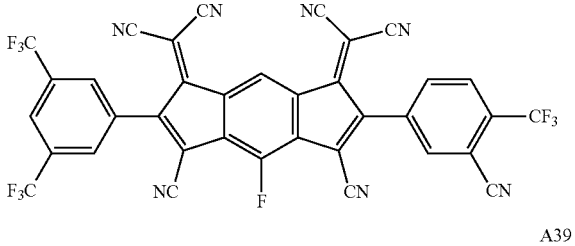
A39
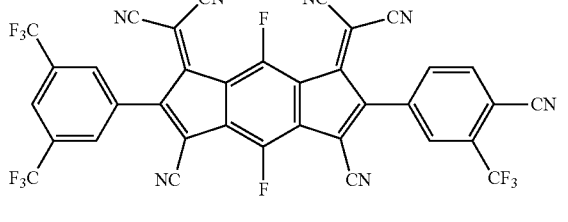
A40
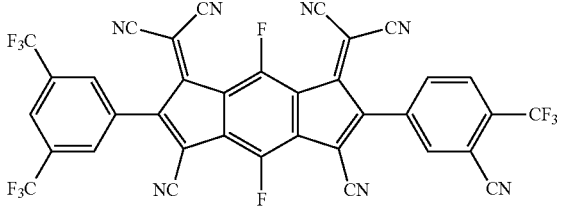
A41
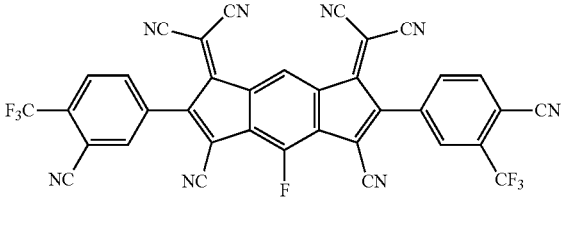

-continued
A42
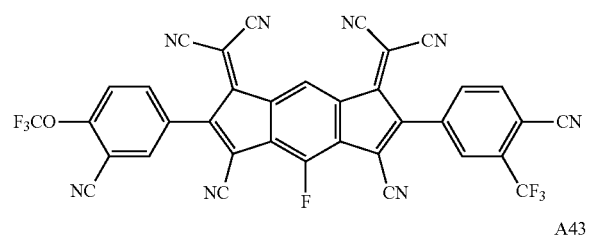
A43
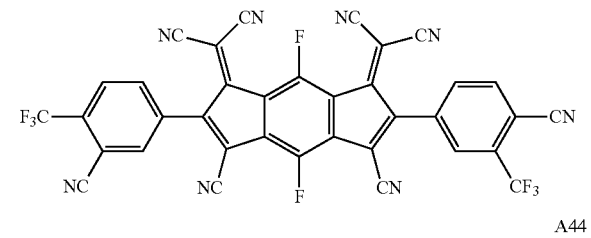
A44
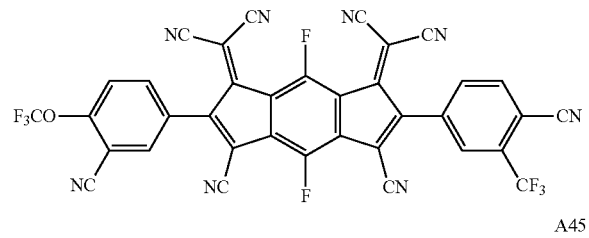
A45
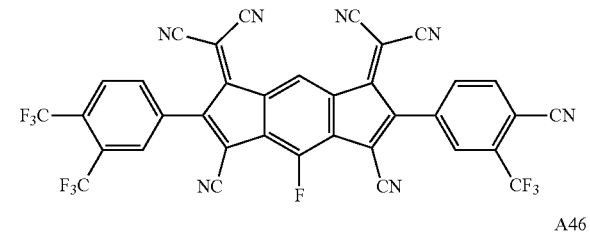
A46
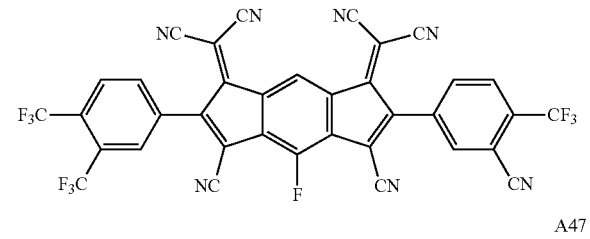
A47
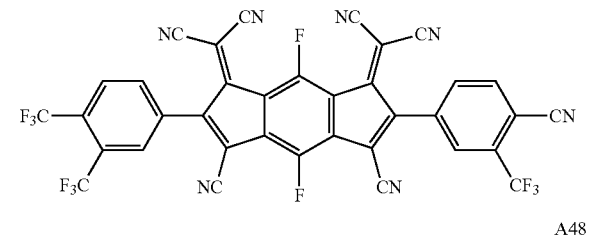
A48
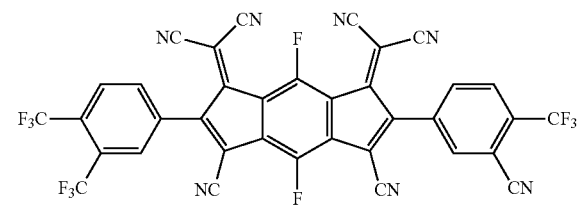
-continued
A49
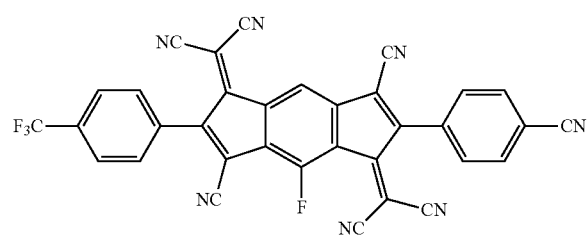
A50
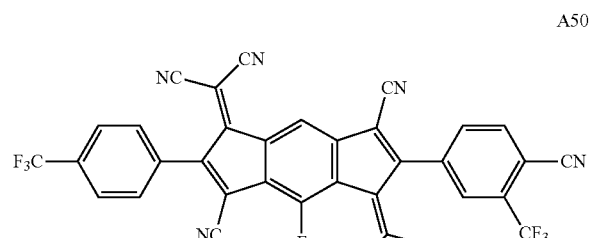
A51
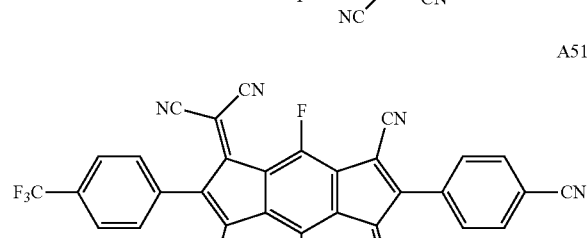
A52
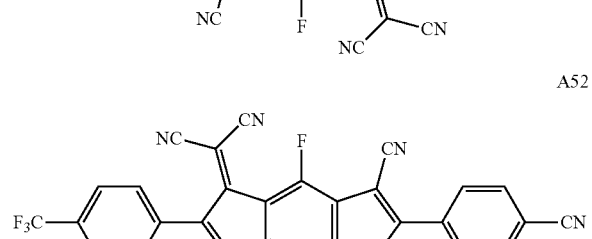
A53
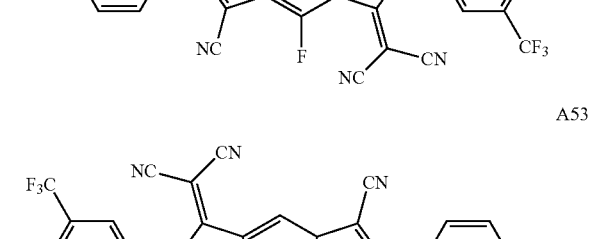
A54
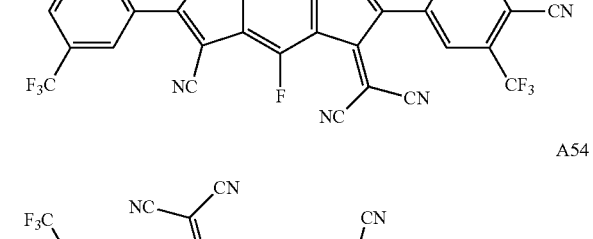
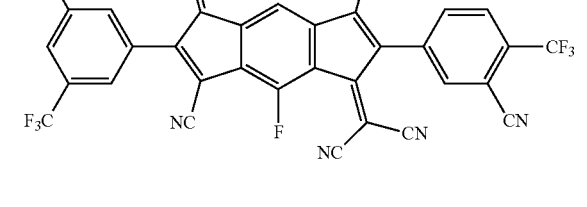

-continued
A55
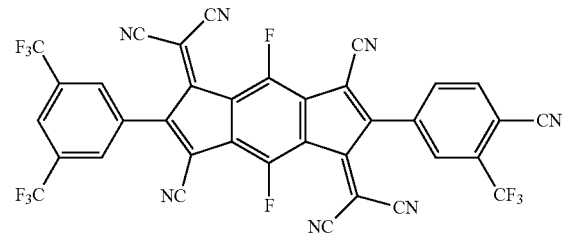
A56
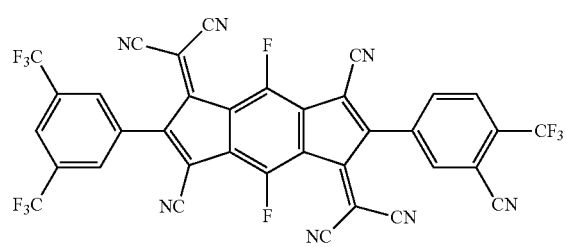
A57
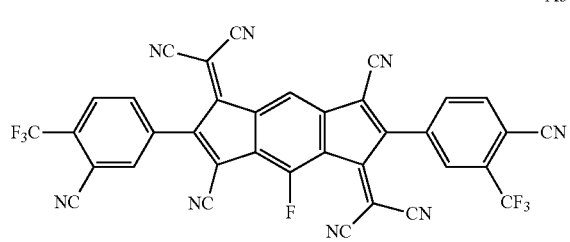
A58
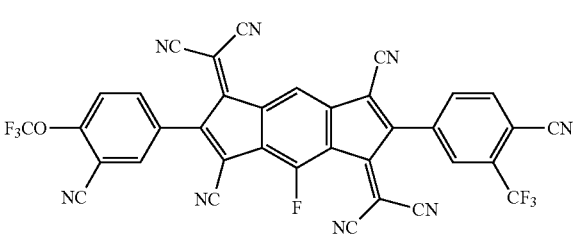
A59
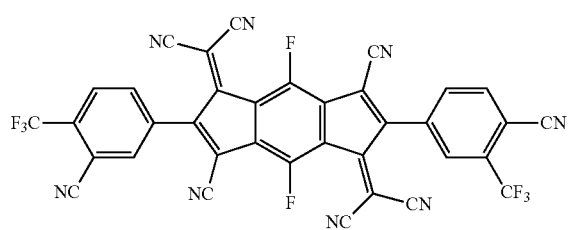
A60
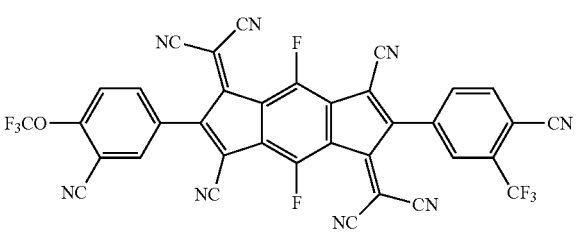
-continued
A61
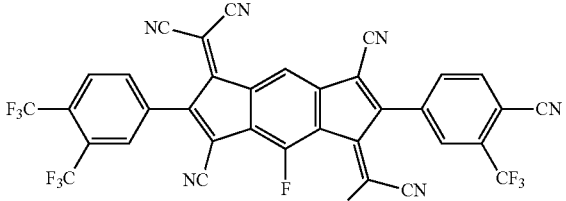
A62
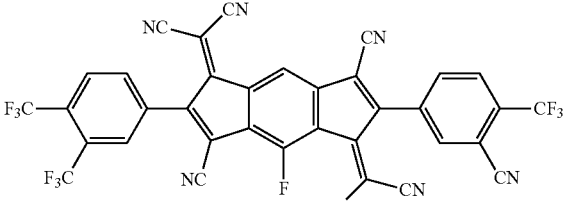
A63
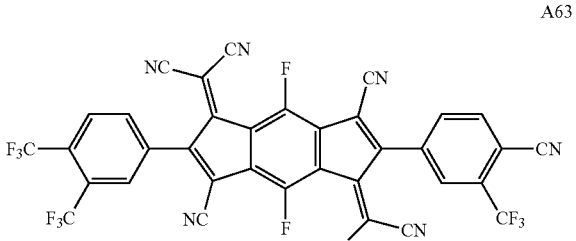
A64
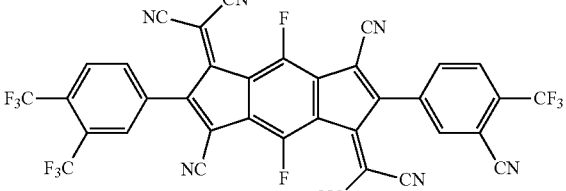
A65
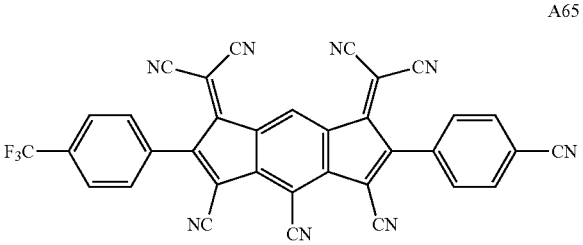
A66
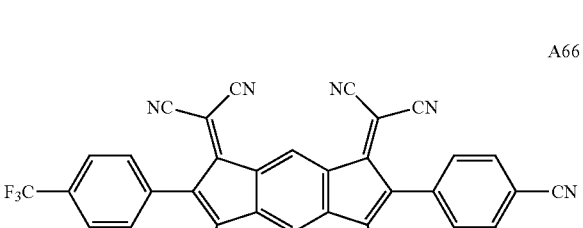

A67
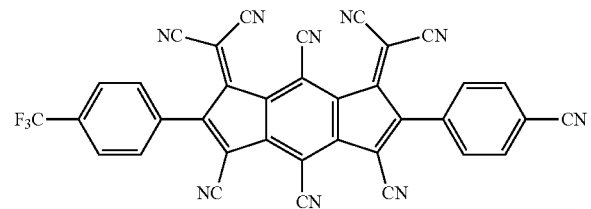
A68
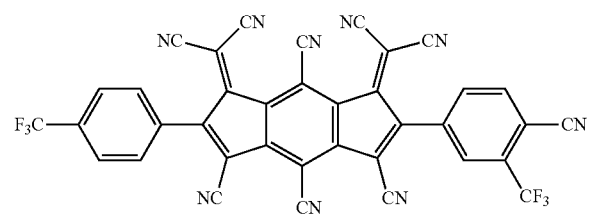
A69
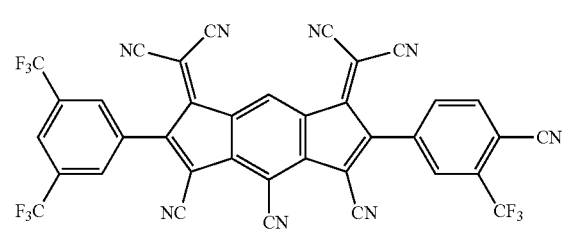
A70
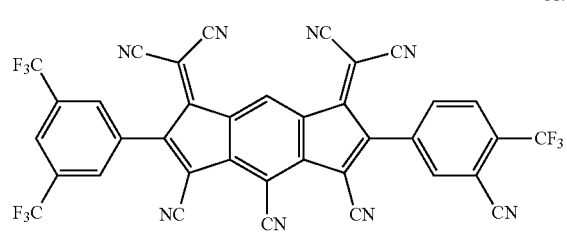
A71
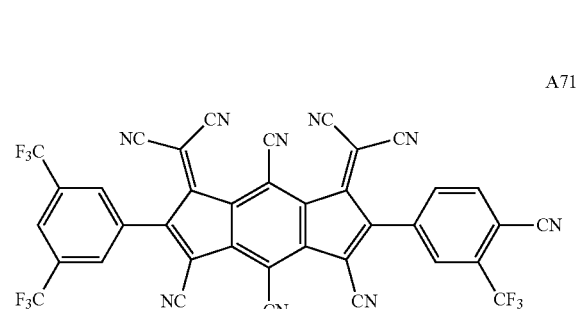
A72
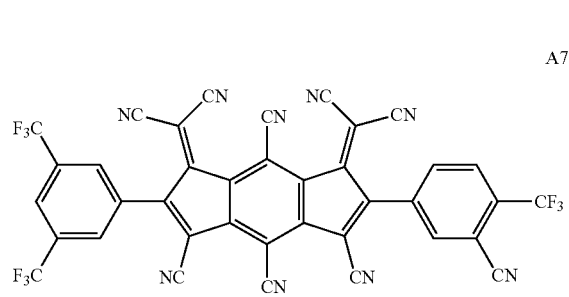
A73
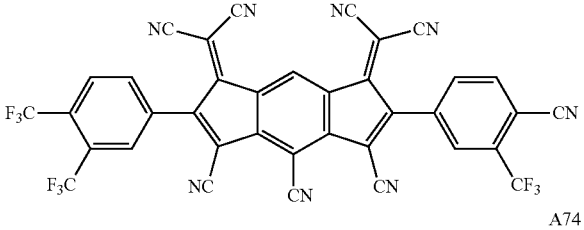
A74
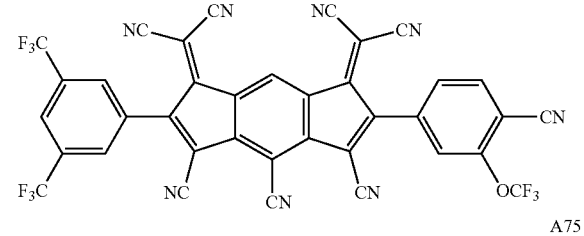
A75
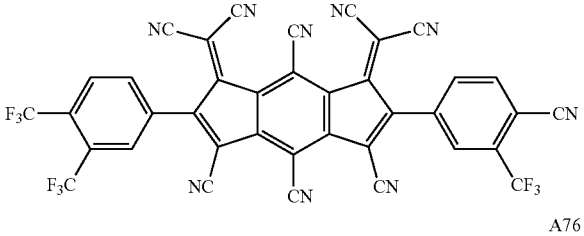
A76
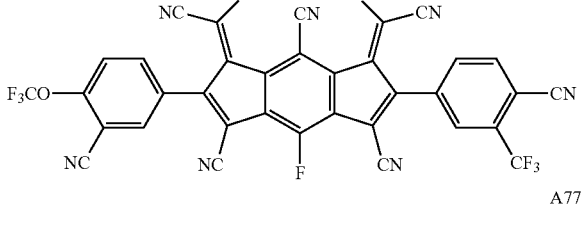
A77
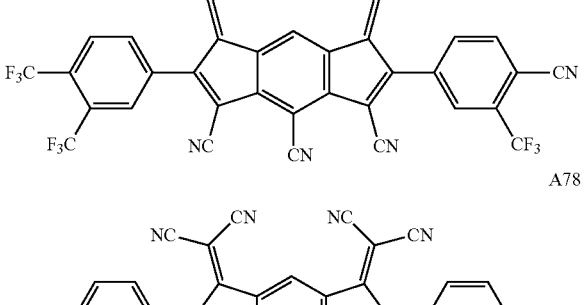
A78
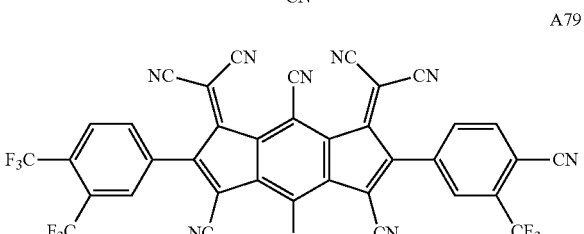

A80
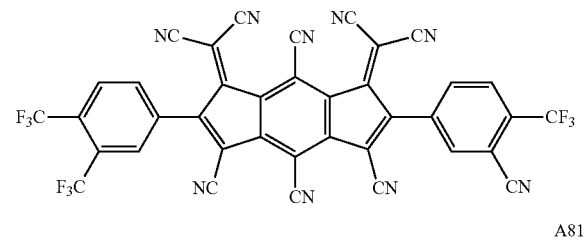
A81
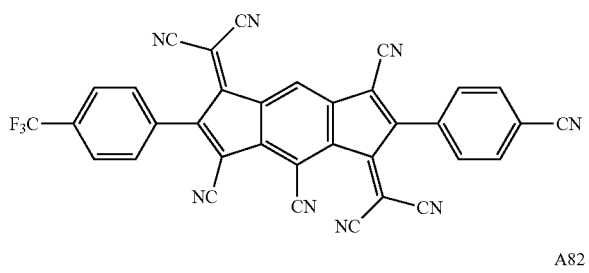
A82
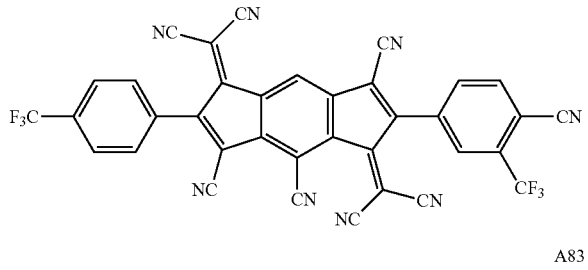
A83
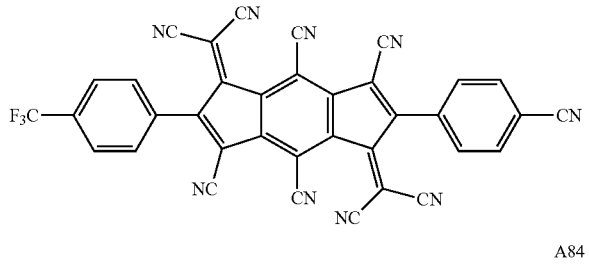
A84
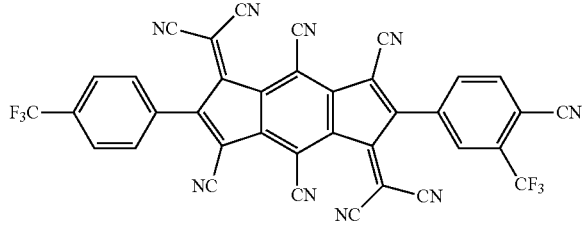
A85
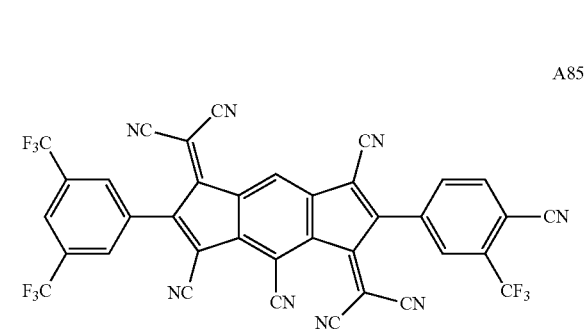
A86
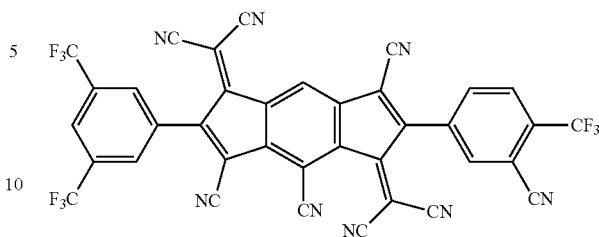
A87
A88
A89
A90
A91
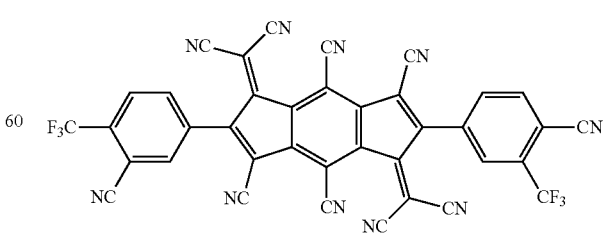

[Formula 4]
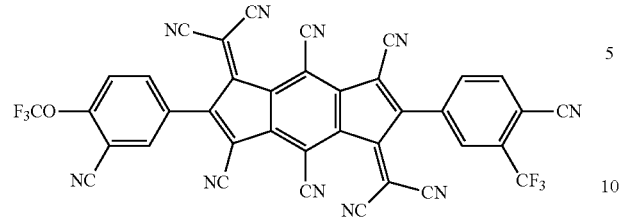 A92
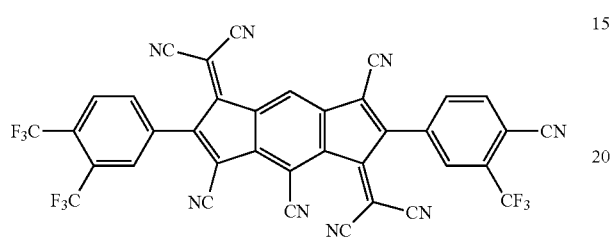 A93
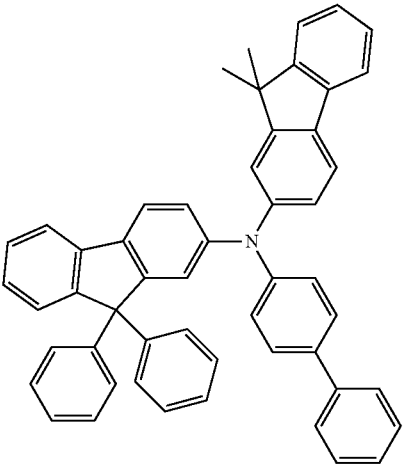 C1
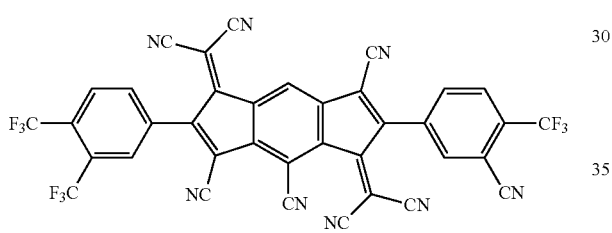 A94
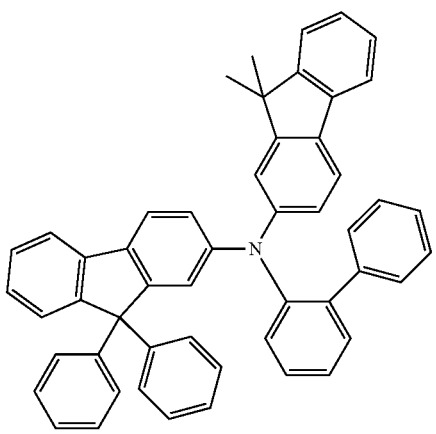 C2
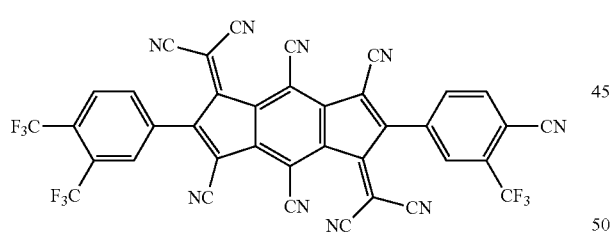 A95
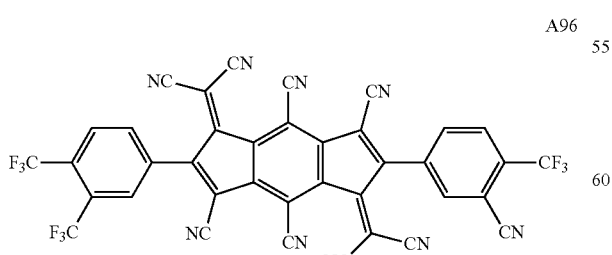 A96
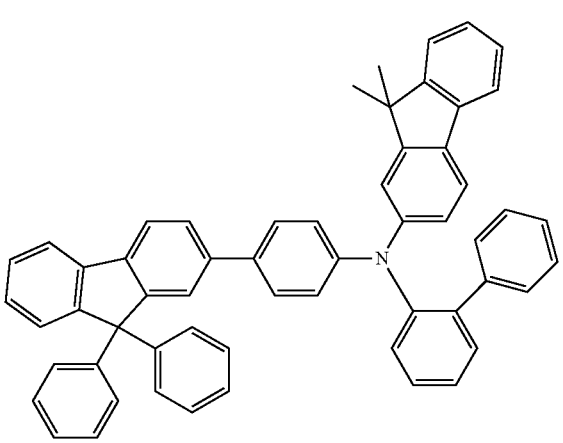 C3
The second organic compound in Formula 2-1 may be one of the compounds in Formula 4.

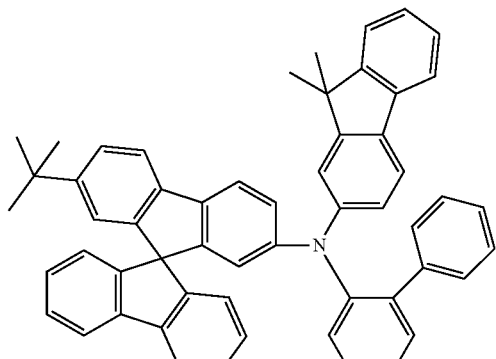
C4
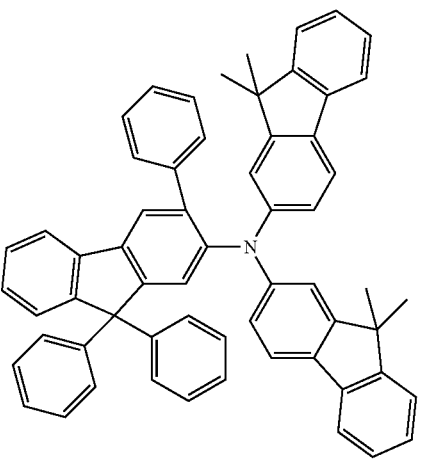
C7
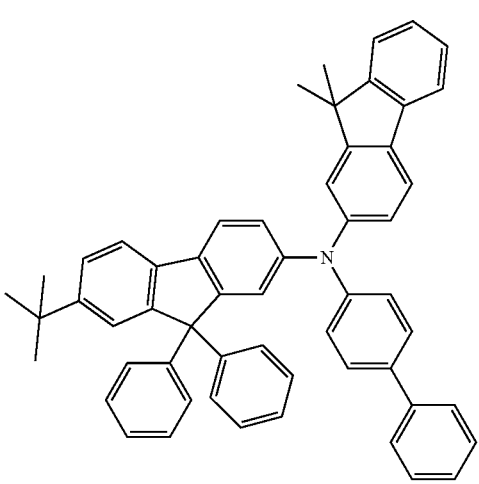
C5
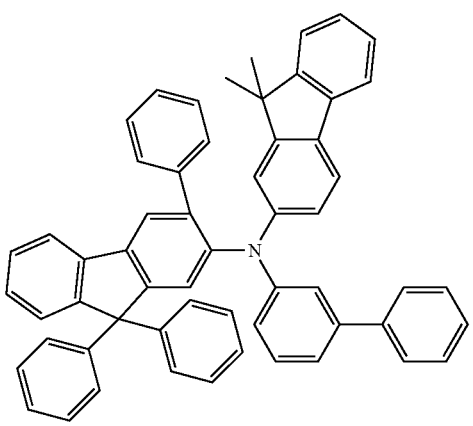
C8
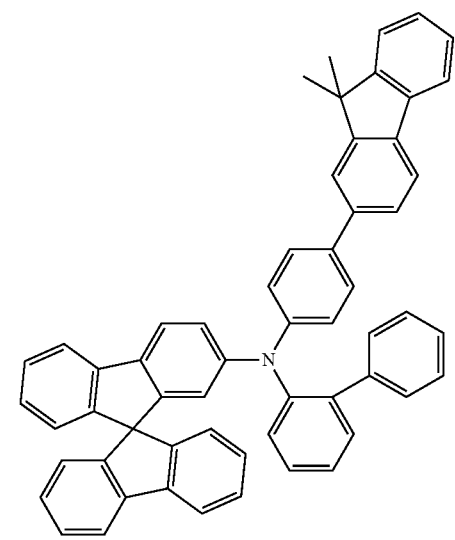
C6
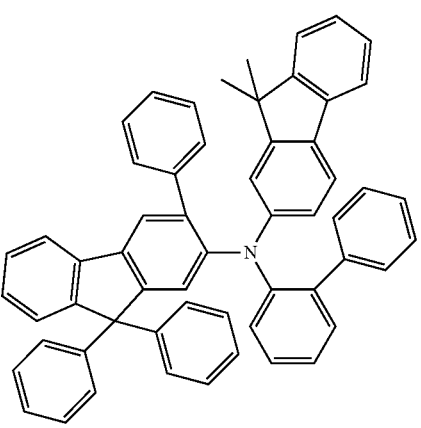
C9

C10
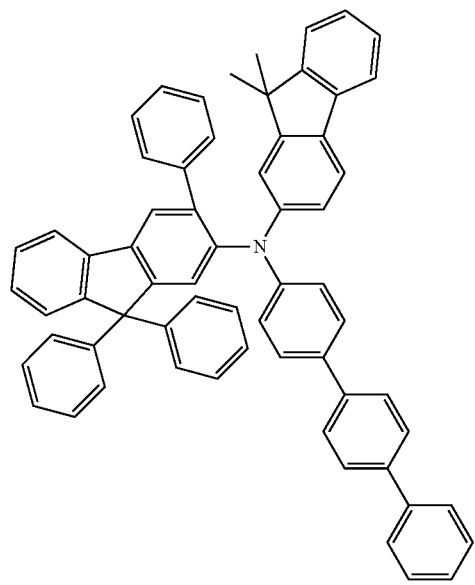
C11
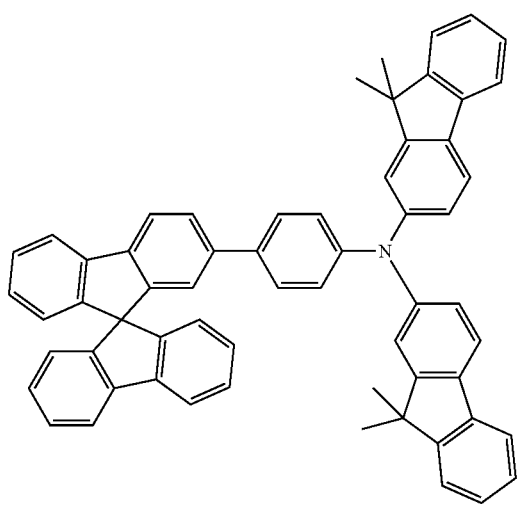
C12
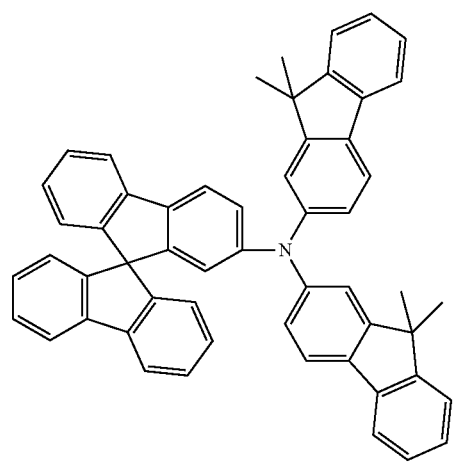
C13
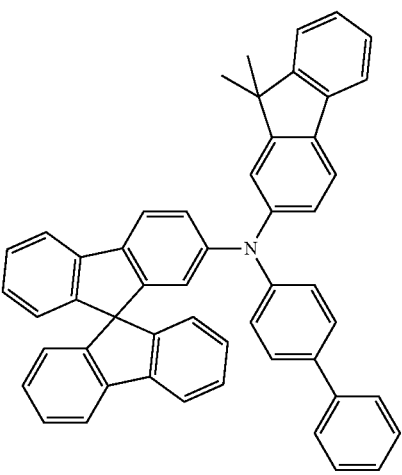
C14
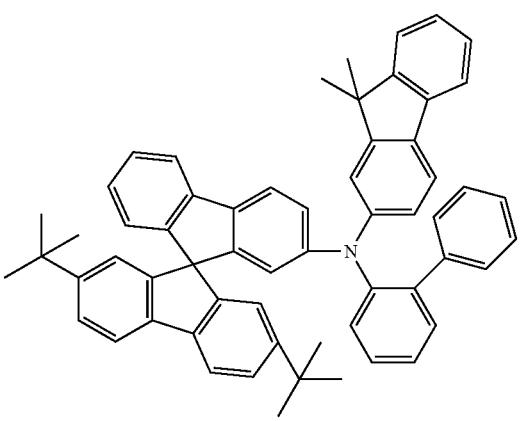
C15
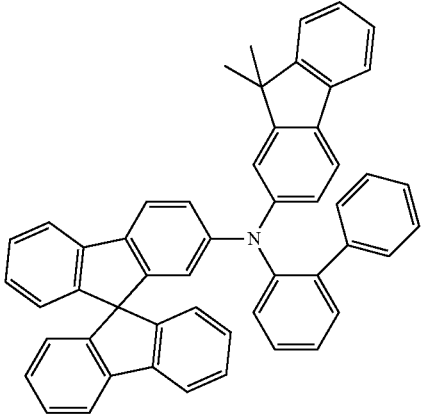

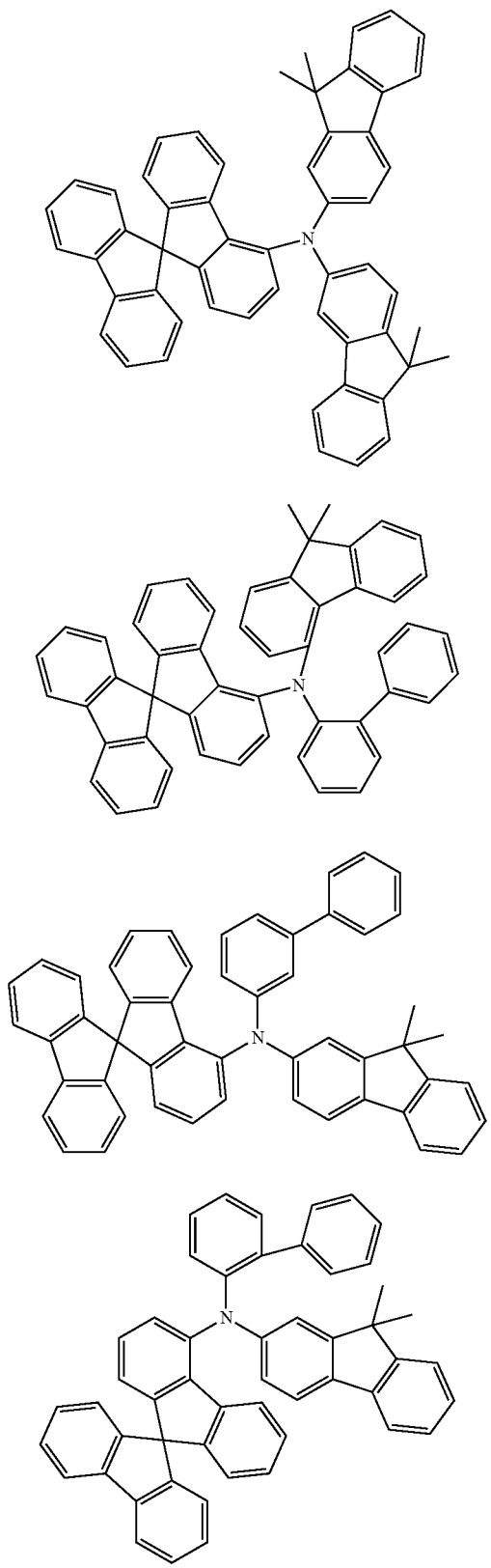
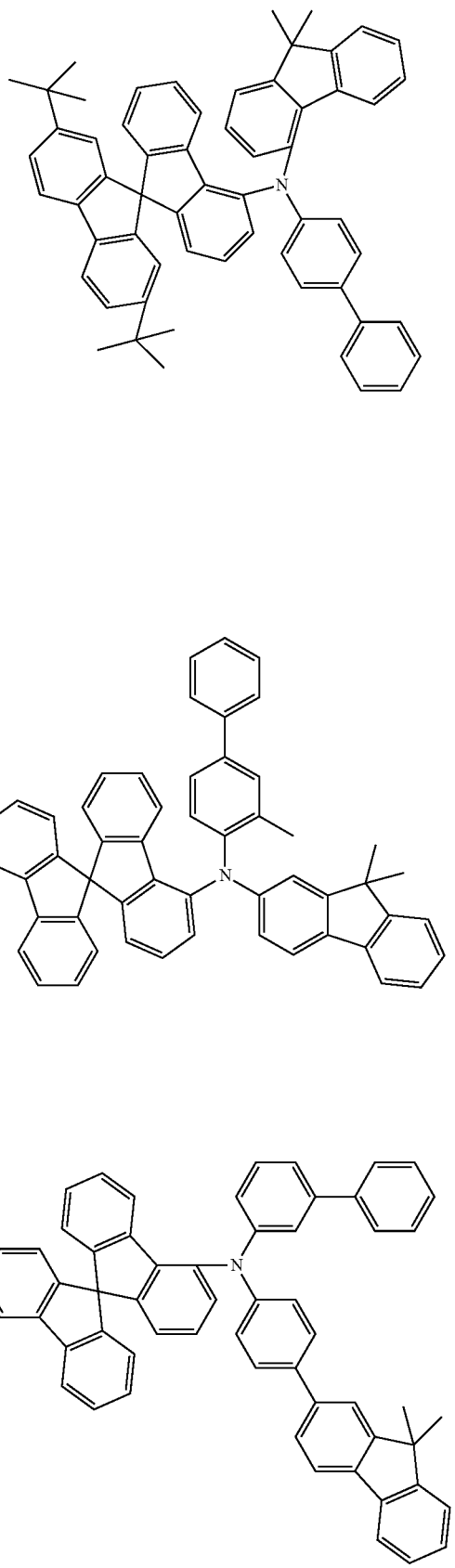

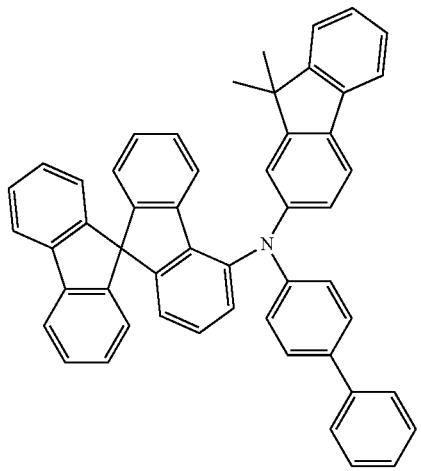

D8

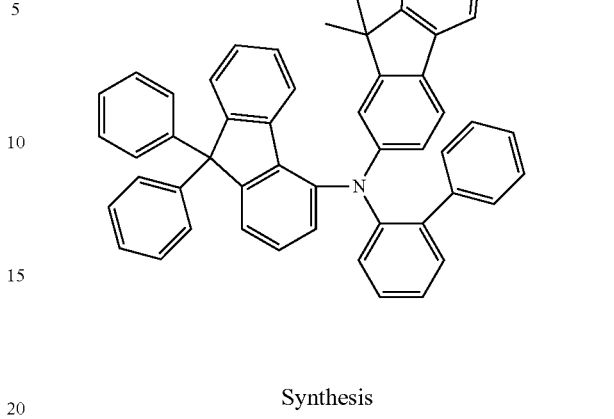

D11

Synthesis

1. Synthesis of the Compound A04

(1) Compound 4-A

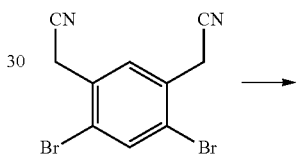

[Reaction Formula 1-1]

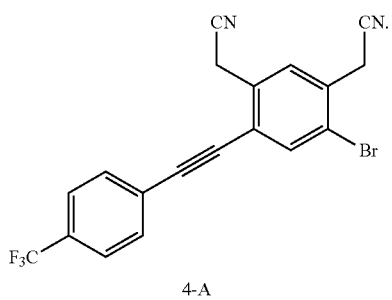

4-A

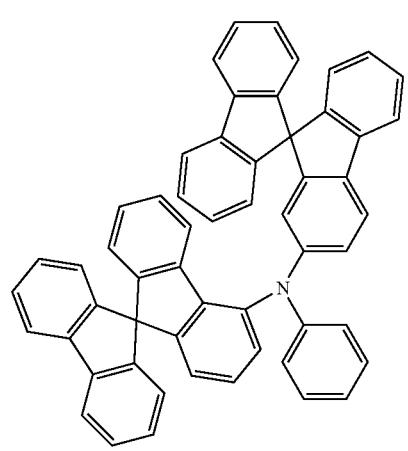

D9

D10

2,2'-(4,6-dibromo-1,3-phenylene)diacetonitrile (180 g, 573 mmol), toluene (6 L), copperiodide (CuI, 44 mmol), tetrakis(triphenylphosphine)palladium (44 mmol), diisopropylamine (2885 mmol) and 1-ethynyl-4-(trifluoromethyl)benzene (637 mmol) were mixed and heated to 100° C. After the reaction, the solvent (5 L) was distilled off. The mixture was cooled to room temperature and filtered to obtain a solid. After the solid was dissolved in chloroform and extracted with water, magnesium sulfate and acid clay were added and stirred for 1 hour. The mixture was filtered and the solvent was distilled again. The mixture was recrystallized using ethanol to obtain the compound 4-A (104 g). (yield 45%, MS[M+H]+=403)

(2) Compound 4-B

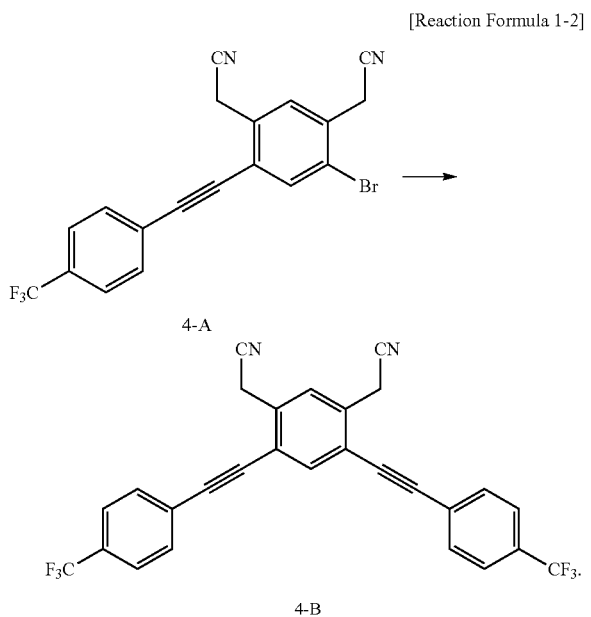

[Reaction Formula 1-2]

4-A

4-B

The compound 4-A (104 g, 258 mmol), toluene (3 L), CuI (21 mmol), tetrakis(triphenylphosphine)palladium (21 mmol), diisopropylamine (1290 mmol) and 1-ethynyl-4-(trifluoromethoxy)benzene (258 mmol) were mixed, heated to 100° C., and stirred for 2 hours. After the reaction, the solvent (2 L) was distilled off. The mixture was cooled to room temperature and filtered to obtain a solid. After the solid was dissolved in chloroform and extracted with water, magnesium sulfate and acid clay were added and stirred for 1 hour. After filtering the mixture, the solvent was distilled again. The mixture was recrystallized using tetrahydrofuran and ethanol to obtain the compound 4-B (39.3 g). (yield 30%, MS[M+H]+=509).

(3) Compound 4-C

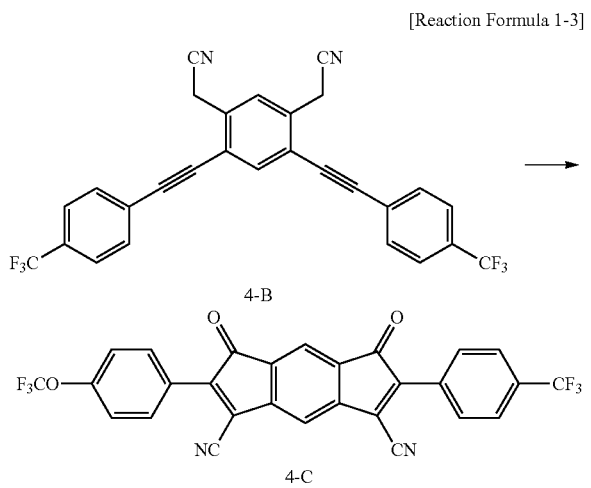

[Reaction Formula 1-3]

4-B

4-C

The compound 4-B (39 g, 77 mmol), 1,4-dioxane (520 mL), diphenyl sulfoxide (462 mmol), copper bromide (II) (CuBr(II), 15 mmol), palladium acetate (15 mmol) were mixed, heated to 100° C., and stirred for 5 hours. After the reaction, the solvent was distilled off. After dissolving the mixture in chloroform, acid clay was added and stirred for 1 hour. After filtering the mixture, the solvent was distilled again. The mixture was reverse-precipitated using hexane to obtain a solid. The solid was recrystallized using tetrahydrofuran and hexane and filtered to obtain the compound 4-C (7 g). (yield 17%, MS[M+H]+=537)

(4) Compound A04

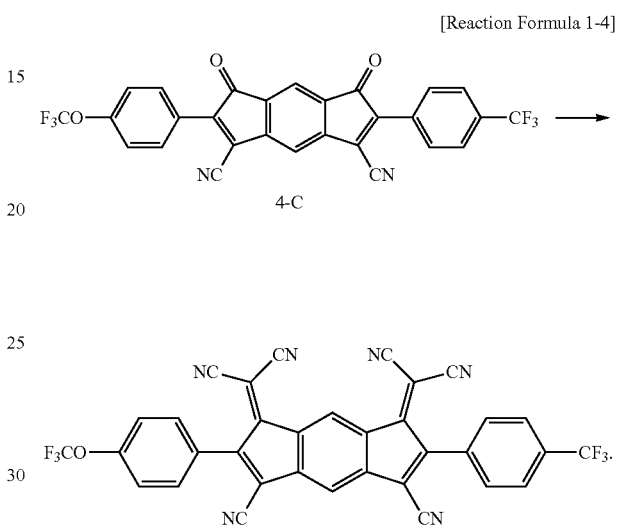

[Reaction Formula 1-4]

4-C

The compound 4-C (7 g, 13 mmol), dichloromethane (220 mL), and malononitrile (96 mmol) were added and cooled to 0° C. Titanium chloride (IV) (65 mmol) was slowly added and stirred for 1 hour while maintaining at 0° C. Pyridine (97.5 mmol) dissolved in dichloromethane (75 mL) was slowly added into the mixture at 0° C. and stirred for 1 hour. After the reaction was completed, acetic acid (130 mmol) was added and additionally stirred for 30 minutes. After the reaction solution was extracted with water, the organic layer was reverse-precipitated in hexane to obtain a solid. After filtering the solid through acetonitrile, magnesium sulfate and acid clay were added and stirred for 30 minutes. The solution was filtered, recrystallized using acetonitrile and toluene, and washed with toluene. The solid was recrystallized using acetonitrile and tert-butylmethylether and purified by sublimation to obtain the compound A04 (1.6 g). (yield 20%, MS[M+H]+=633)

2. Synthesis of the Compound A13

(1) Compound 13-A

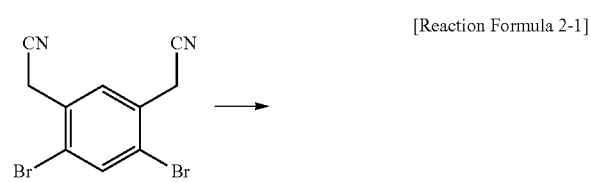

[Reaction Formula 2-1]

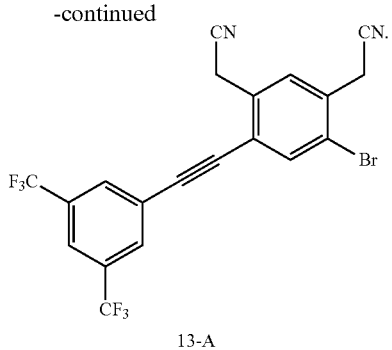

13-A 2,2′-(4,6-dibromo-1,3-phenylene)diacetonitrile (200 g, 637 mmol), toluene (6 L), copperiodide (CuI, 51 mmol), tetrakis(triphenylphosphine)palladium (51 mmol), diisopropylamine (3185 mmol) and 1-ethynyl-3,5-bis(trifluoromethyl)benzene (637 mmol) were mixed and heated to 100° C. After the reaction, the solvent (5 L) was distilled off. The mixture was cooled to room temperature and filtered to obtain a solid. After the solid was dissolved in chloroform and extracted with water, magnesium sulfate and acid clay were added and stirred for 1 hour. The mixture was filtered and the solvent was distilled again. The mixture was recrystallized using ethanol to obtain the compound 13-A (105 g). (yield 35%, MS[M+H]+=471)

(2) Compound 13-B

[Reaction Formula 2-2]

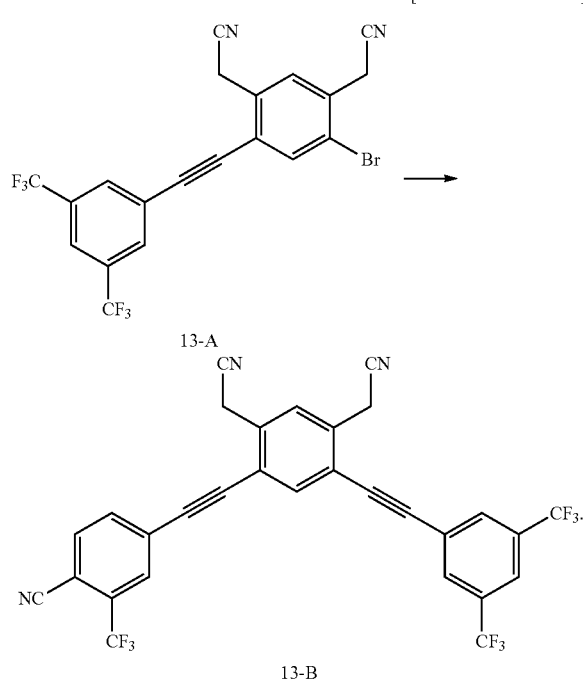

The compound 13-A (105 g, 223 mmol), toluene (3 L), CuI (18 mmol), tetrakis(triphenylphosphine)palladium (18 mmol), diisopropylamine (1115 mmol) and 4-ethynyl-2-(trifluoromethyl)benzonitrile (223 mmol) were mixed, heated to 100° C., and stirred for 2 hours. After the reaction, the solvent (2 L) was distilled off. The mixture was cooled to room temperature and filtered to obtain a solid. After the solid was dissolved in chloroform and extracted with water, magnesium sulfate and acid clay were added and stirred for 1 hour. After filtering the mixture, the solvent was distilled again. The mixture was recrystallized using tetrahydrofuran and ethanol to obtain the compound 13-B (32.6 g). (yield 25%, MS[M+H]+=586)

(3) Compound 13-C

[Reaction Formula 2-3]

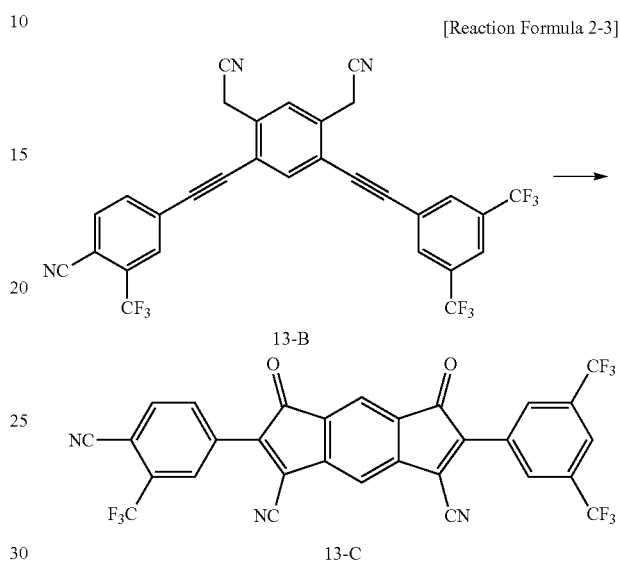

The compound 13-B (32 g, 55 mmol), 1,4-dioxane (480 mL), diphenyl sulfoxide (330 mmol), CuBr(II) (11 mmol), palladium acetate (11 mmol) were mixed, heated to 100° C., and stirred for 5 hours. After the reaction, the solvent was distilled off. After dissolving the mixture in chloroform, acid clay was added and stirred for 1 hour. After filtering the mixture, the solvent was distilled again. The mixture was reverse-precipitated using hexane to obtain a solid. The solid was recrystallized using tetrahydrofuran and hexane and filtered to obtain the compound 13-C (5 g). (yield 15%, MS[M+H]+=614)

(4) Compound A13

[Reaction Formula 2-4]

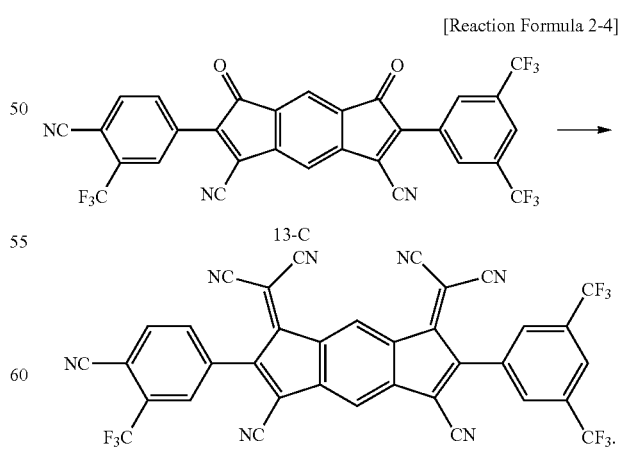

The compound 13-C (5 g, 8.2 mmol), dichloromethane (150 mL), and malononitrile (49.2 mmol) were added and cooled to 0° C. Titanium chloride (IV) (41 mmol) was slowly added and stirred for 1 hour while maintaining at 0° C. Pyridine (61.5 mmol) dissolved in dichloromethane (50 mL) was slowly added into the mixture at 0° C. and stirred for 1 hour. After the reaction was completed, acetic acid (82 mmol) was added and additionally stirred for 30 minutes. After the reaction solution was extracted with water, the organic layer was reverse-precipitated in hexane to obtain a solid. After filtering the solid through acetonitrile, magnesium sulfate and acid clay were added and stirred for 30 minutes. The solution was filtered, recrystallized using acetonitrile and toluene, and washed with toluene. The solid was recrystallized using acetonitrile and tert-butylmethylether and purified by sublimation to obtain the compound A13 (1 g). (yield 18%, MS[M+H]+=710)

3. Synthesis of the Compound A37

(1) Compound 37-A

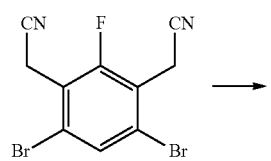

[Reaction Formula 3-1]

2,2'-(4,6-dibromo-2-fluoro-1,3-phenylene)diacetonitrile (300 g, 903.7 mmol), toluene (9 L), CuI (72.3 mmol), tetrakis(triphenylphosphine)palladium (72.3 mmol), diisopropylamine (4518 mmol) and 1-ethynyl-3,5-bis(trifluoromethyl)benzene (903.7 mmol) were mixed and heated to 100° C. After the reaction, the solvent (8 L) was distilled off. The mixture was cooled to room temperature and filtered to obtain a solid. After the solid was dissolved in chloroform and extracted with water, magnesium sulfate and acid clay were added and stirred for 1 hour. The mixture was filtered and the solvent was distilled again. The mixture was recrystallized using ethanol to obtain the compound 37-A (137 g). (yield 31%, MS[M+H]+=489)

(2) Compound 37-B

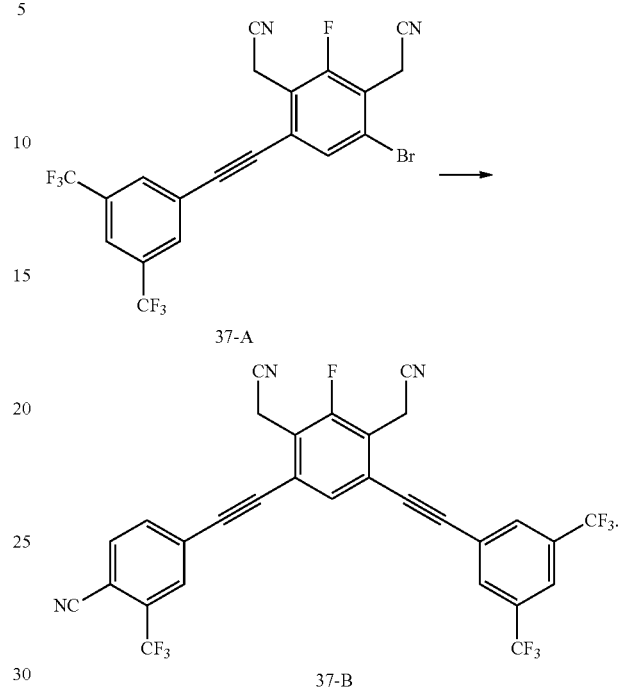

[Reaction Formula 3-2]

The compound 37-A (137 g, 280 mmol), toluene (4.1 L), CuI (22 mmol), tetrakis(triphenylphosphine)palladium (22 mmol), diisopropylamine (1400 mmol) and 4-ethynyl-2-(trifluoromethyl)benzonitrile (280 mmol) were mixed, heated to 100° C., and stirred for 2 hours. After the reaction, the solvent (3 L) was distilled off. The mixture was cooled to room temperature and filtered to obtain a solid. After the solid was dissolved in chloroform and extracted with water, magnesium sulfate and acid clay were added and stirred for 1 hour. After filtering the mixture, the solvent was distilled again. The mixture was recrystallized using tetrahydrofuran and ethanol to obtain the compound 37-B (33.8 g). (yield 20%, MS[M+H]+=603)

(3) Compound 37-C

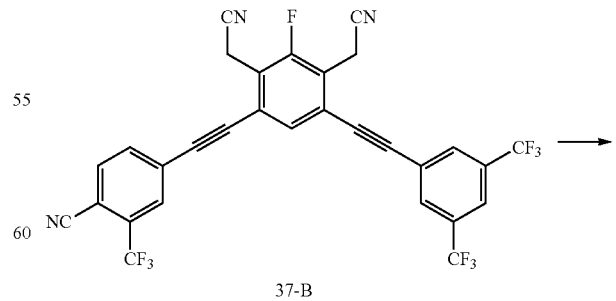

[Reaction Formula 3-3]

-continued

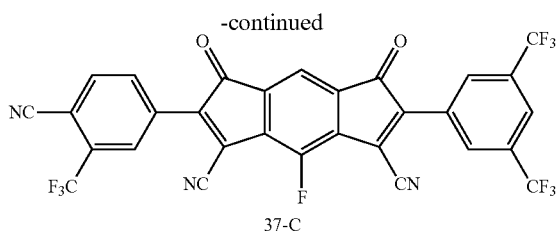

37-C

The compound 37-B (33 g, 54.7 mmol), 1,4-dioxane (500 mL), diphenyl sulfoxide (328.2 mmol), CuBr(II) (10.9 mmol), palladium acetate (10.9 mmol) were mixed, heated to 100° C., and stirred for 5 hours. After the reaction, the solvent was distilled off. After dissolving the mixture in chloroform, acid clay was added and stirred for 1 hour. After filtering the mixture, the solvent was distilled again. The mixture was reverse-precipitated using hexane to obtain a solid. The solid was recrystallized using tetrahydrofuran and hexane and filtered to obtain the compound 37-C (4.8 g). (yield 14%, MS[M+H]+=632)

(4) Compound 37

[Reaction Formula 3-4]

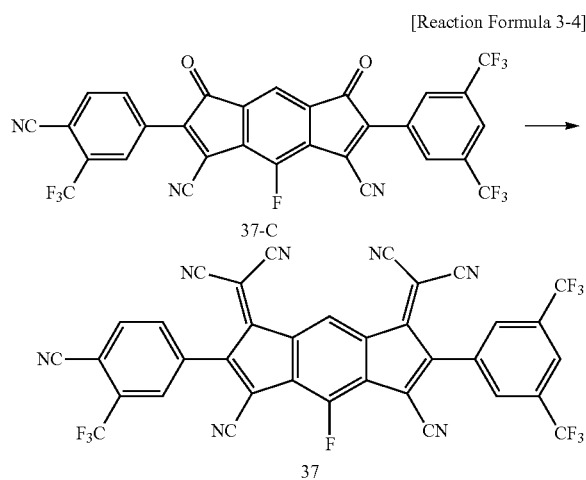

The compound 37-C (4.8 g, 7.6 mmol), dichloromethane (145 mL), and malononitrile (45.6 mmol) were added and cooled to 0° C. Titanium chloride (IV) (38 mmol) was slowly added and stirred for 1 hour while maintaining at 0° C. Pyridine (57 mmol) dissolved in dichloromethane (48 mL) was slowly added into the mixture at 0° C. and stirred for 1 hour. After the reaction was completed, acetic acid (76 mmol) was added and additionally stirred for 30 minutes. After the reaction solution was extracted with water, the organic layer was reverse-precipitated in hexane to obtain a solid. After filtering the solid through acetonitrile, magnesium sulfate and acid clay were added and stirred for 30 minutes. The solution was filtered, recrystallized using acetonitrile and toluene, and washed with toluene. The solid was recrystallized using acetonitrile and tert-butylmethylether and purified by sublimation to obtain the compound A37 (1.1 g). (yield 20%, MS[M+H]+=728)

A weight % of the p-type dopant 212 in the first p-type doping layer 210 may be smaller than each of that of the p-type dopant 222 in the m-th p-type doping layer 220 and that of the p-type dopant 232 in the n-th p-type doping layer 230. In addition, when both of the p-type dopant 222 in the m-th p-type doping layer 220 and the p-type dopant 232 in the n-th p-type doping layer 230 may be the symmetric indacene derivative, e.g., the compounds S01 to S49 in Formula 3, or the asymmetric indacene derivative, e.g., the compounds A01 to A96, the weight % of the p-type dopant 222 in the m-th p-type doping layer 220 may be greater than that of the p-type dopant 232 in the n-th p-type doping layer 230.

The p-type dopant 212 in the first p-type doping layer 210 may have a weight % of 1 to 20, the p-type dopant 222 in the m-th p-type doping layer 220 may have a weight % of 10 to 50, and the p-type dopant 232 in the n-th p-type doping layer 230 may have a weight % of 5 to 25. For example, the p-type dopant 212 in the first p-type doping layer 210 may have a weight % of 5 to 15, the p-type dopant 222 in the m-th p-type doping layer 220 may have a weight % of 10 to 30, and the p-type dopant 232 in the n-th p-type doping layer 230 may have a weight % of 10 to 20.

The p-type dopant 212, 222 and 232 of the first p-type doping layer 210, the m-th p-type doping layer 220 and the n-th p-type doping layer 230 may be same or different. For example, when the p-type dopant 212, 222 and 232 of the first p-type doping layer 210, the m-th p-type doping layer 220 and the n-th p-type doping layer 230 is the asymmetric compound in Formula 1-4, the lifespan of the OLED D is further increased.

The host 214, 224 and 234 of the first p-type doping layer 210, the m-th p-type doping layer 220 and the n-th p-type doping layer 230 may be same or different. For example, the host 214 and 234 of the first p-type doping layer 210 and the n-th p-type doping layer 230 may be the second organic compound in Formula 2-3, and the host 224 of the m-th p-type doping layer 220 may be the second organic compound in Formula 2-2.

As described above, the OLED D includes the first p-type doping layer 210 being closer to the first electrode 160 as the anode, the n-th p-type doping layer 230 being closer to the second electrode 164 as the cathode and the m-th p-type doping layer 220 between the first p-type doping layer 210 and the n-th p-type doping layer 230, and the electric conductivity of the n-th p-type doping layer 230 is greater than that of the first p-type doping layer 210 and is equal to or smaller than that of the m-th p-type doping layer 220. As a result, the OLED D has advantages in the driving voltage, the emitting efficiency and the lifespan.

In addition, when the electric conductivity of the m-th p-type doping layer 220 is greater than that of the n-th p-type doping layer 230, the driving voltage of the OLED D is further reduced and the emitting efficiency and the lifespan of the OLED D are further increased.

Moreover, when each of the first p-type doping layer 210, the m-th p-type doping layer 220 and the n-th p-type doping layer 230 includes the first organic compound in Formula 1-1 as the p-type dopant 212, 222 and 232 and the second organic compound in Formula 2-1 as the host 214, 224 and 234, the driving voltage of the OLED D is significantly reduced and the emitting efficiency and the lifespan of the OLED D are significantly increased.

Figure 4:
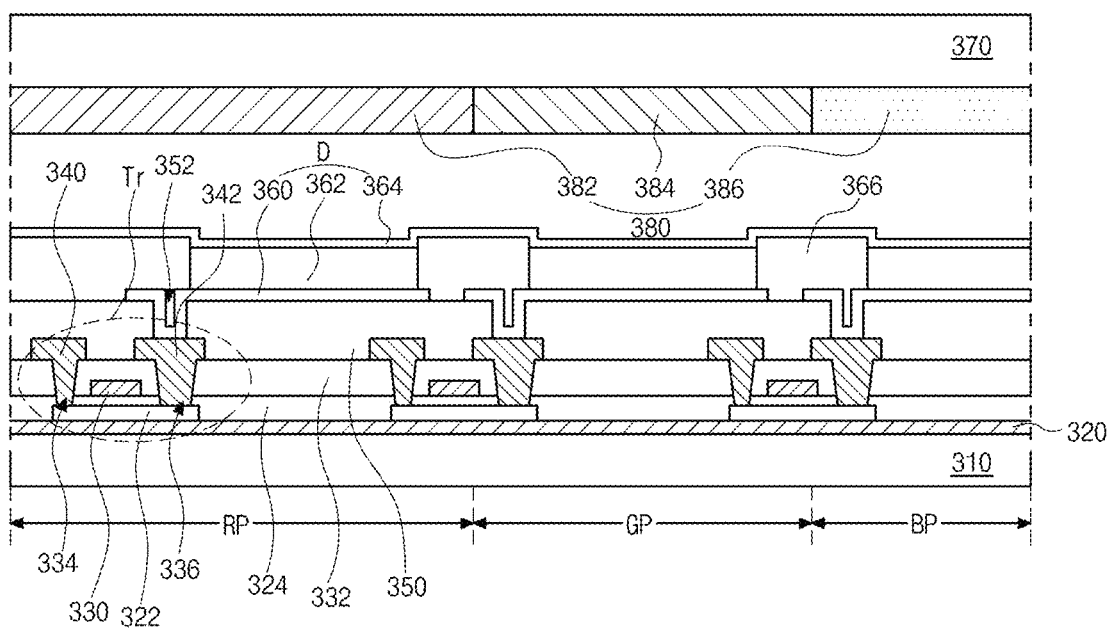
FIG. 4 is a schematic cross-sectional view of an organic light emitting device according to a third embodiment of the present disclosure.
Figure 5:
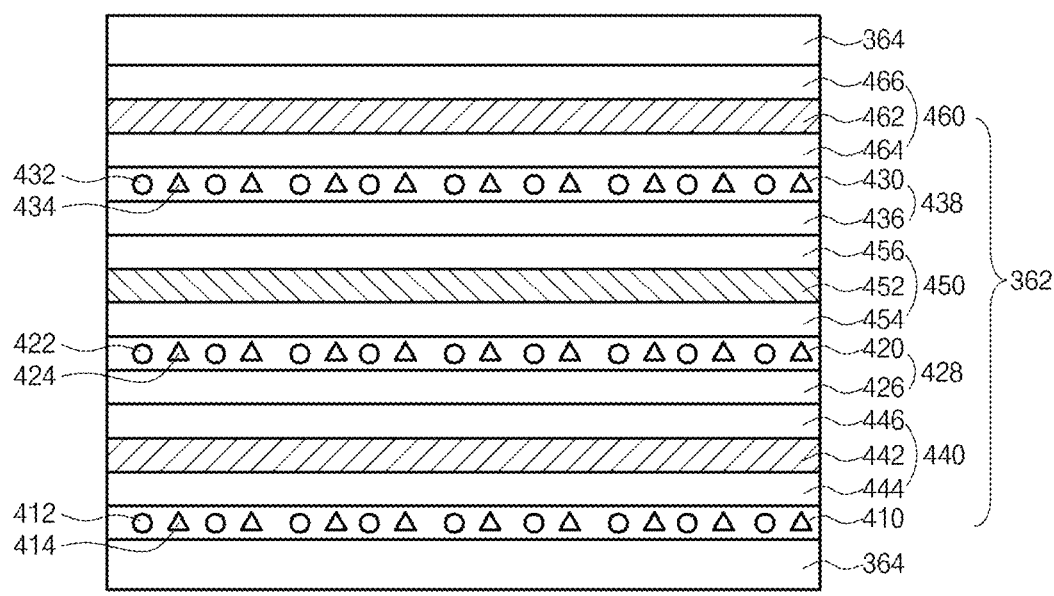
FIG. 5 is a schematic cross-sectional view of an OLED according to a fourth embodiment of the present disclosure.

FIG. 4 is a schematic cross-sectional view of an organic light emitting device according to a third embodiment of the present disclosure, and FIG. 5 is a schematic cross-sectional view of an OLED according to a fourth embodiment of the present disclosure.

As shown in FIG. 4, the organic light emitting display device 300 includes a first substrate 310, where a red pixel BP, a green pixel GP and a blue pixel BP are defined, a second substrate 370 facing the first substrate 310, an OLED D, which is positioned between the first and second substrates 310 and 370 and providing white emission, and a color filter layer 380 between the OLED D and the second substrate 370.

Each of the first and second substrates 310 and 370 may be a glass substrate or a flexible substrate. For example, each of the first and second substrates 310 and 370 may be a polyimide (PI) substrate, a polyethersulfone (PES) substrate, a polyethylenenaphthalate (PEN) substrate, a polyethylene terephthalate (PET) substrate or a polycarbonate (PC) substrate.

A buffer layer 320 is formed on the substrate, and the TFT Tr corresponding to each of the red, green and blue pixels RP, GP and BP is formed on the buffer layer 320. The buffer layer 320 may be omitted.

A semiconductor layer 322 is formed on the buffer layer 320. The semiconductor layer 322 may include an oxide semiconductor material or polycrystalline silicon.

A gate insulating layer 324 is formed on the semiconductor layer 322. The gate insulating layer 324 may be formed of an inorganic insulating material such as silicon oxide or silicon nitride.

A gate electrode 330, which is formed of a conductive material, e.g., metal, is formed on the gate insulating layer 324 to correspond to a center of the semiconductor layer 322.

An interlayer insulating layer 332, which is formed of an insulating material, is formed on the gate electrode 330. The interlayer insulating layer 332 may be formed of an inorganic insulating material, e.g., silicon oxide or silicon nitride, or an organic insulating material, e.g., benzocyclobutene or photo-acryl.

The interlayer insulating layer 332 includes first and second contact holes 334 and 336 exposing both sides of the semiconductor layer 322. The first and second contact holes 334 and 336 are positioned at both sides of the gate electrode 330 to be spaced apart from the gate electrode 330.

A source electrode 340 and a drain electrode 342, which are formed of a conductive material, e.g., metal, are formed on the interlayer insulating layer 332.

The source electrode 340 and the drain electrode 342 are spaced apart from each other with respect to the gate electrode 330 and respectively contact both sides of the semiconductor layer 322 through the first and second contact holes 334 and 336.

The semiconductor layer 322, the gate electrode 330, the source electrode 340 and the drain electrode 342 constitute the TFT Tr. The TFT Tr serves as a driving element. Namely, the TFT Tr may correspond to the driving TFT Td (of FIG. 1).

Although not shown, the gate line and the data line cross each other to define the pixel, and the switching TFT is formed to be connected to the gate and data lines. The switching TFT is connected to the TFT Tr as the driving element.

In addition, the power line, which may be formed to be parallel to and spaced apart from one of the gate and data lines, and the storage capacitor for maintaining the voltage of the gate electrode of the TFT Tr in one frame may be further formed.

A planarization layer 350, which includes a drain contact hole 352 exposing the drain electrode 342 of the TFT Tr, is formed to cover the TFT Tr.

A first electrode 360, which is connected to the drain electrode 342 of the TFT Tr through the drain contact hole 352, is separately formed in each pixel and on the planarization layer 350. The first electrode 360 may be an anode and may be formed of a conductive material, e.g., a transparent conductive oxide (TCO), having a relatively high work function. The first electrode 360 may further include a reflection electrode or a reflection layer. For example, the reflection electrode or the reflection layer may be formed of silver (Ag) or aluminum-palladium-copper (APC) alloy. In the top-emission type organic light emitting display device 300, the first electrode 360 may have a triple-layered structure of ITO/Ag/ITO or ITO/APC/ITO.

A bank layer 366 is formed on the planarization layer 350 to cover an edge of the first electrode 360. Namely, the bank layer 366 is positioned at a boundary of the pixel and exposes a center of the first electrode 360 in the pixel. Since the OLED D emits the white light in the red, green and blue pixels RP, GP and BP, the organic emitting layer 162 may be formed as a common layer in the red, green and blue pixels RP, GP and BP without separation. The bank layer 366 may be formed to prevent a current leakage at an edge of the first electrode 360 and may be omitted.

An organic emitting layer 362 is formed on the first electrode 360.

Referring to FIG. 5, the organic emitting layer 362 includes a first emitting part 440, a second emitting part 450, a third emitting part 460, a first p-type doping layer 410 between the first emitting part 440 and the first electrode 360, a second p-type doping layer 420 between the first and second emitting parts 440 and 450 and a third p-type doping layer 430 between the second and third emitting parts 450 and 460.

Namely, the OLED D of the present disclosure includes three emitting parts 440, 450 and 460 and three p-type doping layers 410, 420 and 430.

The first emitting part 440 includes a first EML 442.

In addition, the first emitting part 440 may further include at least one of a first hole auxiliary layer 444 under the first EML 442 and a first electron auxiliary layer 446 on (or over) the first EML 442. Namely, the first hole auxiliary layer 444 is disposed between the first p-type doping layer 410 and the first EML 442, and the first electron auxiliary layer 446 is disposed between the first EML 442 and the second p-type doping layer 420. For example, the first hole auxiliary layer 444 may be a hole transporting layer (HTL), and the first electron auxiliary layer 446 may be an electron transporting layer (ETL).

Although not shown, the first emitting part 440 may further include at least one of an electron blocking layer (EBL) between the first hole auxiliary layer 444 and the first EML 442 and a hole blocking layer (HBL) between the first EML 442 and the first electron auxiliary layer 446.

The second emitting part 450 includes a second EML 452.

In addition, the second emitting part 450 may further include at least one of a second hole auxiliary layer 454 under the second EML 452 and a second electron auxiliary layer 456 on (or over) the second EML 452. Namely, the second hole auxiliary layer 454 is disposed between the second p-type doping layer 420 and the second EML 452, and the second electron auxiliary layer 456 is disposed between the second EML 452 and the third p-type doping layer 430. For example, the second hole auxiliary layer 454 may be an HTL, and the second electron auxiliary layer 456 may be an ETL.

The third emitting part 460 includes a third EML 462.

In addition, the third emitting part 460 may further include at least one of a third hole auxiliary layer 464 under the third EML 462 and a third electron auxiliary layer 466 on (or over) the third EML 462. Namely, the third hole auxiliary layer 464 is disposed between the third p-type doping layer 430 and the third EML 462, and the third electron auxiliary layer 466 is disposed between the third EML 462 and the second electrode 364. For example, the third hole auxiliary layer 464 may be an HTL, and the third electron auxiliary layer 466 may include at least one of an ETL and an electron injection layer (EIL).

Although not shown, the third emitting part 460 may further include at least one of an electron blocking layer (EBL) between the third hole auxiliary layer 464 and the third EML 462 and a hole blocking layer (HBL) between the third EML 462 and the third electron auxiliary layer 466.

The first HTL included in the first hole auxiliary layer 444, the second HTL included in the second hole auxiliary layer 454 and the third HTL included in the third hole auxiliary layer 464 may include the same material, e.g., NPD. A thickness of the third HTL included in the third hole auxiliary layer 464 may be smaller than that of the first HTL included in the first hole auxiliary layer 444 and may be greater than that of the second HTL included in the second hole auxiliary layer 454.

The first ETL included in the first electron auxiliary layer 446 and the third ETL included in the third electron auxiliary layer 466 may include an azine-based compound, e.g., TmPyPB, and the second ETL included in the second electron auxiliary layer 456 may include an imidazole-based compound, e.g., TPBi. The first ETL included in the first electron auxiliary layer 446 and the second ETL included in the second electron auxiliary layer 456 may the same thickness, and a thickness of the third ETL included in the third electron auxiliary layer 466 may be greater than that of each of the first ETL included in the first electron auxiliary layer 446 and the second ETL included in the second electron auxiliary layer 456.

The EIL included in the third electron auxiliary layer 466 may include at least one of alkali metal, e.g., Li, alkali halide material, e.g., LiF, CsF, NaF or BaF2, and an organometallic material, e.g., Liq, lithium benzoate or sodium stearate, but it is not limited thereto. For example, the EIL may have a thickness of 1 to 10 nm, preferably 1 to 5 nm.

Each of the first and third EMLs 442 and 462 provides a light having a wavelength range of about 440 to 480 nm, and the second EML 452 provides a light having a wavelength range of about 500 to 550 nm. A thickness of each of the first and third EMLs 442 and 462 may be equal to or smaller than that of the second EML 452.

In FIG. 5, the second EML 452 has a single-layered structure. Alternatively, the second EML 452 may have a double-layered structure having a first layer, which includes a host and a red dopant and emits red light, and a second layer, which includes a host and a green dopant and emits green light, or may have a triple-layered structure having a first layer, which include a host and a red dopant and emits red light, a second layer, which includes a host and a yellow-green dopant and emits yellow-green light, and a third layer, which includes a host and a green dopant and emits green light.

In each of the first and third EMLs 442 and 462 having the wavelength range of 440 to 480 nm, a host may be an anthracene derivative, and a dopant may be a pyrene derivative. For example, in the each of the first and third EMLs 442 and 462, the host may be 9,10-di(naphtha-2-yl)anthracene, and the dopant may be 1,6-bis(diphenylamino)pyrene.

In the second EML 452 having the wavelength range of 500 to 550 nm, a host may be carbazole derivative, and the dopant may be iridium derivative (complex). For example, in the second EML 452, the host may be 4,4'-bis(N-Carbazolyl)-1,1'-biphenyl (CBP), and the dopant may be tris(2-phenylpyridine) Iridium (III) (Ir(ppy)$_3$).

The first p-type doping layer 410 provides a hole into the first emitting part 440, the second p-type doping layer 420 provides a hole into the second emitting part 450, and the third p-type doping layer 430 provides a hole into the third emitting part 460.

For example, the hole is provided from the first p-type doping layer 410 into the first EML 442 through the first hole auxiliary layer 444, and the hole is provided from the second p-type doping layer 420 into the second EML 452 through the second hole auxiliary layer 454. In addition, the hole is provided from the third p-type doping layer 430 into the third EML 462 through the third hole auxiliary layer 464.

The first p-type doping layer 410 may contact the first electrode 360 and may be a hole injection layer. An n-type CGL 226 is disposed under the second p-type doping layer 420, and the second p-type doping layer 420 may be a p-type CGL. In this instance, the second p-type doping layer 420 and the n-type CGL 426 under the second p-type doping layer 420 constitute a first CGL 428. An n-type CGL 436 is disposed under the third p-type doping layer 430, and the third p-type doping layer 430 may be a p-type CGL. In this instance, the third p-type doping layer 430 and the n-type CGL 436 under the third p-type doping layer 430 constitute a second CGL 438.

Namely, the second p-type doping layer 420 may be included in the first CGL 428 disposed between the first and second emitting parts 440 and 450, and the third p-type doping layer 430 may be included in the second CGL 438 disposed between the second and third emitting parts 450 and 460.

The n-type CGLs 426 and 436 provide an electron into the electron auxiliary layers 446 and 456, respectively, and the electron is provided into the first and second emitting parts 440 and 450 through the electron auxiliary layers 446 and 456. As a result, the driving voltage of the OLED D having a multi-tandem structure is reduced, and the emitting efficiency of the OLED D is improved.

For example, each of the n-type CGLs 426 and 436 may include an n-type charge generation material, e.g., Bphen, and may have a thickness of 10 to 20 nm. In addition, each of the n-type CGLs 426 and 436 may further include an auxiliary n-type charge generation material, e.g., Li.

The first p-type doping layer 410 as the HIL has a first electrical conductivity, the second p-type doping layer 420 as the p-type CGL of the first CGL 428 has a second electrical conductivity, and the third p-type doping layer 430 as the p-type CGL of the second CGL 438 has a third electrical conductivity. Each of the second and third electrical conductivities is greater than the first electrical conductivity, and the second electrical conductivity is equal to or greater than the third electrical conductivity. Preferably, the second electrical conductivity may be greater than the third electrical conductivity.

Namely, the electric conductivity of the first p-type doping layer 410 being closer to the first electrode 360 as the anode is smaller than that of each of the second and third p-type doping layers 420 and 430 being farther from the first electrode 360. In addition, the electrical conductivity of the third p-type doping layer 430 being closer to the second electrode 364 as the cathode is equal to or smaller than that of the second p-type doping layer 420 positioned between the first p-type doping layer 410 and the third p-type doping layer 430.

In other words, the third p-type doping layer 430 has the electrical conductivity being greater than the first p-type doping layer 410 and being equal to or smaller than the second p-type doping layer 420.

For example, the electrical conductivity of the first p-type doping layer 410 may have a range of $1*10^{-5} \sim 1*10^{-4}$ S/cm, the electrical conductivity of the second p-type doping layer 420 may have a range of $1*10^{-4} \sim 1*10^{-3}$ S/cm, and the electrical conductivity of the third p-type doping layer 430 may have a range of $3*10^{-5} \sim 6*10^{-4}$ S/cm.

Each of the first p-type doping layer 410, the second p-type doping layer 420 and the third p-type doping layer 430 includes a p-type dopant 412, 422 and 432 and a host 414, 424 and 434, respectively. In each of the first p-type doping layer 410, the second p-type doping layer 420 and the third p-type doping layer 430, the p-type dopant 412, 422 and 432 has a weight % being smaller than the host 414, 424 and 434.

The p-type dopant 412, 422 and 432 of the first p-type doping layer 410, the second p-type doping layer 420 and the third p-type doping layer 430 may be the first organic compound in Formula 1-1, and the host 414, 424 and 434 of the first p-type doping layer 410, the second p-type doping layer 420 and the third p-type doping layer 430 may be the second organic compound in Formula 2-1.

A weight % of the p-type dopant 412 in the first p-type doping layer 410 may be smaller than each of that of the p-type dopant 422 in the second p-type doping layer 420 and that of the p-type dopant 432 in the third p-type doping layer 430. In addition, the weight % of the p-type dopant 422 in the second p-type doping layer 420 may be greater than that of the p-type dopant 432 in the third p-type doping layer 430.

The p-type dopant 412 in the first p-type doping layer 410 may have a weight % of 1 to 20, the p-type dopant 422 in the second p-type doping layer 420 may have a weight % of 10 to 50, and the p-type dopant 432 in the third p-type doping layer 430 may have a weight % of 5 to 25. For example, the p-type dopant 412 in the first p-type doping layer 410 may have a weight % of 5 to 15, the p-type dopant 422 in the second p-type doping layer 420 may have a weight % of 10 to 30, and the p-type dopant 432 in the third p-type doping layer 430 may have a weight % of 10 to 20.

The p-type dopant 412, 422 and 432 of the first p-type doping layer 410, the second p-type doping layer 420 and the third p-type doping layer 430 may be same or different. For example, when the p-type dopant 412, 422 and 432 of the first p-type doping layer 410, the second p-type doping layer 420 and the third p-type doping layer 430 is the asymmetric compound in Formula 1-4, the lifespan of the OLED D is further increased.

The host 414, 424 and 434 of the first p-type doping layer 410, the second p-type doping layer 420 and the third p-type doping layer 430 may be same or different. For example, the host 414 and 434 of the first p-type doping layer 410 and the third p-type doping layer 430 may be the second organic compound in Formula 2-3, and the host 424 of the second p-type doping layer 420 may be the second organic compound in Formula 2-2.

The OLED including the first and third emitting parts 440 and 460 and the second emitting part 450 provides the white light emission. Since the first and second CGLs 428 and 438 including the first organic compound in Formula 1-1 and the second organic compound in Formula 2-1 are disposed between the first and second emitting parts 440 and 450 and between the second and third emitting parts 450 and 460, respectively, the OLED D has advantages in the driving voltage, the emitting efficiency and the lifespan.

In addition, the OLED D includes the first p-type doping layer 410 being closer to the first electrode 360 as the anode, the third p-type doping layer 430 being closer to the second electrode 364 as the cathode and the second p-type doping layer 420 between the first p-type doping layer 410 and the third p-type doping layer 430, and the electric conductivity of the third p-type doping layer 430 is greater than that of the first p-type doping layer 410 and is equal to or smaller than that of the second p-type doping layer 420. As a result, the OLED D has further advantages in the driving voltage, the emitting efficiency and the lifespan.

Moreover, when the electric conductivity of the second p-type doping layer 420 is greater than that of the third p-type doping layer 430, the driving voltage of the OLED D is further reduced and the emitting efficiency and the lifespan of the OLED D are further increased.

Furthermore, when each of the first p-type doping layer 410, the second p-type doping layer 420 and the third p-type doping layer 430 includes the first organic compound in Formula 1-1 as the p-type dopant 412, 422 and 432 and the second organic compound in Formula 2-1 as the host 414, 424 and 434, the driving voltage of the OLED D is significantly reduced and the emitting efficiency and the lifespan of the OLED D are significantly increased.

A second electrode 364 is formed over the first substrate 310 where the organic emitting layer 362 is formed.

In the organic light emitting display device 300, since the light emitted from the organic emitting layer 362 is incident to the color filter layer 380 through the second electrode 364, the second electrode 364 has a thin profile for transmitting the light.

The first electrode 360, the organic emitting layer 362 and the second electrode 364 constitute the OLED D.

The color filter layer 380 is positioned over the OLED D and includes a red color filter 382, a green color filter 384 and a blue color filter 386 respectively corresponding to the red, green and blue pixels RP, GP and BP. The red color filter 382 may include at least one of red dye and red pigment, the green color filter 384 may include at least one of green dye and green pigment, and the blue color filter 386 may include at least one of blue dye and blue pigment.

Although not shown, the color filter layer 380 may be attached to the OLED D by using an adhesive layer. Alternatively, the color filter layer 380 may be formed directly on the OLED D.

An encapsulation film (not shown) may be formed to prevent penetration of moisture into the OLED D. For example, the encapsulation film may include a first inorganic insulating layer, an organic insulating layer and a second inorganic insulating layer sequentially stacked, but it is not limited thereto. The encapsulation film may be omitted.

A polarization plate (not shown) for reducing an ambient light reflection may be disposed over the top-emission type OLED D. For example, the polarization plate may be a circular polarization plate.

In the OLED of FIG. 4, the first and second electrodes 360 and 364 are a reflection electrode and a transparent (or semi-transparent) electrode, respectively, and the color filter layer 380 is disposed over the OLED D. Alternatively, when the first and second electrodes 360 and 364 are a transparent (or semi-transparent) electrode and a reflection electrode, respectively, the color filter layer 380 may be disposed between the OLED D and the first substrate 310.

A color conversion layer (not shown) may be formed between the OLED D and the color filter layer 380. The color conversion layer may include a red color conversion layer, a green color conversion layer and a blue color conversion layer respectively corresponding to the red, green and blue pixels RP, GP and BP. The white light from the OLED D is converted into the red light, the green light and the blue light by the red, green and blue color conversion layer, respectively. For example, the color conversion layer may include a quantum dot. Accordingly, the color purity of the organic light emitting display device 300 may be further improved.

The color conversion layer may be included instead of the color filter layer 380.

As described above, in the organic light emitting display device 300, the OLED D in the red, green and blue pixels RP, GP and BP emits the white light, and the white light from the organic light emitting diode D passes through the red color filter 382, the green color filter 384 and the blue color filter 386. As a result, the red light, the green light and the blue light are provided from the red pixel RP, the green pixel GP and the blue pixel BP, respectively.

In FIG. 4, the OLED D emitting the white light is used for a display device. Alternatively, the OLED D may be formed on an entire surface of a substrate without at least one of the driving element and the color filter layer to be used for a lightening device. The display device and the lightening device each including the OLED D of the present disclosure may be referred to as an organic light emitting device.

In the OLED D and the organic light emitting display device 300, each of the first p-type doping layer 410 as the HIL, the second p-type doping layer 420 as the p-type CGL and the third p-type doping layer 430 as the p-type CGL includes the first organic compound, e.g., a p-type dopant, in Formula 1-1 and the second organic compound, e.g., a host, in Formula 2-1, and the first p-type doping layer 410 being closer to the first electrode 360 as the anode has an electric conductivity being smaller than each of the second and third p-type doping layers 420 and 430. As a result, the driving voltage of the OLED D and the organic light emitting display device 300 is decreased, and the emitting efficiency and the lifespan of the OLED D and the organic light emitting display device 300 are increased.

In addition, the electric conductivity of the third p-type doping layer 430 being closer to the second electrode 364 as the cathode is smaller than the second p-type doping layer 420. As a result, the driving voltage of the OLED D and the organic light emitting display device 300 is further decreased, and the emitting efficiency and the lifespan of the OLED D and the organic light emitting display device 300 are further increased.

[OLED1]

On the anode (ITO), the HIL (10 nm), the first HTL (HTL1, 100 nm, NPD), the first EML (EML1, 20 nm, the host (9,10-di(naphtha-2-yl)anthracene) and the dopant (1,6-bis(diphenylamino)pyrene, 3 wt %), the first ETL (EYL1, 20 nm, 1,3,5-tri(m-pyridin-3-ylphenyl)benzene(TmPyPB)), the first n-type CGL (N-CGL1, 15 nm, Bphen+Li (2 wt %)), the first p-type CGL (P-CGL1, 10 nm), the second HTL (HTL2, 15 nm, NPD), the second EML (EML2, the host (CBP) and the dopant (Ir(ppy)$_3$, 8 wt %)), the second ETL (ETL2, 20 nm, 2,2',2"-(1,3,5-benzinetriyl)-tris(1-phenyl-1-H benzimidazole) (TPBi)), the second n-type CGL (N-CGL2, 15 nm, Bphen+Li (2 wt %)), the second p-type CGL (P-CGL2, 10 nm), the third HTL (HTL2, 80 nm, NPD), the third EML (EML3, 20 nm, the host (9,10-di(naphtha-2-yl)anthracene) and the dopant (1,6-bis(diphenylamino)pyrene, 3 wt %), the third ETL (ETL3, 25 nm, TmPyPB), the EIL (LiF, 1 nm) and the cathode (Al, 150 nm) were sequentially deposited to form the OLED.

1. COMPARATIVE EXAMPLES (1) Comparative Example 1 (Ref1)

The HIL is formed by using the compound S7 (10 wt %) in Formula 3 and the compound C12 (90 wt %) in Formula 4, the first p-type CGL is formed by using the compound S7 (10 wt %) in Formula 3 and the compound C12 (90 wt %) in Formula 4, and the second p-type CGL is formed by using the compound S7 (20 wt %) in Formula 3 and the compound C12 (80 wt %) in Formula 4.

(2) Comparative Example 2 (Ref2)

The HIL is formed by using the compound S7 (10 wt %) in Formula 3 and the compound C12 (90 wt %) in Formula 4, the first p-type CGL is formed by using the compound S7 (20 wt %) in Formula 3 and the compound C12 (80 wt %) in Formula 4, and the second p-type CGL is formed by using the compound S7 (30 wt %) in Formula 3 and the compound C12 (70 wt %) in Formula 4.

(3) Comparative Example 3 (Ref3)

The HIL is formed by using the compound S7 (10 wt %) in Formula 3 and the compound C12 (90 wt %) in Formula 4, the first p-type CGL is formed by using the compound S7 (20 wt %) in Formula 3 and the compound D8 (80 wt %) in Formula 4, and the second p-type CGL is formed by using the compound S7 (20 wt %) in Formula 3 and the compound C12 (80 wt %) in Formula 4.

2. EXAMPLES (1) Example 1 (Ex1)

The HIL is formed by using the compound S7 (10 wt %) in Formula 3 and the compound C12 (90 wt %) in Formula 4, the first p-type CGL is formed by using the compound S7 (20 wt %) in Formula 3 and the compound C12 (80 wt %) in Formula 4, and the second p-type CGL is formed by using the compound S7 (20 wt %) in Formula 3 and the compound C12 (80 wt %) in Formula 4.

(2) Example 2 (Ex2)

The HIL is formed by using the compound S7 (5 wt %) in Formula 3 and the compound C12 (95 wt %) in Formula 4, the first p-type CGL is formed by using the compound S7 (20 wt %) in Formula 3 and the compound C12 (80 wt %) in Formula 4, and the second p-type CGL is formed by using the compound S7 (20 wt %) in Formula 3 and the compound C12 (80 wt %) in Formula 4.

(3) Example 3 (Ex3)

The HIL is formed by using the compound S7 (15 wt %) in Formula 3 and the compound C12 (85 wt %) in Formula 4, the first p-type CGL is formed by using the compound S7 (20 wt %) in Formula 3 and the compound C12 (80 wt %) in Formula 4, and the second p-type CGL is formed by using the compound S7 (20 wt %) in Formula 3 and the compound C12 (80 wt %) in Formula 4.

(4) Example 4 (Ex4)

The HIL is formed by using the compound S7 (10 wt %) in Formula 3 and the compound C12 (90 wt %) in Formula 4, the first p-type CGL is formed by using the compound S7 (30 wt %) in Formula 3 and the compound C12 (70 wt %) in Formula 4, and the second p-type CGL is formed by using the compound S7 (20 wt %) in Formula 3 and the compound C12 (80 wt %) in Formula 4.

(5) Example 5 (Ex5)

The HIL is formed by using the compound S7 (10 wt %) in Formula 3 and the compound C12 (90 wt %) in Formula 4, the first p-type CGL is formed by using the compound S7 (20 wt %) in Formula 3 and the compound C12 (80 wt %) in Formula 4, and the second p-type CGL is formed by using the compound S7 (10 wt %) in Formula 3 and the compound C12 (90 wt %) in Formula 4.

(6) Example 6 (Ex6)

The HIL is formed by using the compound S7 (10 wt %) in Formula 3 and the compound D8 (90 wt %) in Formula 4, the first p-type CGL is formed by using the compound S7 (20 wt %) in Formula 3 and the compound C12 (80 wt %) in Formula 4, and the second p-type CGL is formed by using the compound S7 (20 wt %) in Formula 3 and the compound C12 (80 wt %) in Formula 4.

(7) Example 7 (Ex7)

The HIL is formed by using the compound S7 (10 wt %) in Formula 3 and the compound C12 (90 wt %) in Formula 4, the first p-type CGL is formed by using the compound S7 (20 wt %) in Formula 3 and the compound C12 (80 wt %) in Formula 4, and the second p-type CGL is formed by using the compound S7 (20 wt %) in Formula 3 and the compound D8 (80 wt %) in Formula 4.

(8) Example 8 (Ex8)

The HIL is formed by using the compound S7 (5 wt %) in Formula 3 and the compound C12 (95 wt %) in Formula 4, the first p-type CGL is formed by using the compound S7 (30 wt %) in Formula 3 and the compound C12 (70 wt %) in Formula 4, and the second p-type CGL is formed by using the compound S7 (10 wt %) in Formula 3 and the compound C12 (90 wt %) in Formula 4.

(9) Example 9 (Ex9)

The HIL is formed by using the compound S7 (5 wt %) in Formula 3 and the compound C12 (95 wt %) in Formula 4, the first p-type CGL is formed by using the compound S7 (30 wt %) in Formula 3 and the compound C12 (70 wt %) in Formula 4, and the second p-type CGL is formed by using the compound S7 (20 wt %) in Formula 3 and the compound D8 (80 wt %) in Formula 4.

(10) Example 10 (Ex10)

The HIL is formed by using the compound S7 (10 wt %) in Formula 3 and the compound D8 (90 wt %) in Formula 4, the first p-type CGL is formed by using the compound S7 (30 wt %) in Formula 3 and the compound C12 (70 wt %) in Formula 4, and the second p-type CGL is formed by using the compound S7 (20 wt %) in Formula 3 and the compound D8 (80 wt %) in Formula 4.

(11) Example 11 (Ex11)

The HIL is formed by using the compound S20 (10 wt %) in Formula 3 and the compound C12 (90 wt %) in Formula 4, the first p-type CGL is formed by using the compound S20 (30 wt %) in Formula 3 and the compound C12 (70 wt %) in Formula 4, and the second p-type CGL is formed by using the compound S20 (20 wt %) in Formula 3 and the compound D8 (80 wt %) in Formula 4.

(12) Example 12 (Ex12)

The HIL is formed by using the compound S20 (10 wt %) in Formula 3 and the compound D8 (90 wt %) in Formula 4, the first p-type CGL is formed by using the compound S20 (30 wt %) in Formula 3 and the compound D8 (70 wt %) in Formula 4, and the second p-type CGL is formed by using the compound S20 (20 wt %) in Formula 3 and the compound D8 (80 wt %) in Formula 4.

(13) Example 13 (Ex13)

The HIL is formed by using the compound S20 (10 wt %) in Formula 3 and the compound D8 (90 wt %) in Formula 4, the first p-type CGL is formed by using the compound S20 (30 wt %) in Formula 3 and the compound C12 (70 wt %) in Formula 4, and the second p-type CGL is formed by using the compound S20 (20 wt %) in Formula 3 and the compound C12 (80 wt %) in Formula 4.

(14) Example 14 (Ex14)

The HIL is formed by using the compound S20 (10 wt %) in Formula 3 and the compound D8 (90 wt %) in Formula 4, the first p-type CGL is formed by using the compound S20 (30 wt %) in Formula 3 and the compound C12 (70 wt %) in Formula 4, and the second p-type CGL is formed by using the compound S20 (10 wt %) in Formula 3 and the compound C12 (90 wt %) in Formula 4.

(15) Example 15 (Ex15)

The HIL is formed by using the compound S20 (10 wt %) in Formula 3 and the compound D8 (90 wt %) in Formula 4, the first p-type CGL is formed by using the compound S20 (10 wt %) in Formula 3 and the compound C12 (90 wt %) in Formula 4, and the second p-type CGL is formed by using the compound S20 (20 wt %) in Formula 3 and the compound D8 (80 wt %) in Formula 4.

(16) Example 16 (Ex16)

The HIL is formed by using the compound S20 (10 wt %) in Formula 3 and the compound D8 (90 wt %) in Formula 4, the first p-type CGL is formed by using the compound S20 (30 wt %) in Formula 3 and the compound C12 (70 wt %) in Formula 4, and the second p-type CGL is formed by using the compound S20 (20 wt %) in Formula 3 and the compound D8 (80 wt %) in Formula 4.

(17) Example 17 (Ex17)

The HIL is formed by using the compound A13 (10 wt %) in Formula 3 and the compound C12 (90 wt %) in Formula 4, the first p-type CGL is formed by using the compound A13 (30 wt %) in Formula 3 and the compound C12 (70 wt %) in Formula 4, and the second p-type CGL is formed by using the compound A13 (20 wt %) in Formula 3 and the compound D8 (80 wt %) in Formula 4.

(18) Example 18 (Ex18)

The HIL is formed by using the compound A13 (10 wt %) in Formula 3 and the compound D8 (90 wt %) in Formula 4, the first p-type CGL is formed by using the compound A13 (30 wt %) in Formula 3 and the compound D8 (70 wt %) in Formula 4, and the second p-type CGL is formed by using the compound A13 (20 wt %) in Formula 3 and the compound D8 (80 wt %) in Formula 4.

(19) Example 19 (Ex19)

The HIL is formed by using the compound A13 (10 wt %) in Formula 3 and the compound D8 (90 wt %) in Formula 4, the first p-type CGL is formed by using the compound A13 (30 wt %) in Formula 3 and the compound C12 (70 wt %) in Formula 4, and the second p-type CGL is formed by using the compound A13 (20 wt %) in Formula 3 and the compound C12 (80 wt %) in Formula 4.

(20) Example 20 (Ex20)

The HIL is formed by using the compound A13 (10 wt %) in Formula 3 and the compound D8 (90 wt %) in Formula 4, the first p-type CGL is formed by using the compound A13 (30 wt %) in Formula 3 and the compound C12 (70 wt %) in Formula 4, and the second p-type CGL is formed by using the compound A13 (10 wt %) in Formula 3 and the compound C12 (90 wt %) in Formula 4.

(21) Example 21 (Ex21)

The HIL is formed by using the compound A13 (10 wt %) in Formula 3 and the compound D8 (90 wt %) in Formula 4, the first p-type CGL is formed by using the compound A13 (10 wt %) in Formula 3 and the compound C12 (90 wt %) in Formula 4, and the second p-type CGL is formed by using the compound A13 (20 wt %) in Formula 3 and the compound D8 (80 wt %) in Formula 4.

(22) Example 22 (Ex22)

The HIL is formed by using the compound A13 (10 wt %) in Formula 3 and the compound D8 (90 wt %) in Formula 4, the first p-type CGL is formed by using the compound A13 (30 wt %) in Formula 3 and the compound C12 (70 wt %) in Formula 4, and the second p-type CGL is formed by using the compound A13 (20 wt %) in Formula 3 and the compound D8 (80 wt %) in Formula 4.

In the OLEDs of Comparative Examples 1 to 3 (Ref1 to Ref3) and Examples 1 to 22 (Ex1 to Ex22), the electrical conductivity (S) of each of the HIL, the first p-type CGL (P-CGL1) and the second p-type CGL (P-CGL2) and the properties, i.e., the driving voltage (V), the efficiency (Cd/A), and the lifespan (hr), are measured and listed in Tables 1 and 2.

TABLE 1

| | | HIL | | P-CGL1 | | P-CGL2 | | V | Cd/A | lifespan [hr] |
|---|---|---|---|---|---|---|---|---|---|---|
| | | P-dopant | Host | P-dopant | Host | P-dopant | Host | | | |
| Ref1 | Compound Conductivity | S7 (10%) $8.6 \times 10^{-5}$ | C12 | S7 (10%) $8.6 \times 10^{-5}$ | C12 | S7 (20%) $1.7 \times 10^{-4}$ | C12 | 13.94 | 52.67 | 176 |
| Ref2 | Compound Conductivity | S7 (10%) $8.6 \times 10^{-5}$ | C12 | S7 (20%) $1.7 \times 10^{-4}$ | C12 | S7 (30%) $5.1 \times 10^{-4}$ | C12 | 13.44 | 55.15 | 160 |
| Ref3 | Compound Conductivity | S7 (10%) $8.6 \times 10^{-5}$ | C12 | S7 (20%) $3.9 \times 10^{-5}$ | D8 | S7 (20%) $1.7 \times 10^{-4}$ | C12 | 14.05 | 52.46 | 175 |
| Ex1 | Compound Conductivity | S7 (10%) $8.6 \times 10^{-5}$ | C12 | S7 (20%) $1.7 \times 10^{-4}$ | C12 | S7 (20%) $1.7 \times 10^{-4}$ | C12 | 13.73 | 53.94 | 193 |
| Ex2 | Compound Conductivity | S7 (5%) $4.4 \times 10^{-5}$ | C12 | S7 (20%) $1.7 \times 10^{-4}$ | C12 | S7 (20%) $1.7 \times 10^{-4}$ | C12 | 13.79 | 53.62 | 190 |
| Ex3 | Compound Conductivity | S7 (15%) $1.1 \times 10^{-4}$ | C12 | S7 (20%) $1.7 \times 10^{-4}$ | C12 | S7 (20%) $1.7 \times 10^{-4}$ | C12 | 13.68 | 54.18 | 202 |
| Ex4 | Compound Conductivity | S7 (10%) $8.6 \times 10^{-5}$ | C12 | S7 (30%) $5.1 \times 10^{-4}$ | C12 | S7 (20%) $1.7 \times 10^{-4}$ | C12 | 13.38 | 56.67 | 185 |
| Ex5 | Compound Conductivity | S7 (10%) $8.6 \times 10^{-5}$ | C12 | S7 (20%) $1.7 \times 10^{-4}$ | C12 | S7 (10%) $8.6 \times 10^{-5}$ | C12 | 13.77 | 53.71 | 206 |
| Ex6 | Compound Conductivity | S7 (10%) $1.2 \times 10^{-5}$ | D8 | S7 (20%) $1.7 \times 10^{-4}$ | C12 | S7 (20%) $1.7 \times 10^{-4}$ | C12 | 13.83 | 53.36 | 214 |
| Ex7 | Compound Conductivity | S7 (10%) $8.6 \times 10^{-5}$ | C12 | S7 (20%) $1.7 \times 10^{-4}$ | C12 | S7 (20%) $3.9 \times 10^{-5}$ | D8 | 13.87 | 53.20 | 228 |
| Ex8 | Compound Conductivity | S7 (5%) $4.4 \times 10^{-5}$ | C12 | S7 (30%) $5.1 \times 10^{-4}$ | C12 | S7 (10%) $8.6 \times 10^{-5}$ | C12 | 13.46 | 55.30 | 210 |
| Ex9 | Compound Conductivity | S7 (5%) $4.4 \times 10^{-5}$ | C12 | S7 (30%) $5.1 \times 10^{-4}$ | C12 | S7 (20%) $3.9 \times 10^{-5}$ | D8 | 13.53 | 54.91 | 245 |
| Ex10 | Compound Conductivity | S7 (10%) $1.2 \times 10^{-5}$ | D8 | S7 (30%) $5.1 \times 10^{-4}$ | C12 | S7 (20%) $3.9 \times 10^{-5}$ | D8 | 13.57 | 54.87 | 263 |

TABLE 2

| | | HIL | | P-CGL1 | | P-CGL2 | | V | Cd/A | lifespan [hr] |
|---|---|---|---|---|---|---|---|---|---|---|
| | | P-dopant | Host | P-dopant | Host | P-dopant | Host | | | |
| Ex11 | Compound Conductivity | S20 (10%) $9.3 \times 10^{-5}$ | C12 | S20 (30%) $6.1 \times 10^{-4}$ | C12 | S20 (20%) $4.7 \times 10^{-5}$ | D8 | 13.48 | 55.35 | 215 |
| Ex12 | Compound Conductivity | S20 (10%) $1.4 \times 10^{-5}$ | D8 | S20 (30%) $8.4 \times 10^{-5}$ | D8 | S20 (20%) $4.7 \times 10^{-5}$ | D8 | 13.76 | 53.32 | 233 |
| Ex13 | Compound Conductivity | S20 (10%) $1.4 \times 10^{-5}$ | D8 | S20 (30%) $6.1 \times 10^{-4}$ | C12 | S20 (20%) $2.6 \times 10^{-4}$ | C12 | 13.42 | 55.68 | 210 |
| Ex14 | Compound Conductivity | S20 (10%) $1.4 \times 10^{-5}$ | D8 | S20 (30%) $6.1 \times 10^{-4}$ | C12 | S20 (10%) $9.3 \times 10^{-5}$ | C12 | 13.47 | 55.36 | 226 |

TABLE 2-continued

| | | HIL | | P-CGL1 | | P-CGL2 | | V | Cd/A | lifespan [hr] |
|---|---|---|---|---|---|---|---|---|---|---|
| | | P-dopant | Host | P-dopant | Host | P-dopant | Host | | | |
| Ex15 | Compound Conductivity | S20 (10%) $1.4 \times 10^{-5}$ | D8 | S20 (10%) $9.3 \times 10^{-5}$ | C12 | S20 (20%) $4.7 \times 10^{-5}$ | D8 | 13.75 | 53.71 | 241 |
| Ex16 | Compound Conductivity | S20 (10%) $1.4 \times 10^{-5}$ | D8 | S20 (30%) $6.1 \times 10^{-4}$ | C12 | S20 (20%) $4.7 \times 10^{-5}$ | D8 | 13.52 | 55.12 | 268 |
| Ex17 | Compound Conductivity | A13 (10%) $8.9 \times 10^{-5}$ | C12 | A13 (30%) $4.6 \times 10^{-4}$ | C12 | A13 (20%) $4.2 \times 10^{-5}$ | D8 | 13.50 | 55.29 | 220 |
| Ex18 | Compound Conductivity | A13 (10%) $1.5 \times 10^{-5}$ | D8 | A13 (30%) $7.5 \times 10^{-5}$ | D8 | A13 (20%) $4.2 \times 10^{-5}$ | D8 | 13.81 | 53.30 | 236 |
| Ex19 | Compound Conductivity | A13 (10%) $1.5 \times 10^{-5}$ | D8 | A13 (30%) $4.6 \times 10^{-4}$ | C12 | A13 (20%) $2.1 \times 10^{-4}$ | C12 | 13.45 | 55.65 | 225 |
| Ex20 | Compound Conductivity | A13 (10%) $1.5 \times 10^{-5}$ | D8 | A13 (30%) $4.6 \times 10^{-4}$ | C12 | A13 (10%) $9.0 \times 10^{-5}$ | C12 | 13.50 | 55.34 | 232 |
| Ex21 | Compound Conductivity | A13 (10%) $1.5 \times 10^{-5}$ | D8 | A13 (10%) $9.0 \times 10^{-5}$ | C12 | A13 (20%) $4.2 \times 10^{-5}$ | D8 | 13.82 | 53.66 | 243 |
| Ex22 | Compound Conductivity | A13 (10%) $1.5 \times 10^{-5}$ | D8 | A13 (30%) $4.6 \times 10^{-4}$ | C12 | A13 (20%) $4.2 \times 10^{-5}$ | D8 | 13.54 | 55.07 | 275 |

As shown in Tables 1 and 2, in comparison to the OLEDs of Ref1 to Ref3, where the electrical conductivity of the first p-type CGL (e.g., the second p-type doping layer) is not greater than that of the HIL (e.g., the first p-type doping layer) and/or is smaller than that of the second p-type CGL (e.g., the third p-type doping layer), in the OLEDs of Ex1 to Ex22, where the electrical conductivity of the second p-type CGL (e.g., the third p-type doping layer) is greater than that of the HIL (e.g., the first p-type doping layer) and is equal to or smaller than that of the first p-type CGL (e.g., the second p-type doping layer), the driving voltage is reduced and the emitting efficiency is improved. Particularly, the lifespan of the OLEDs of Ex1 to Ex22 is significantly increased.

In addition, in comparison to the OLEDs of Ex1 to Ex16, where the indacene derivative having a symmetric structure is used as a p-type dopant, the OLEDs of Ex17 to Ex22, where the indacene derivative having an asymmetric structure is used as a p-type dopant, has further increased lifespan.

Moreover, in the OLEDs of Ex10, Ex15, Ex16, Ex21 and Ex22, where the first organic compound in Formula 2-3 is included in the HIL (e.g., the first p-type doping layer) and the second p-type CGL (e.g., the third p-type doping layer) and the first organic compound in Formula 2-2 is included in the first p-type CGL (e.g., the second p-type doping layer), the lifespan is remarkably increased.

It will be apparent to those skilled in the art that various modifications and variations can be made in the organic light emitting diode and the organic light emitting device including the same of the present disclosure without departing from the spirit or scope of the present disclosure. Thus, it is intended that the modifications and variations are covered in this disclosure provided they come within the scope of the appended claims and their equivalents.

What is claimed is:
1. An organic light emitting diode, comprising:
a first electrode;
a second electrode facing the first electrode;
a first p-type doping layer between the first and second electrodes;
a second p-type doping layer between the first p-type doping layer and the second electrode;
a third p-type doping layer between the second p-type doping layer and the second electrode;
a first emitting material layer between the first and second p-type doping layers;
a second emitting material layer between the second and third p-type doping layers; and
a third emitting material layer between the third p-type doping layer and the second electrode,
wherein an electrical conductivity of the third p-type doping layer is greater than an electrical conductivity of the first p-type doping layer and is equal to or smaller than an electrical conductivity of the second p-type doping layer, and
wherein each of the first and third emitting material layers has an emission wavelength range of 440 to 480 nm, and the second emitting material layer has an emission wavelength range of 500 to 550 nm.

2. The organic light emitting diode according to claim 1, wherein the electrical conductivity of the third p-type doping layer is smaller than the electrical conductivity of the second p-type doping layer.

3. The organic light emitting diode according to claim 1, wherein the electrical conductivity of the first p-type doping layer has a range of $1*10^{-5} \sim 1*10^{-4}$ S/cm, the electrical conductivity of the second p-type doping layer has a range of $1*10^{-4} \sim 1*10^{-3}$ S/cm, and the electrical conductivity of the third p-type doping layer has a range of $3*10^{-5} \sim 6*10^{-4}$ S/cm.

4. The organic light emitting diode according to claim 1, wherein each of the first p-type doping layer, the second p-type doping layer and the third p-type doping layer includes a p-type dopant and a host,
wherein the p-type dopant is a first compound in Formula 1-1:

[Formula 1-1]

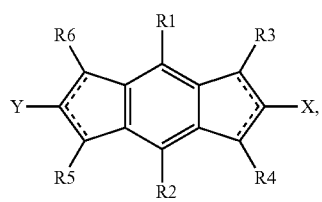

wherein each of R1 and R2 is independently selected from the group consisting of hydrogen (H), deuterium (D), halogen and cyano, wherein each of R3 to R6 is independently selected from the group consisting of halogen, cyano, malononitrile, C1 to C10 haloalkyl group and C1 to C10 haloalkoxy group, and at least one of R3 and R4 and at least one of R5 and R6 are malononitrile, wherein each of X and Y is independently phenyl substituted with at least one of C1 to C10 alkyl group, halogen, cyano, malononitrile, C1 to C10 haloalkyl group and C1 to C10 haloalkoxy group, wherein the host is a second compound in Formula 2-1:

[Formula 2-1]

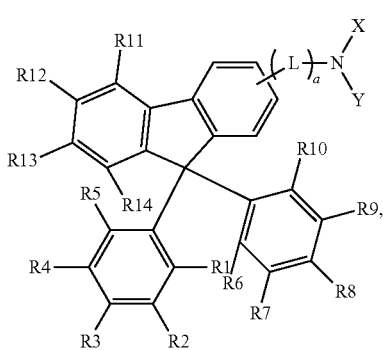

wherein each of X and Y is independently selected from the group consisting of C6 to C30 aryl group and C5 to C30 heteroaryl group, and L is selected from the group consisting of C6 to C30 arylene group and C5 to C30 heteroarylene group, wherein a is 0 or 1, and wherein each of R1 to R14 is independently selected from the group consisting of H, D, C1 to C10 alkyl group, C6 to C30 aryl group and C5 to C30 heteroaryl group, or adjacent two of R1 to R14 are connected to each other to form a fused ring.

5. The organic light emitting diode according to claim 4, wherein the first organic compound is represented by one of Formulas 1-2 to 1-4:

[Formula 1-2]

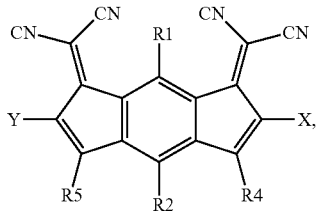

[Formula 1-3]

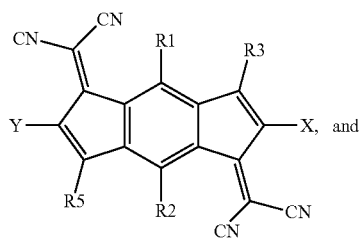

[Formula 1-4]

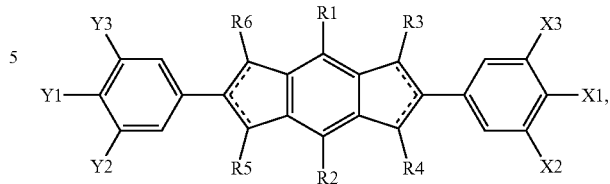

wherein in the Formula 1-4, each of X1 to X3 and each of Y1 to Y3 are independently selected from the group consisting of H, C1 to C10 alkyl group, halogen, cyano, malononitrile, C1 to C10 haloalkyl group and C1 to C10 haloalkoxy group and satisfy at least one of i) X1 and Y1 are different and ii) X2 is different from Y2 and Y3 or X3 is different from Y2 and Y3.

6. The organic light emitting diode according to claim 4, wherein the second organic compound is represented by Formula 2-2 or 2-3:

[Formula 2-2]

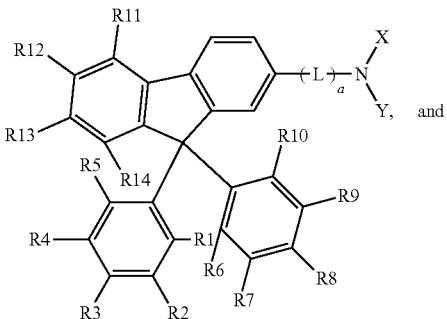

and

[Formula 2-3]

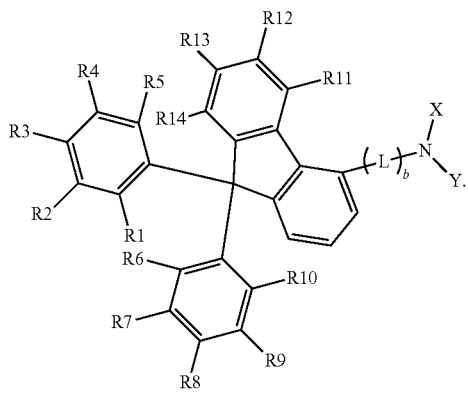

7. The organic light emitting diode according to claim 6, wherein the host in each of the first and third p-type doping layer is represented by the Formula 2-3, and the host in the second p-type doping layer is represented by the Formula 2-2.

8. The organic light emitting diode according to claim 4, wherein the first organic compound is one of compounds in Formula 3:

[Formula 3]
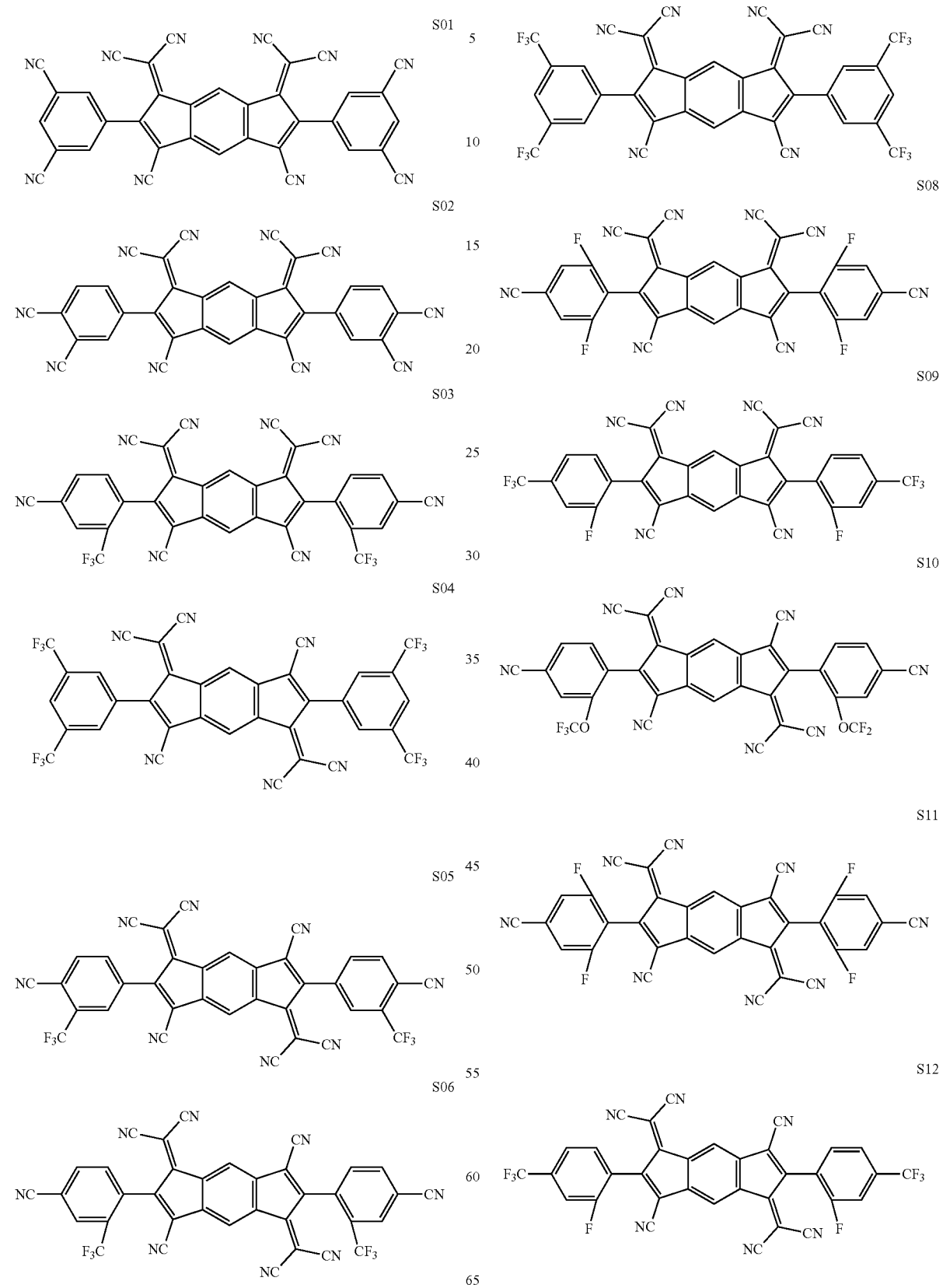

-continued
S13
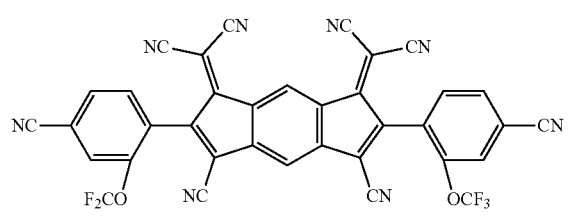
S14
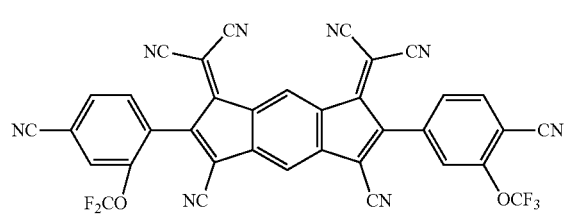
S15
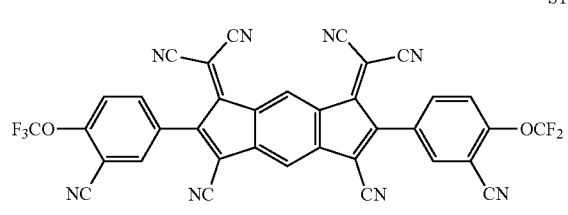
S16
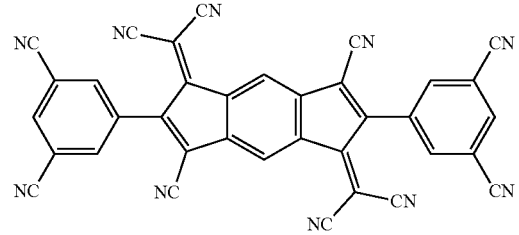
S17
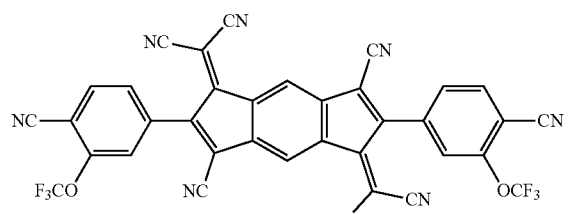
S18
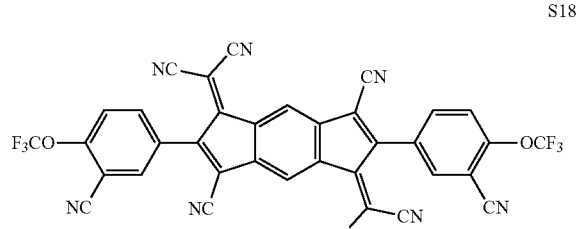
S19
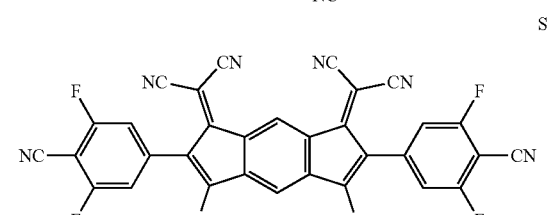
-continued
S20
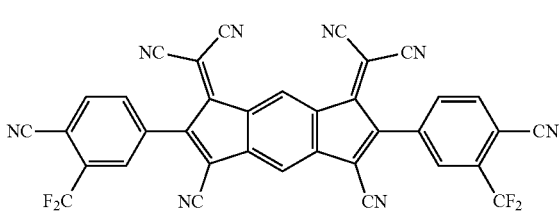
S21
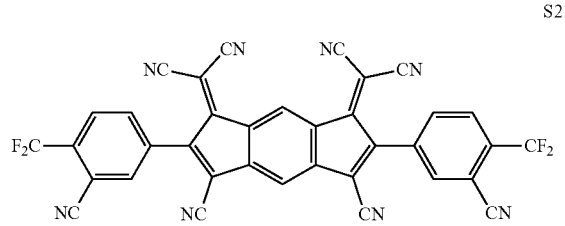
S22
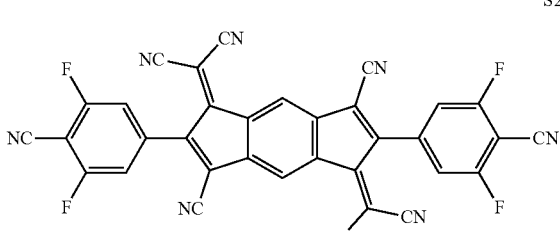
S23
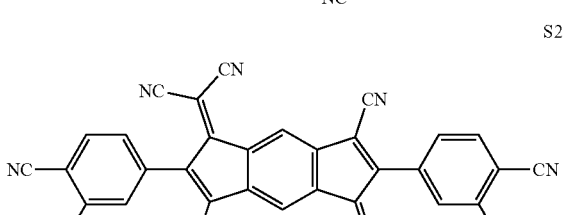
S24
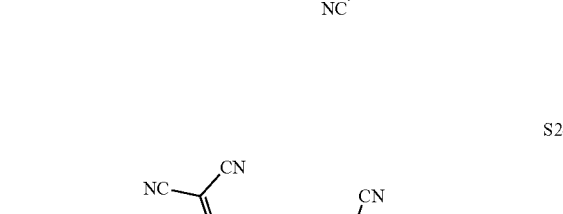
S25
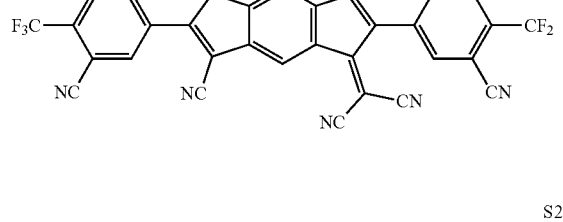
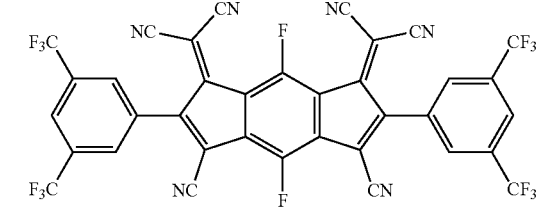

S26
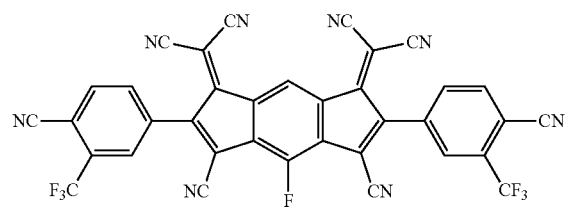
S27
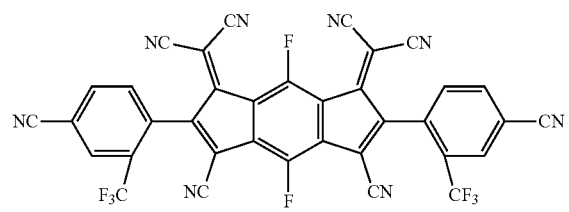
S28
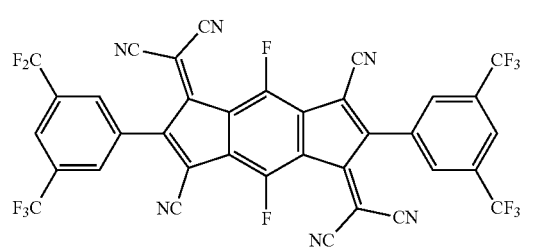
S29
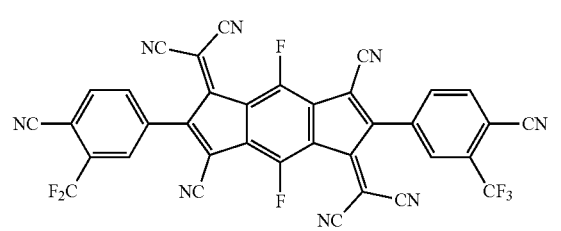
S30
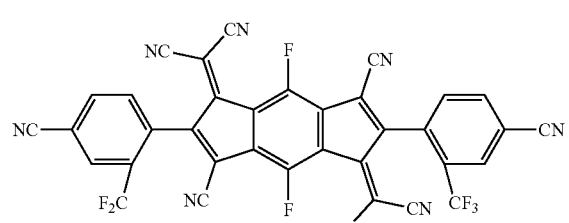
S31
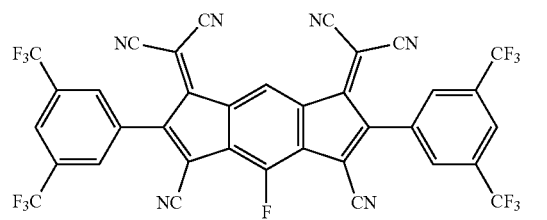
S32
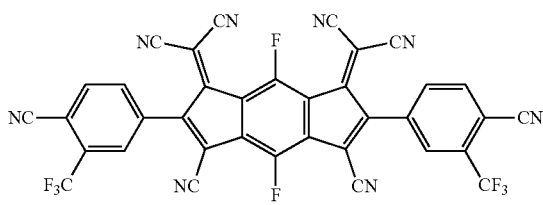
S33
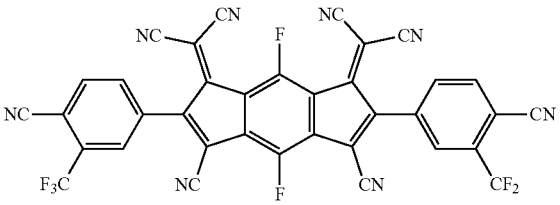
S34
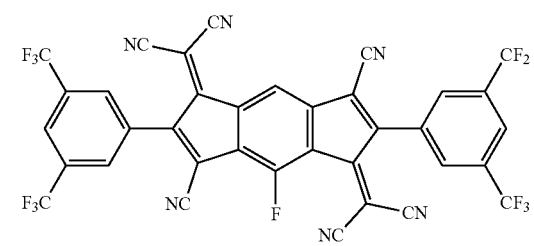
S35
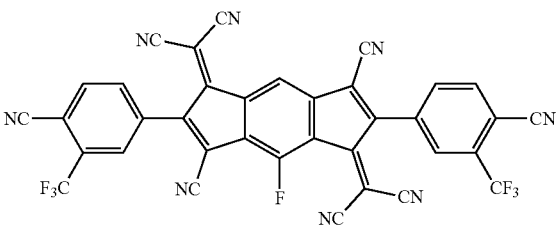
S36
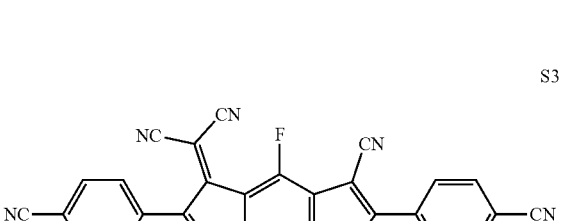
S38
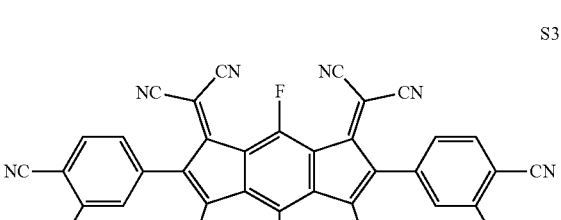

S39
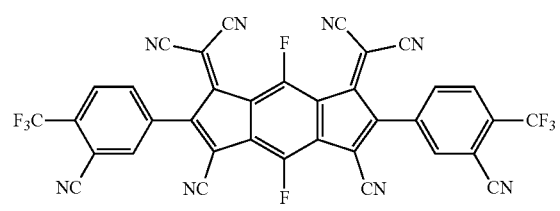
S40
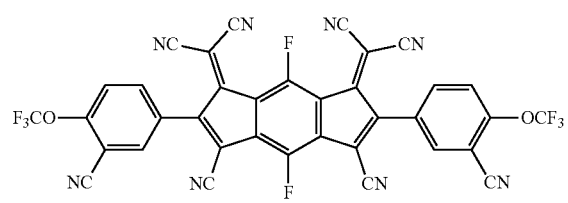
S41
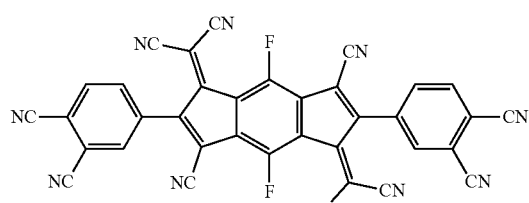
S42
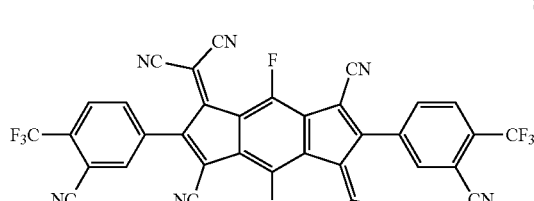
S43
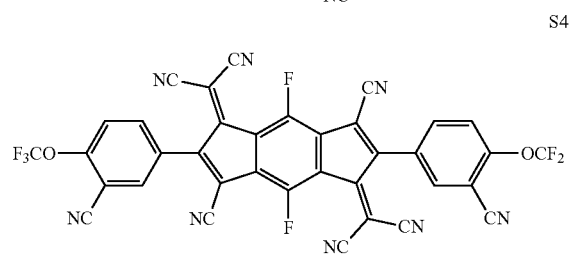
S44
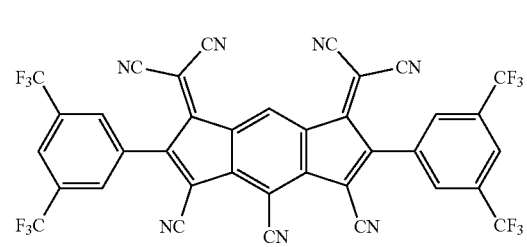
S45
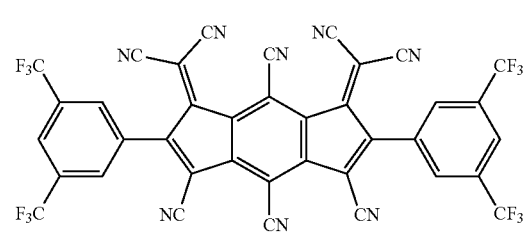
S46
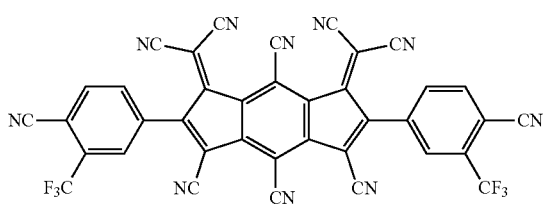
S47
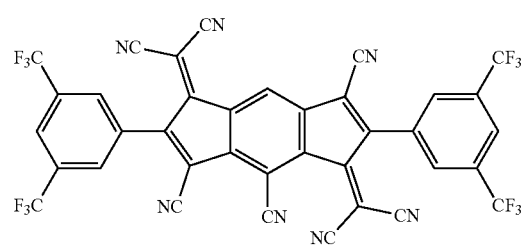
S48
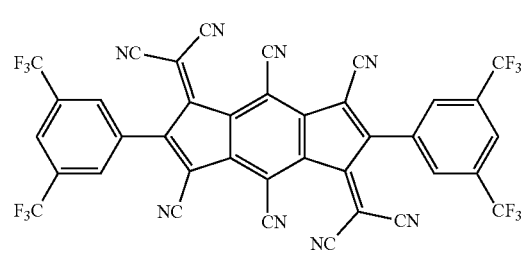
S49
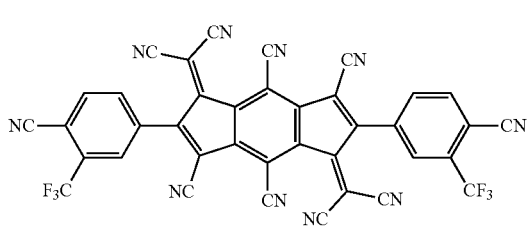
A01
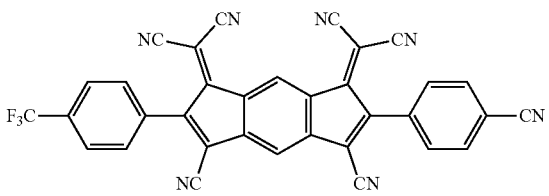
A02
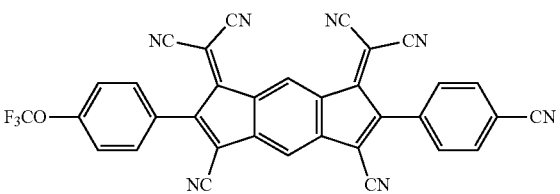
A03
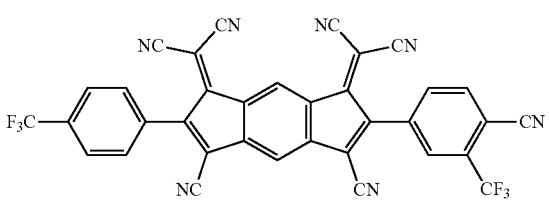

-continued
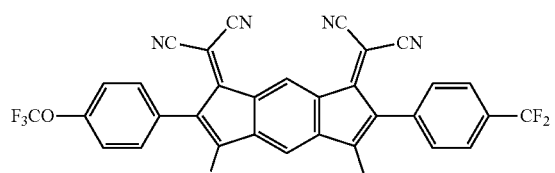
A04
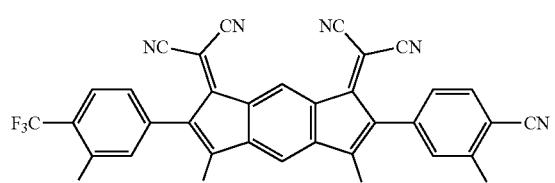
A05
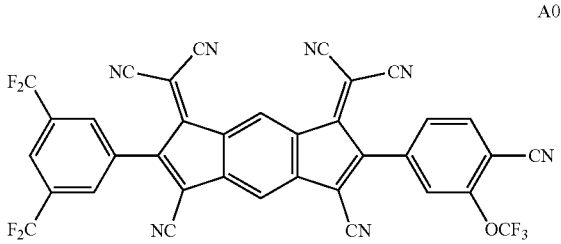
A06
A07
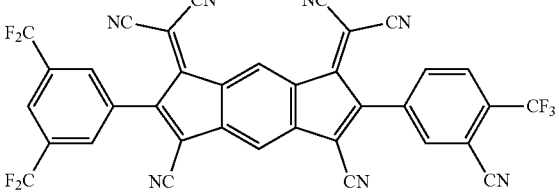
A08
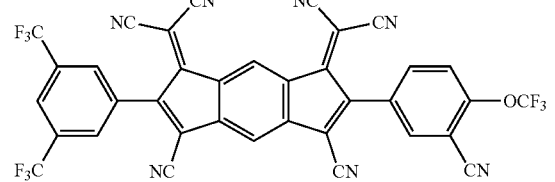
A09
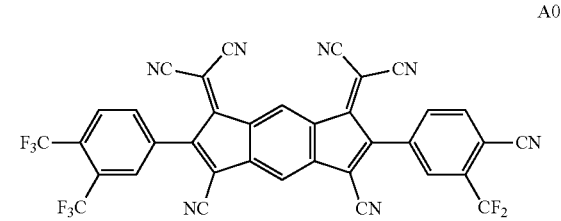
A10
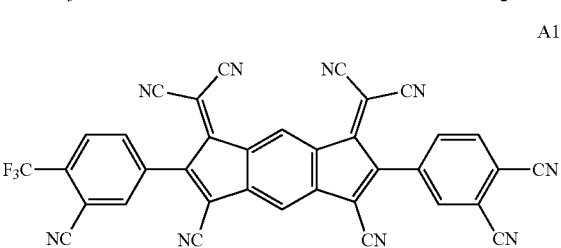
-continued
A11
A12
A13
A14
A15
A16
A17

A18
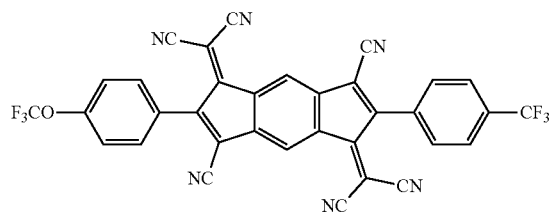
A19
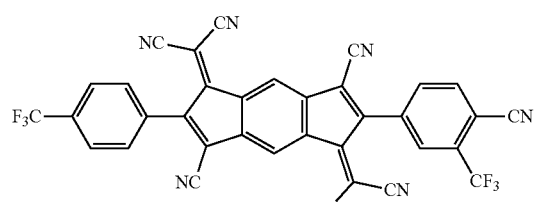
A20
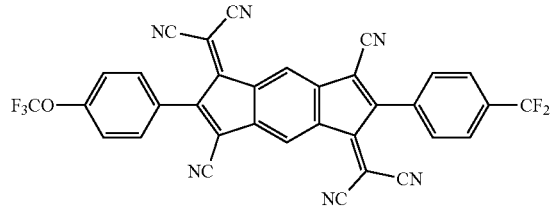
A21
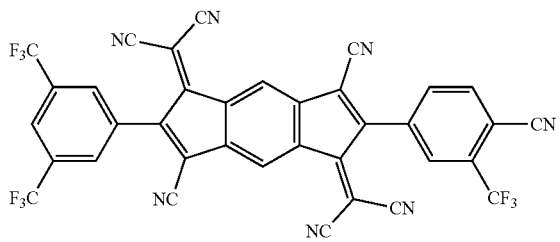
A22
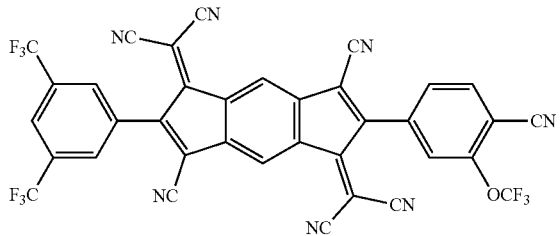
A23
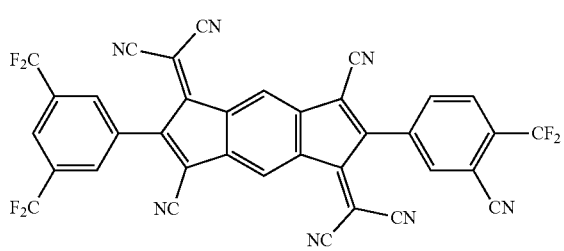
A24
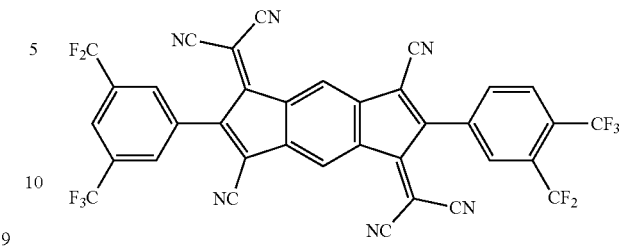
A25
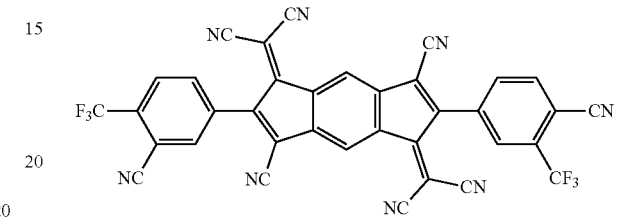
A26
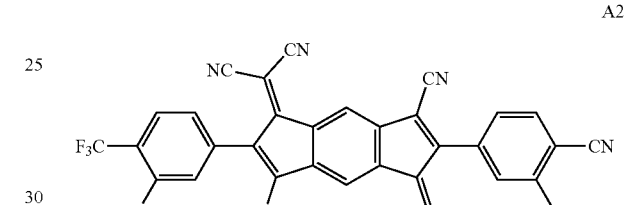
A27
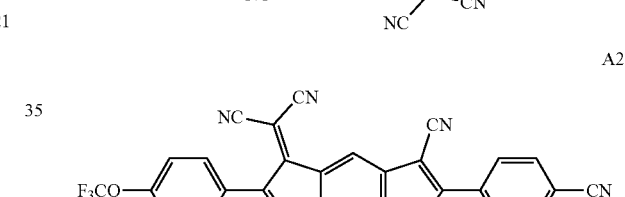
A28
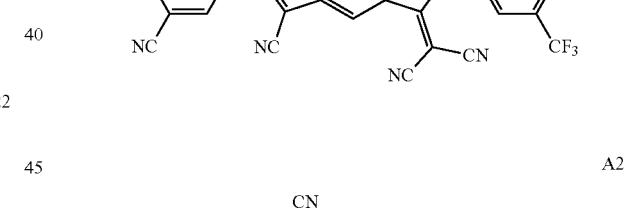
A29
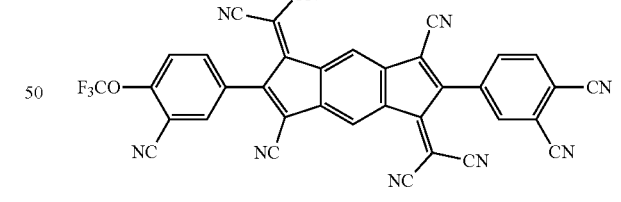

A30
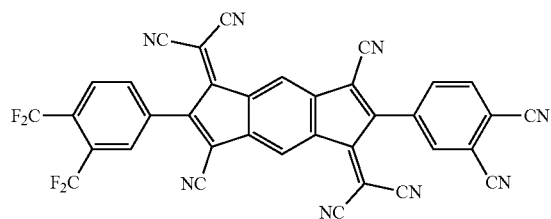
A31
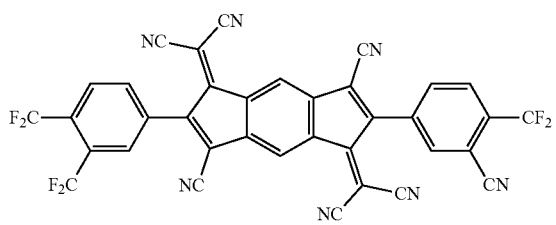
A32
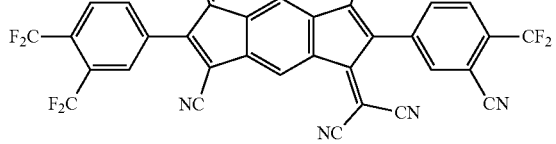
A33
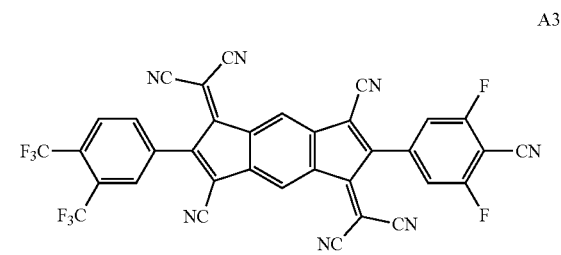
A34
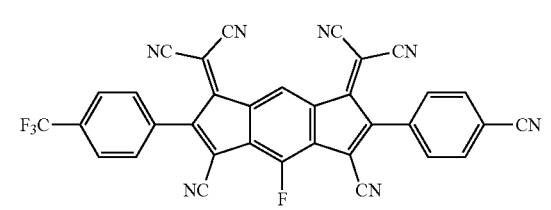
A35
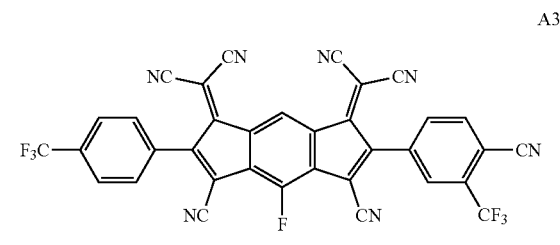
A36
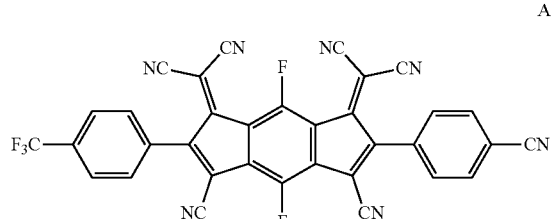
A37
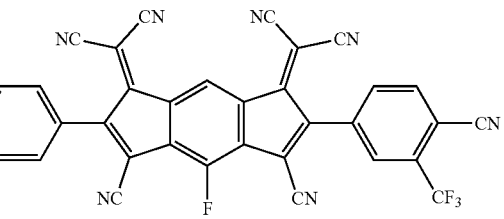
A38
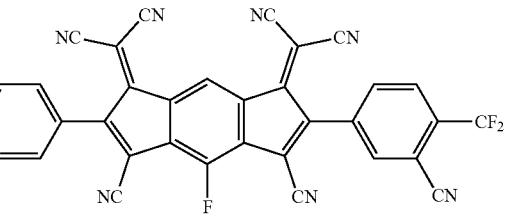
A39
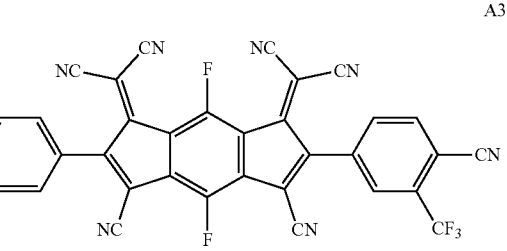
A40
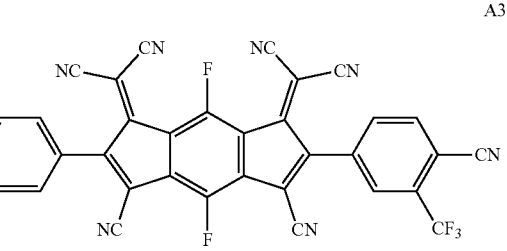
A41
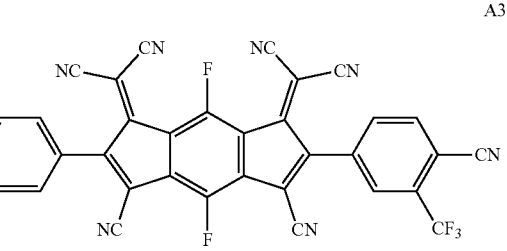
A42
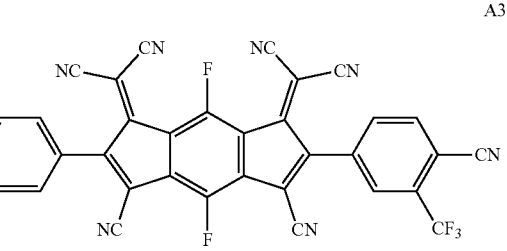
A43
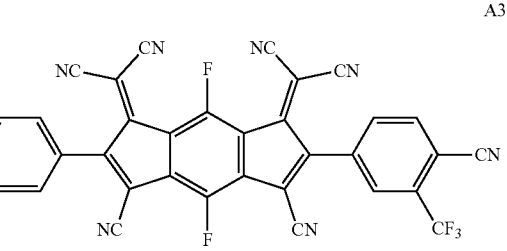

A44
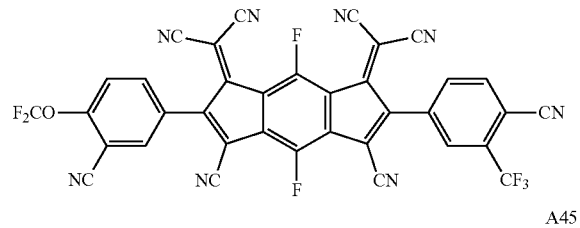
A45
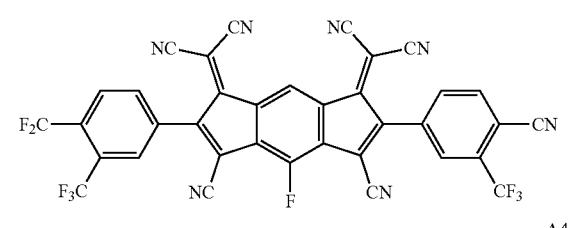
A46
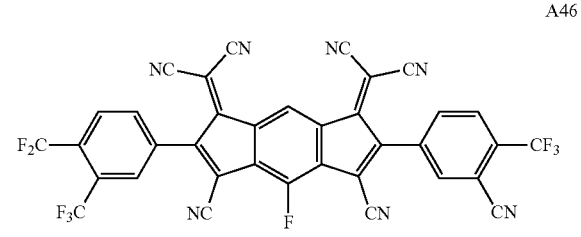
A47
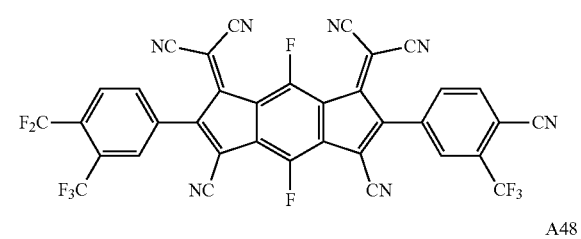
A48
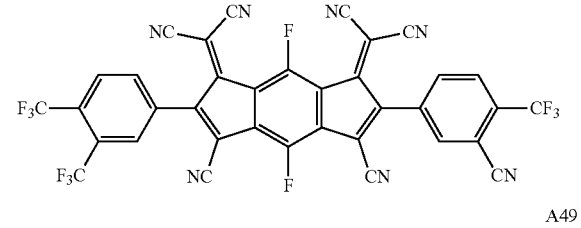
A49
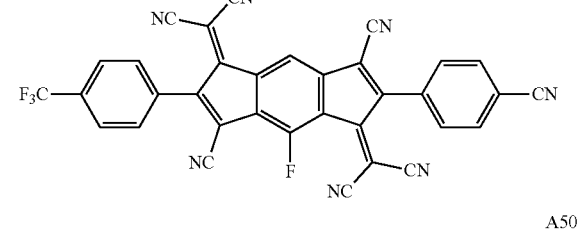
A50
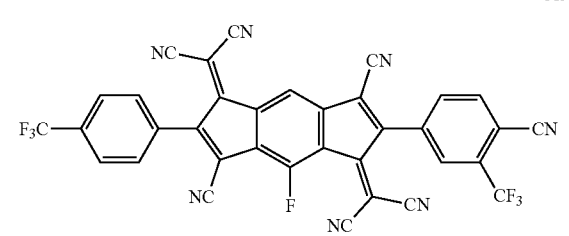
A51
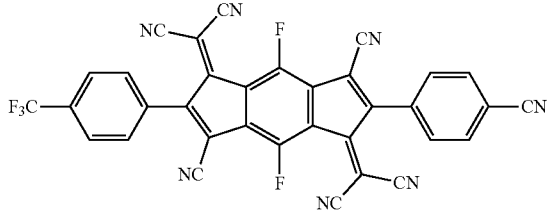
A52
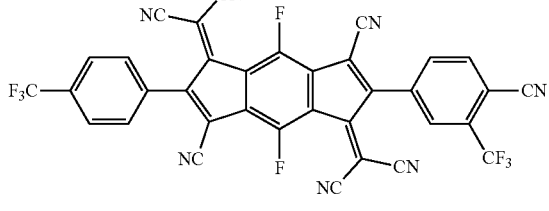
A53
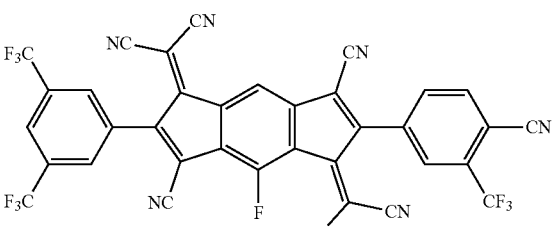
A54
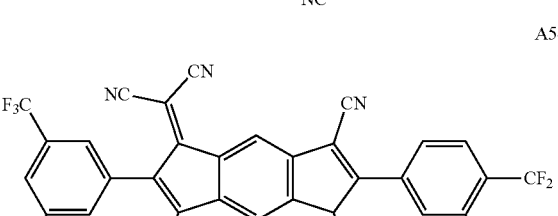
A55
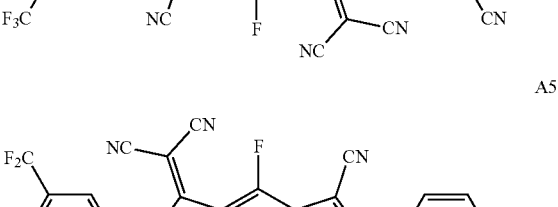
A56
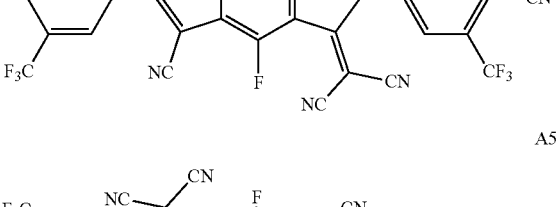
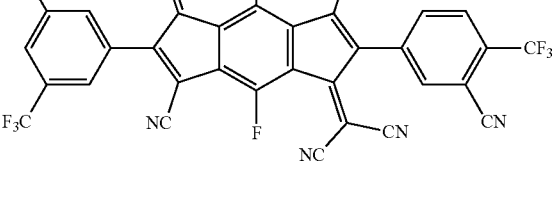

-continued
A57
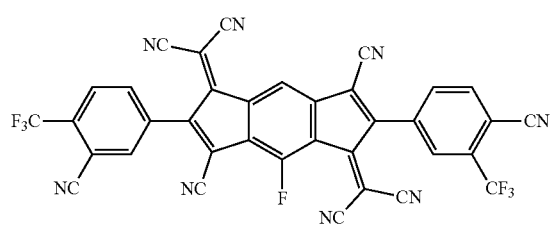
A58
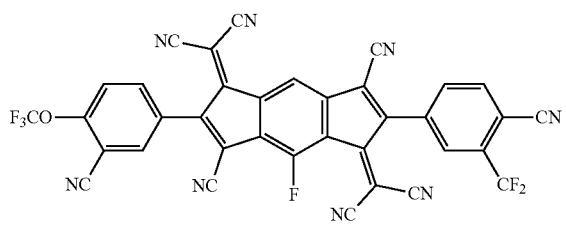
A59
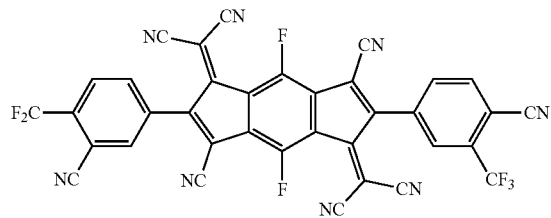
A60
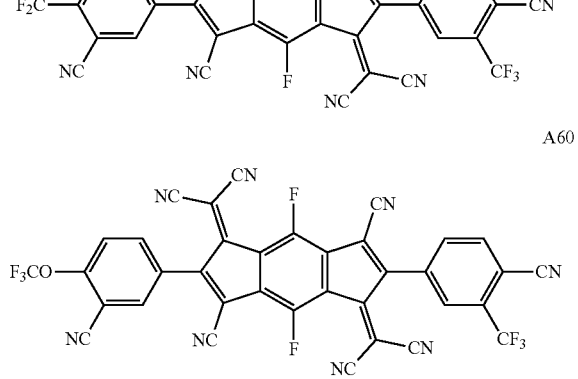
A61
A62
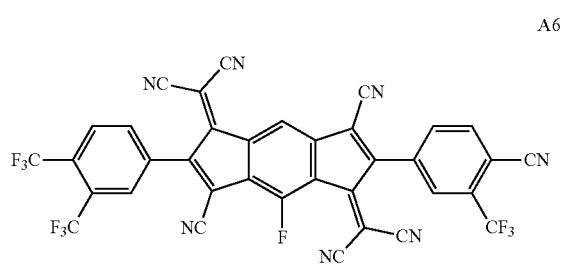
-continued
A63
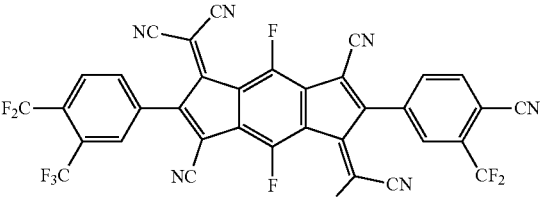
A64
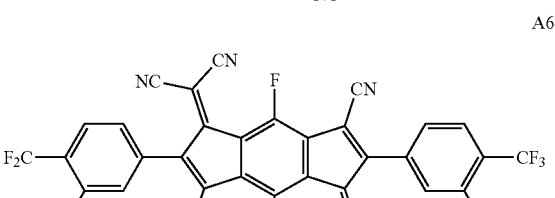
A65
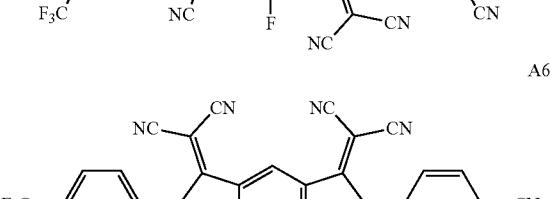
A66
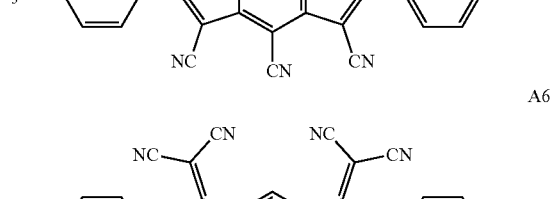
A67
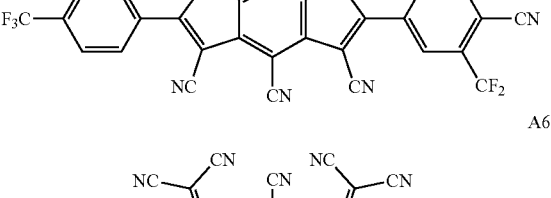
A68
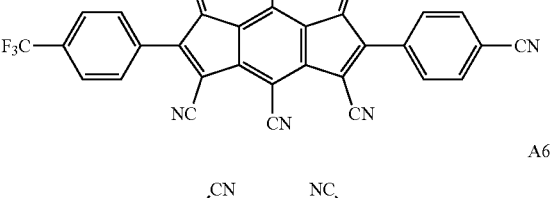
A69
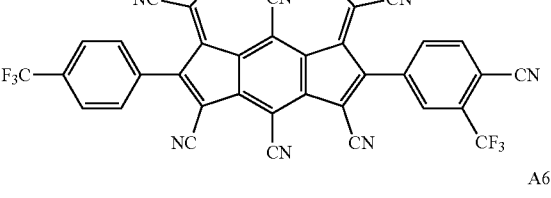

-continued
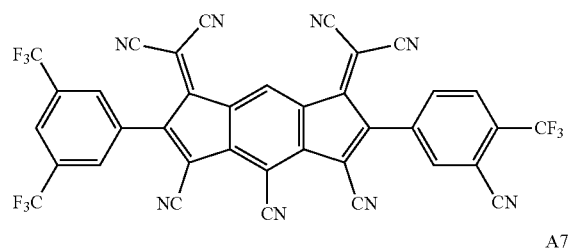
A70
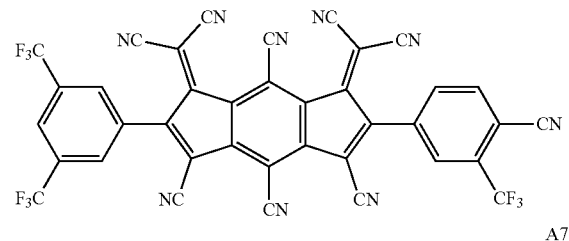
A71
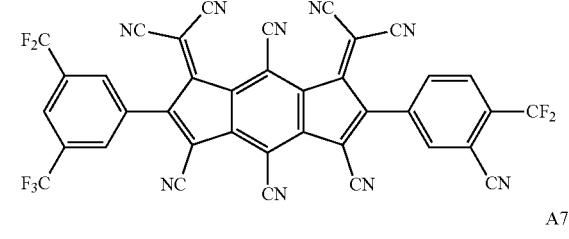
A72
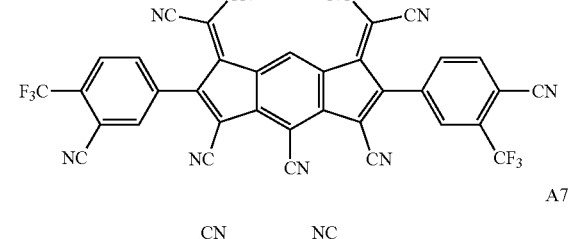
A73
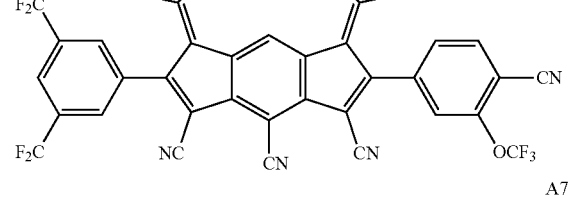
A74
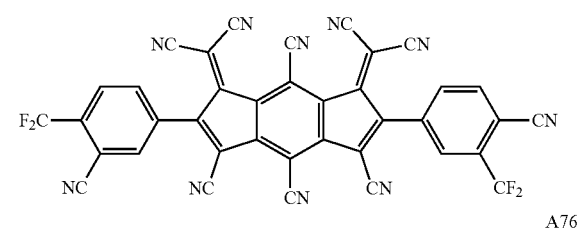
A75
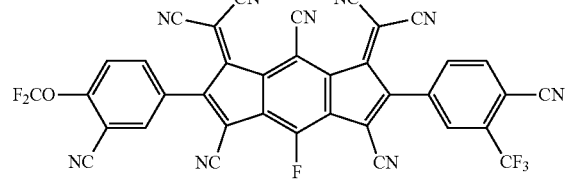
A76
-continued
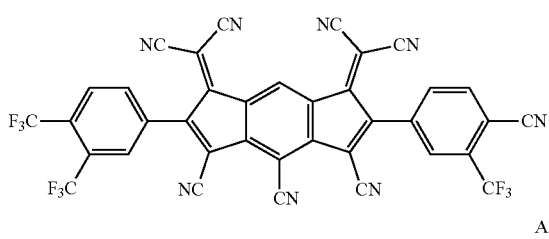
A77
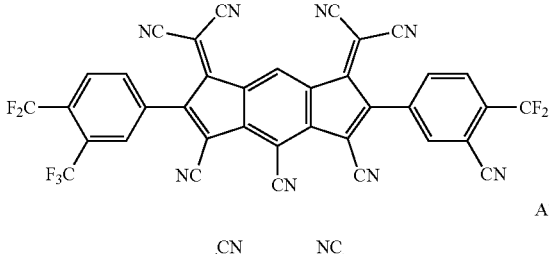
A78
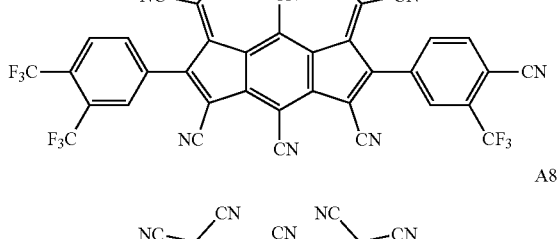
A79
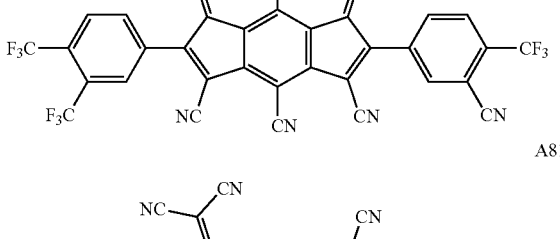
A80
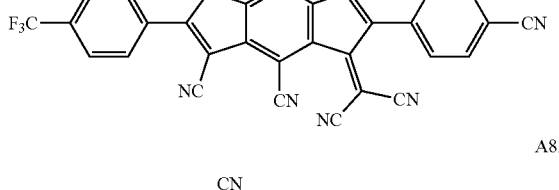
A81
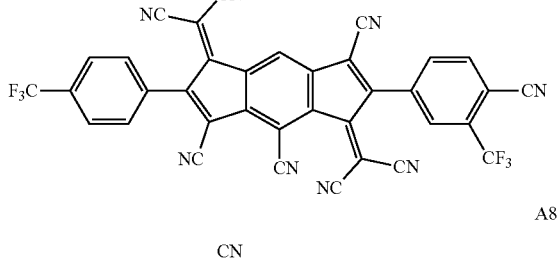
A82
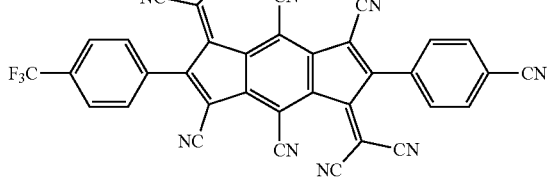
A83

91
-continued
A84
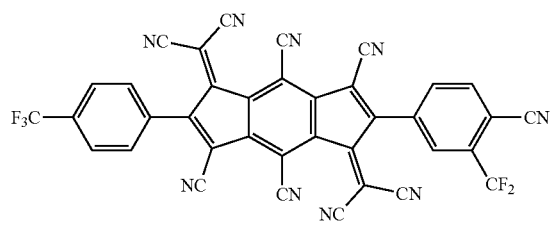
A85
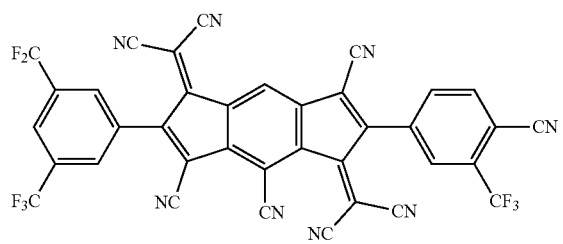
A86
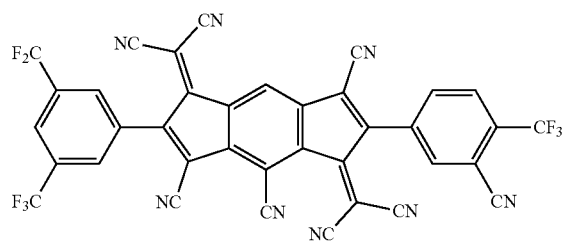
A87
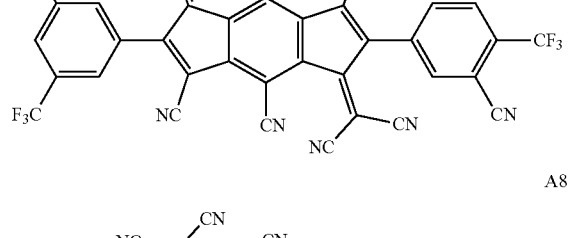
A88
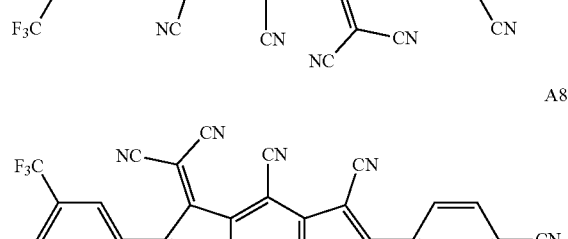
A89
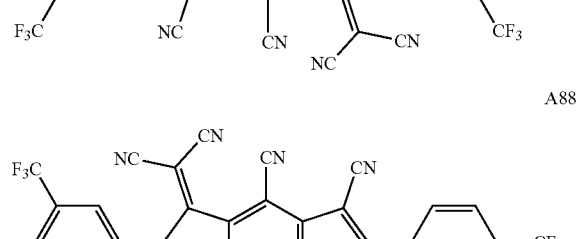
92
-continued
A90
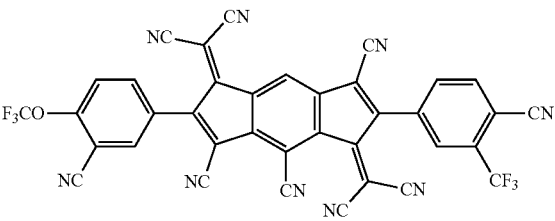
A91
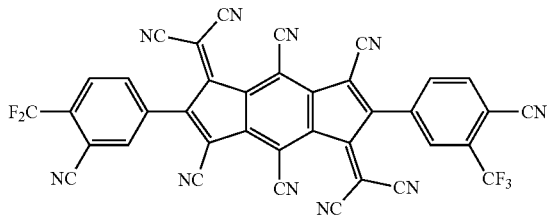
A92
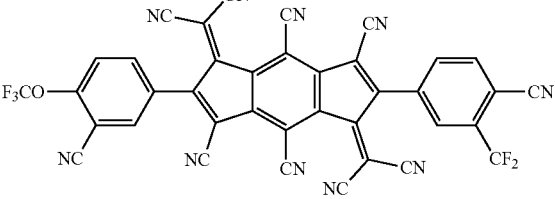
A93
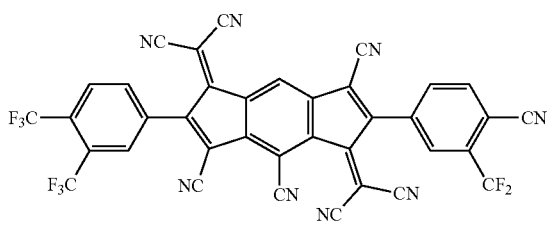
A94
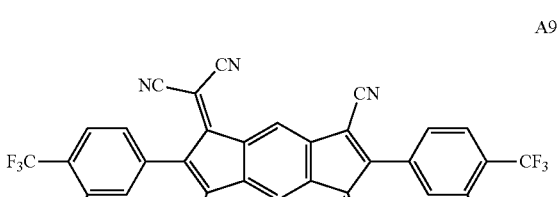
A95
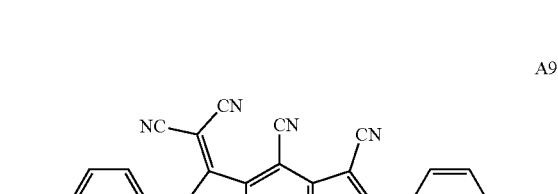

A96
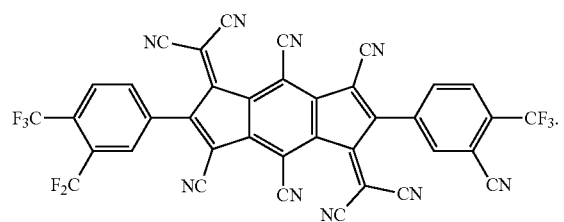
9. The organic light emitting diode according to claim 4, wherein the second organic compounds is one of compounds in Formula 4:
[Formula 4]
C1
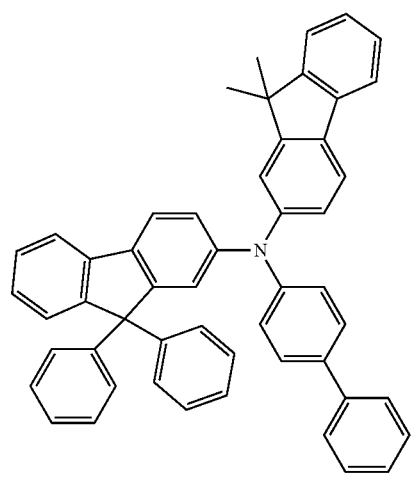
C2
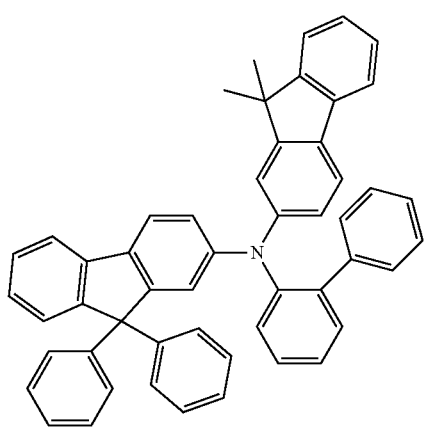
C3
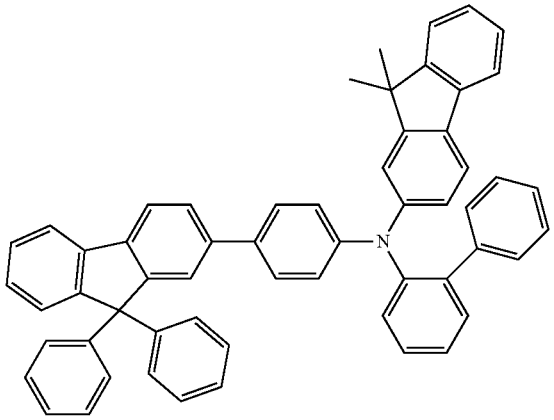
C4
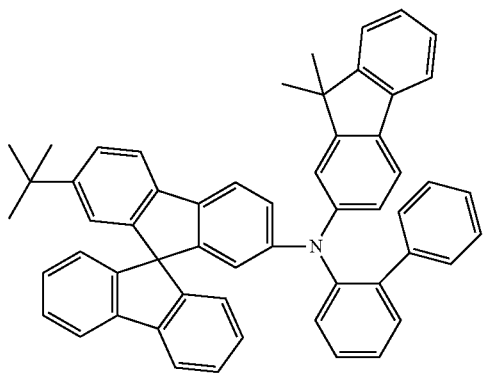
C5
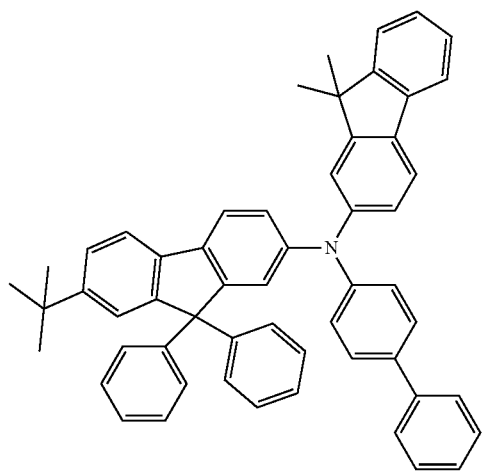

C6
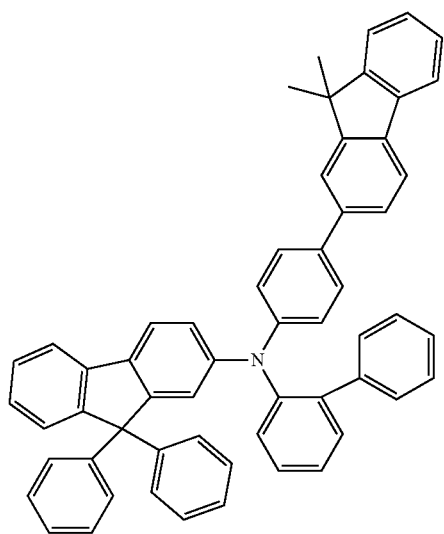
C7
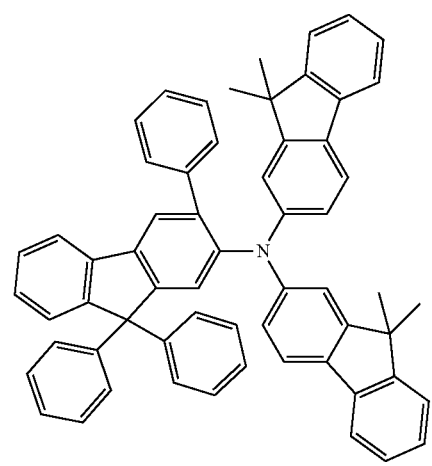
C8
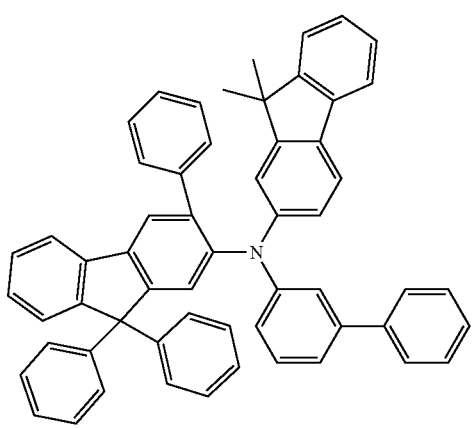
C9
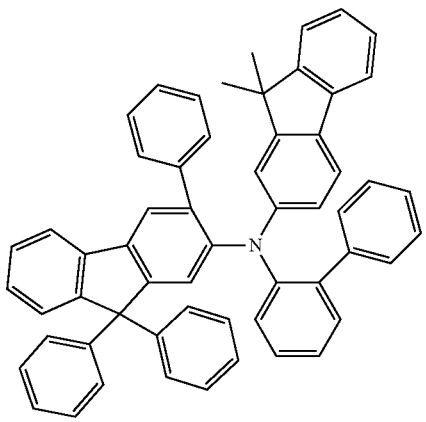
C10
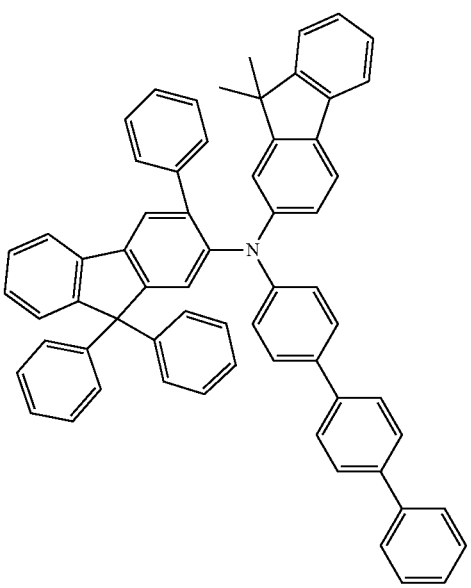
C11
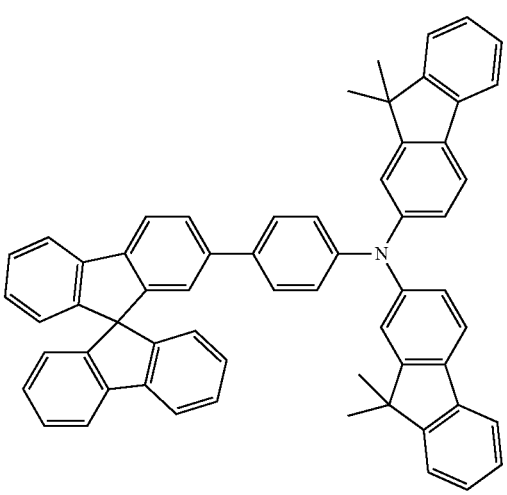

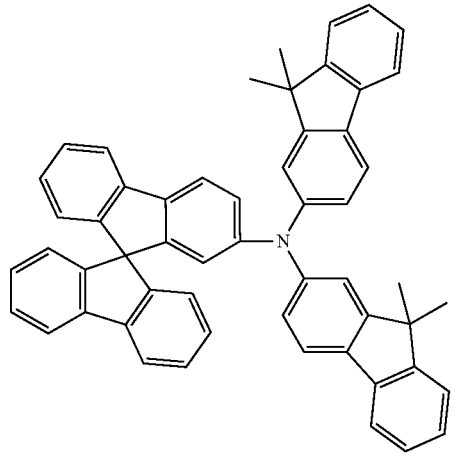
C12
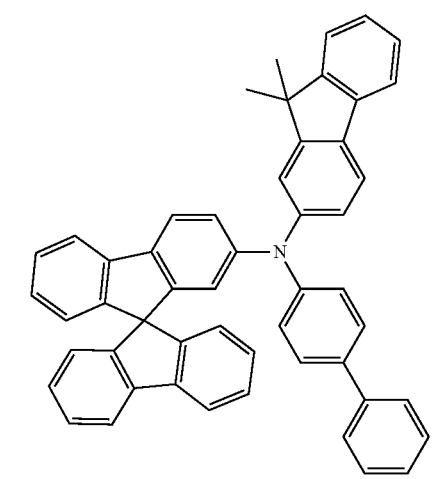
C13
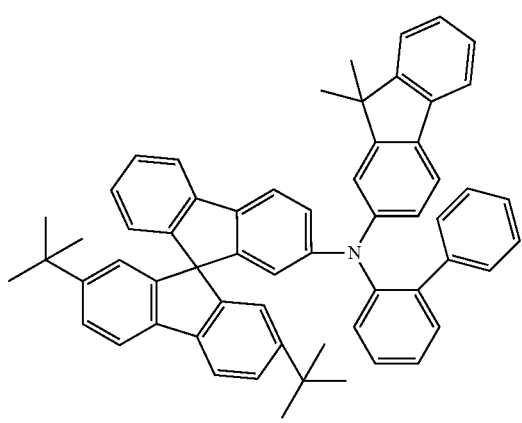
C14
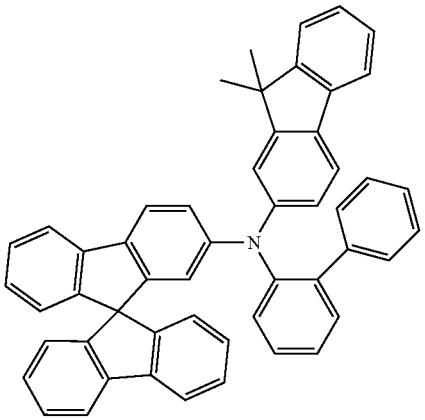
C15
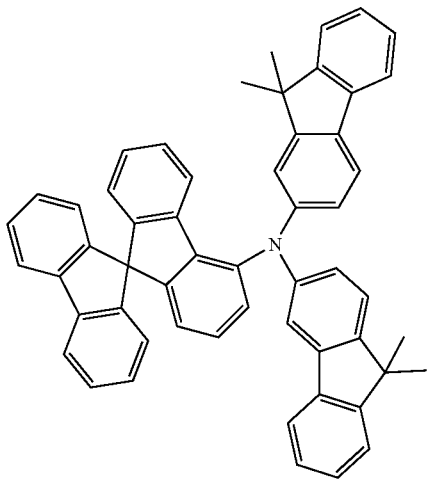
D1
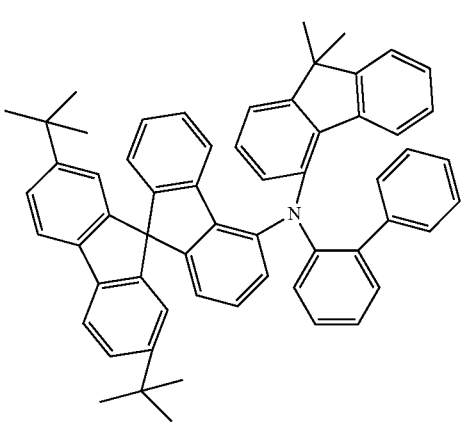
D2
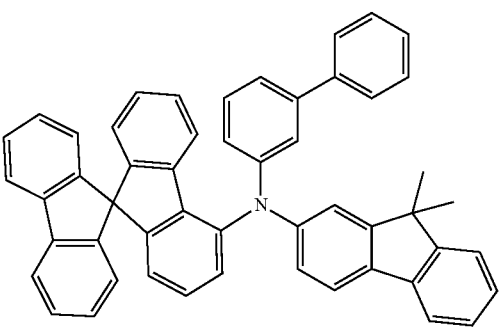
D3

D4
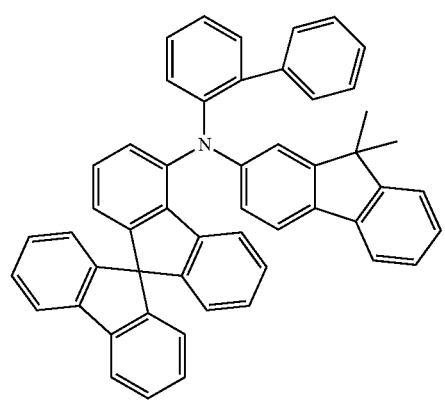
D5
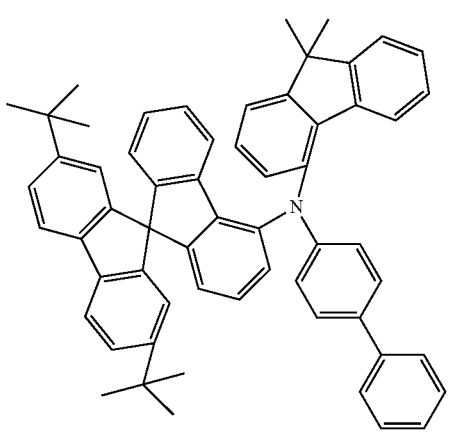
D6
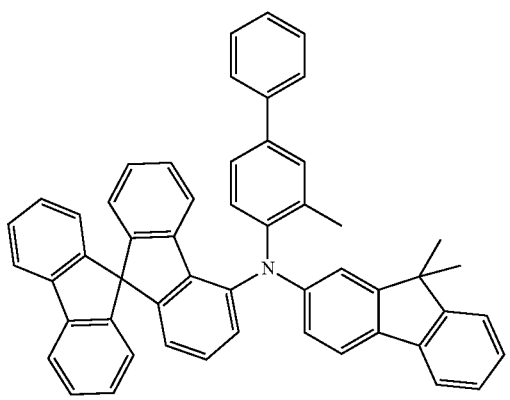
D7
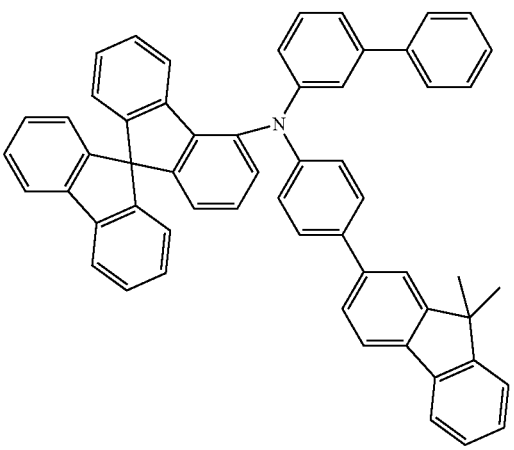
D8
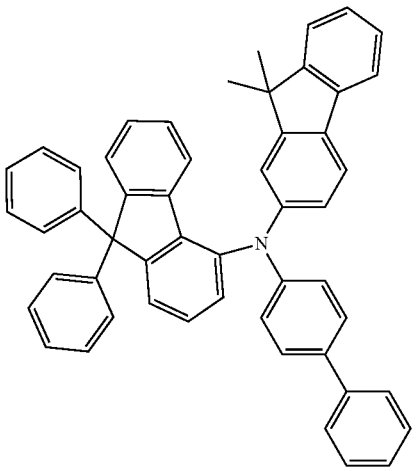
D9
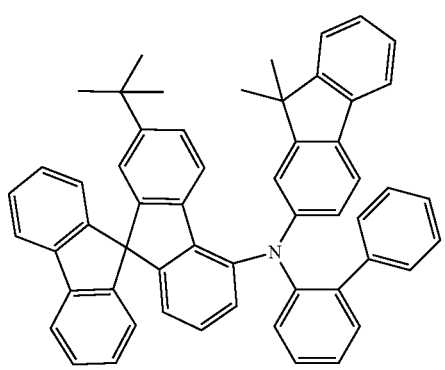
D10
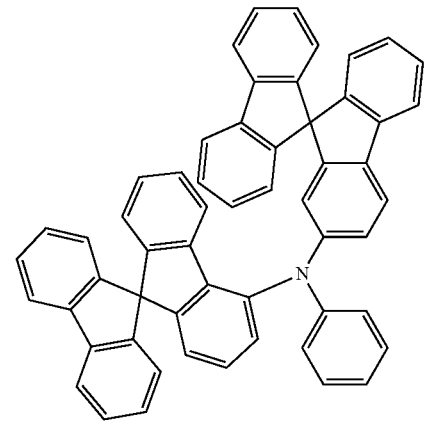
D11
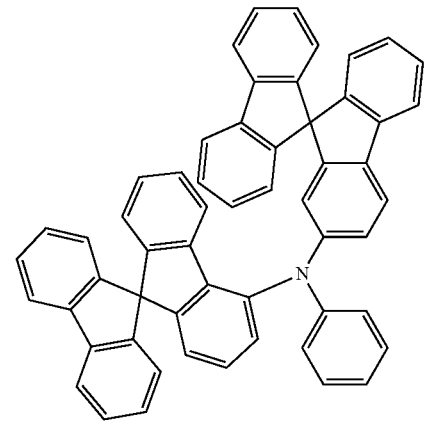

10. The organic light emitting diode according to claim 1, wherein the first p-type doping layer is a hole injection layer contacting the first electrode.

11. The organic light emitting diode according to claim 1, wherein each of the second and third p-type doping layers is a p-type charge generation layer.

12. An organic light emitting device, comprising:
a substrate;
an organic light emitting diode positioned on the substrate and including a first electrode; a second electrode facing the first electrode; a first p-type doping layer between the first and second electrodes; a second p-type doping layer between the first p-type doping layer and the second electrode; a third p-type doping layer between the second p-type doping layer and the second electrode; a first emitting material layer between the first and second p-type doping layers; a second emitting material layer between the second and third p-type doping layers; and a third emitting material layer between the third p-type doping layer and the second electrode; and
an encapsulation film covering the organic light emitting diode,
wherein an electrical conductivity of the third p-type doping layer is greater than an electrical conductivity of the first p-type doping layer and is equal to or smaller than an electrical conductivity of the second p-type doping layer, and
wherein the electrical conductivity of the first p-type doping layer has a range of $1*10^{-5}-1*10^{-4}$ S/cm, the electrical conductivity of the second p-type doping layer has a range of $1*10^{-4}-1*10^{-3}$ S/cm, and the electrical conductivity of the third p-type doping layer has a range of $3*10^{-5}-6*10^{-4}$ S/cm.

13. The organic light emitting device according to claim 12, wherein a red pixel, a green pixel and a blue pixel are defined on the substrate, and the organic light emitting diode corresponds to each of the red, green and blue pixels, and
wherein the organic light emitting device further includes:
a color filter layer disposed between the substrate and the organic light emitting diode or on the organic light emitting diode and corresponding to the red, green and blue pixels.

14. The organic light emitting device according to claim 12, wherein each of the first p-type doping layer, the second p-type doping layer and the third p-type doping layer includes a p-type dopant and a host,
wherein the p-type dopant is a first compound in Formula 1-1:

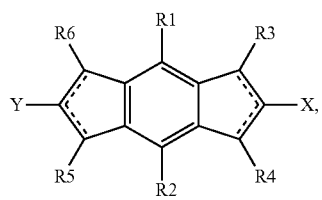

[Formula 1-1]

wherein each of R1 and R2 is independently selected from the group consisting of hydrogen (H), deuterium (D), halogen and cyano,
wherein each of R3 to R6 is independently selected from the group consisting of halogen, cyano, malononitrile, C1 to C10 haloalkyl group and C1 to C10 haloalkoxy group, and at least one of R3 and R4 and at least one of R5 and R6 are malononitrile,
wherein each of X and Y is independently phenyl substituted with at least one of C1 to C10 alkyl group, halogen, cyano, malononitrile, C1 to C10 haloalkyl group and C1 to C10 haloalkoxy group,
wherein the host is a second compound in Formula 2-1:

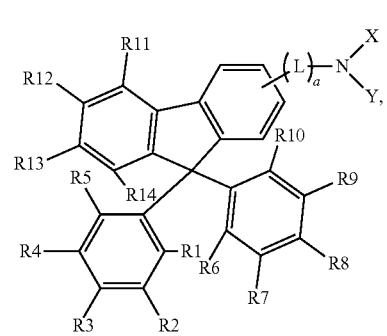

[Formula 2-1]

wherein each of X and Y is independently selected from the group consisting of C6 to C30 aryl group and C5 to C30 heteroaryl group, and L is selected from the group consisting of C6 to C30 arylene group and C5 to C30 heteroarylene group,
wherein a is 0 or 1, and
wherein each of R1 to R14 is independently selected from the group consisting of H, D, C1 to C10 alkyl group, C6 to C30 aryl group and C5 to C30 heteroaryl group, or adjacent two of R1 to R14 are connected to each other to form a fused ring.

15. The organic light emitting device according to claim 14, wherein the first organic compound is represented by one of Formulas 1-2 to 1-4:

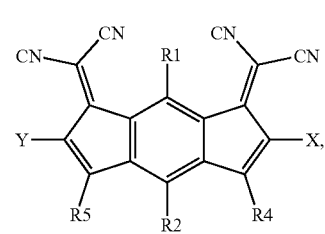

[Formula 1-2]

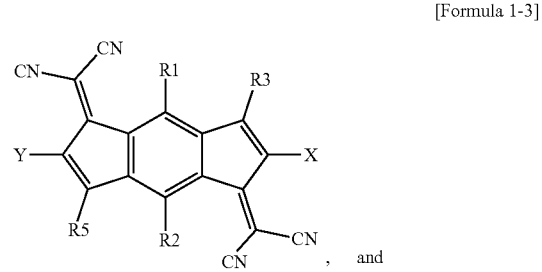

[Formula 1-3]

, and

[Formula 1-4]

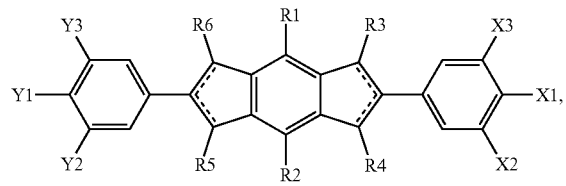

wherein in the Formula 1-4, each of X1 to X3 and each of Y1 to Y3 are independently selected from the group consisting of H, C1 to C10 alkyl group, halogen, cyano, malononitrile, C1 to C10 haloalkyl group and C1 to C10 haloalkoxy group and satisfy at least one of i) X1 and Y1 are different and ii) X2 is different from Y2 and Y3 or X3 is different from Y2 and Y3.

16. The organic light emitting device according to claim 14, wherein the second organic compound is represented by Formula 2-2 or 2-3:

[Formula 2-2]

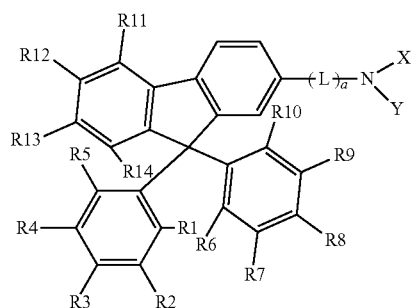

, and

[Formula 2-3]

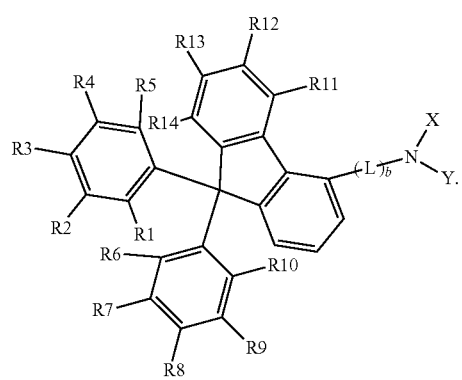

17. The organic light emitting device according to claim 14, wherein the first organic compound is one of compounds in Formula 3:

[Formula 3]

S01

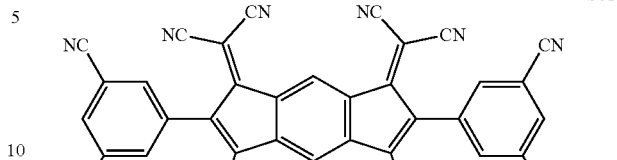

S02

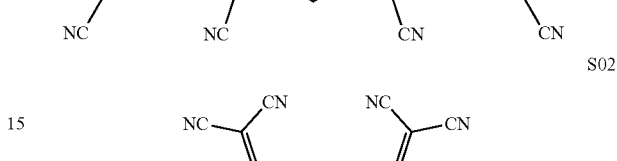

S03

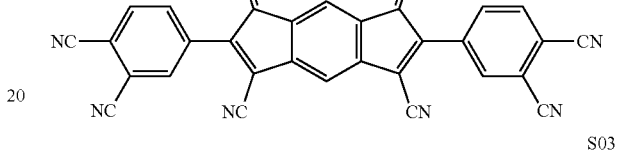

S04

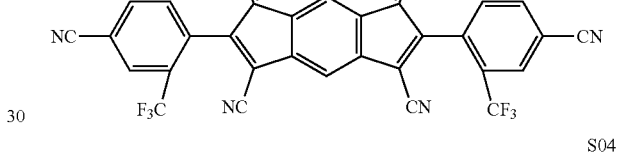

S05

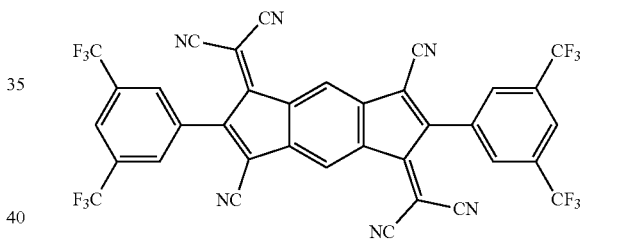

S06

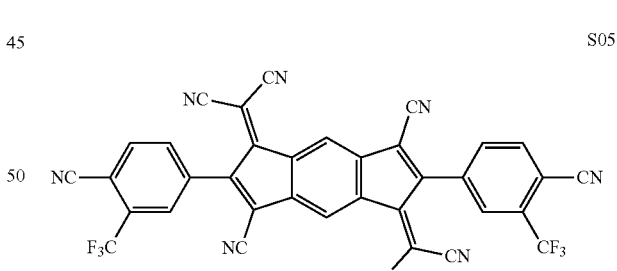

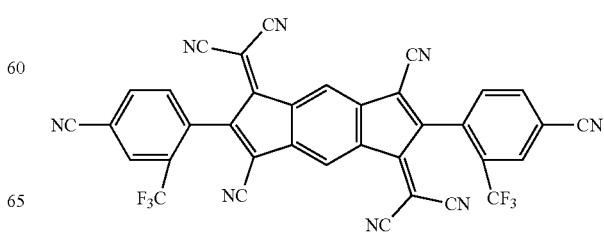

S07
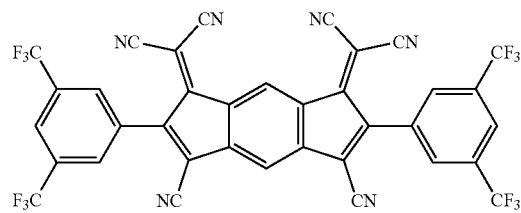
S08
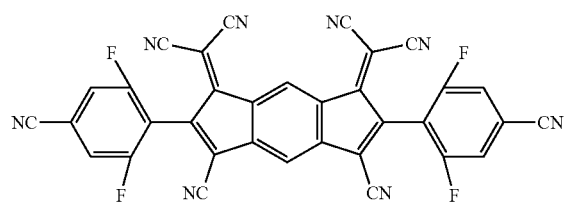
S09
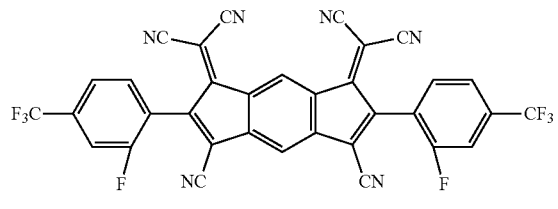
S10
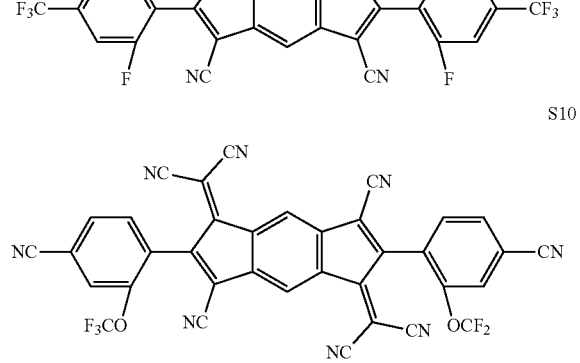
S11
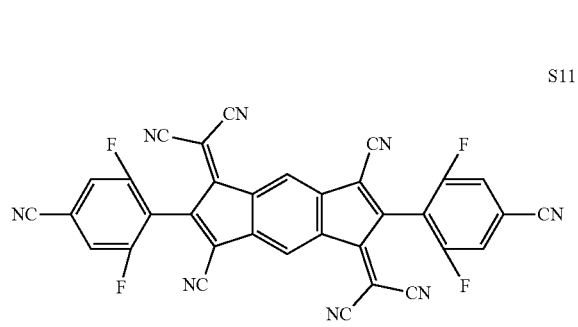
S12
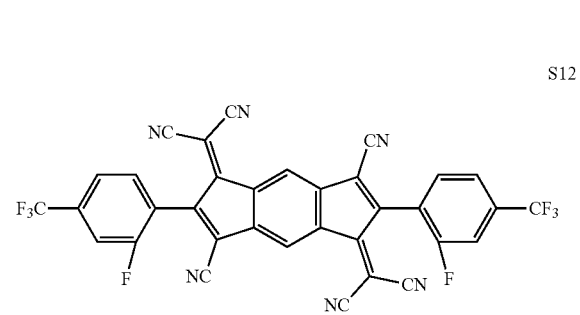
S13
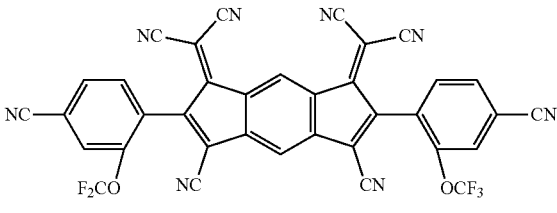
S14
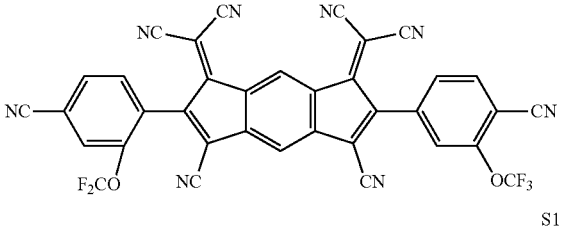
S15
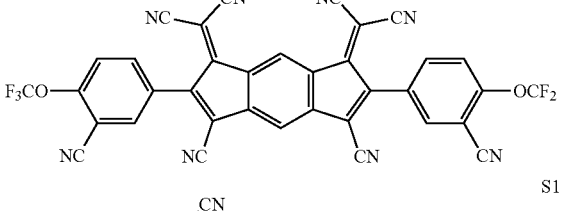
S16
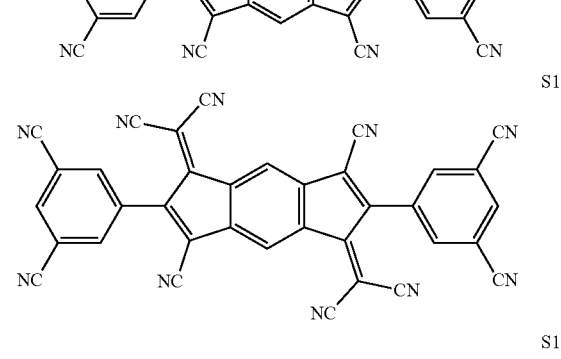
S17
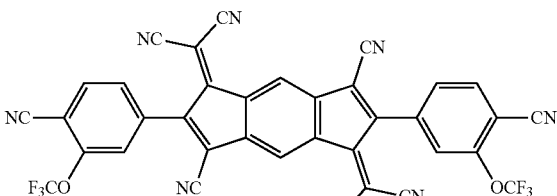
S18
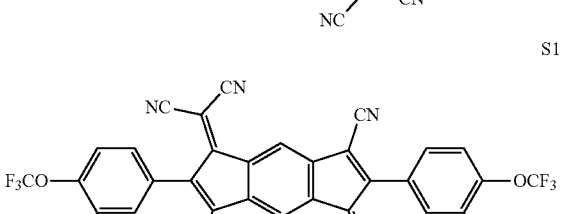
S19
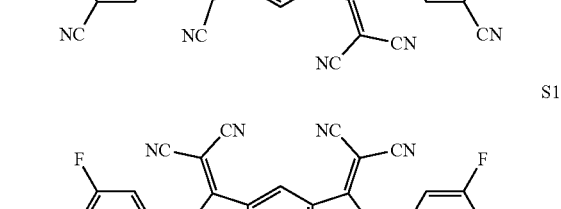

S20
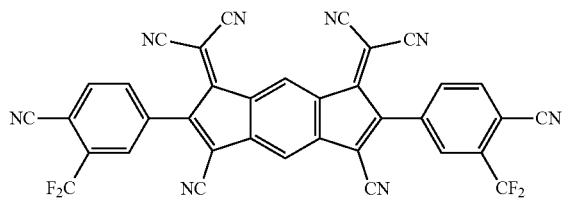
S21
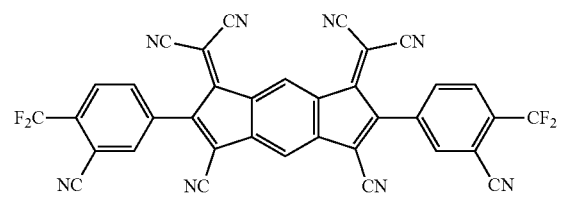
S22
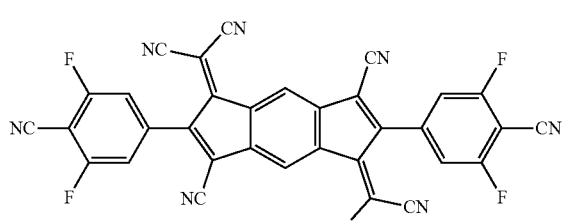
S23
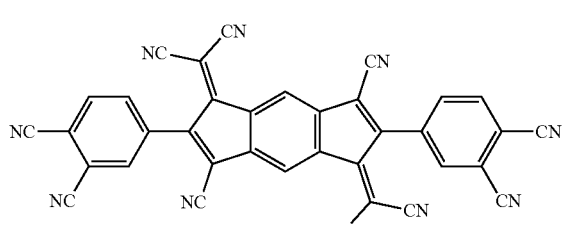
S24
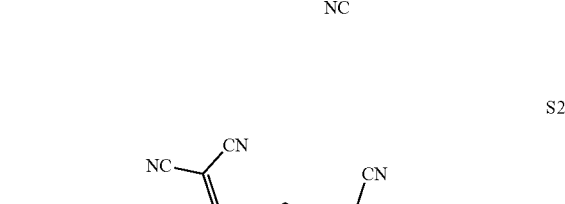
S25
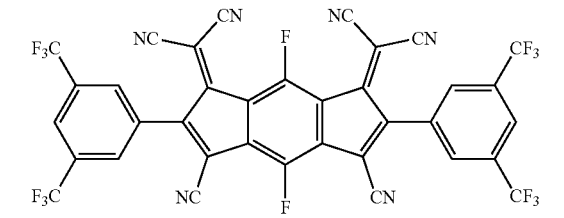
S26
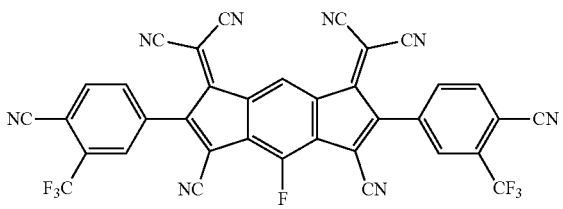
S27
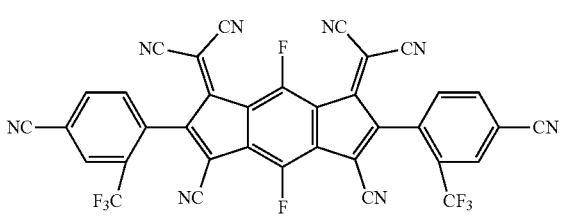
S28
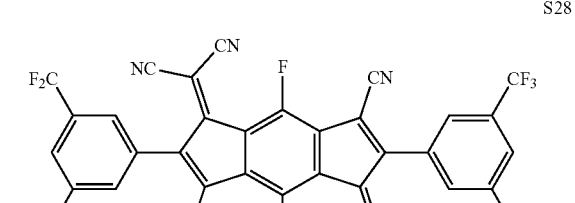
S29
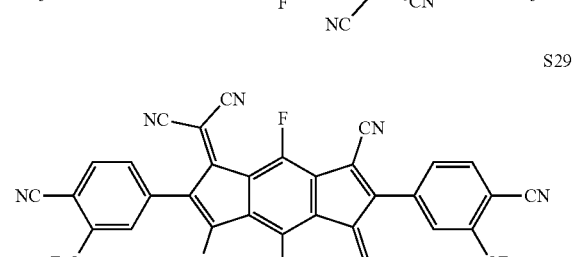
S30
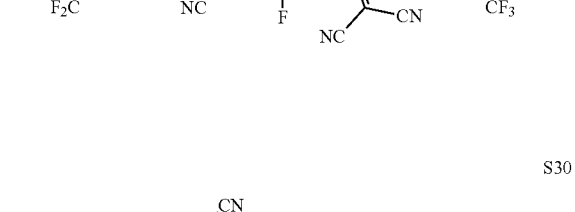
S31
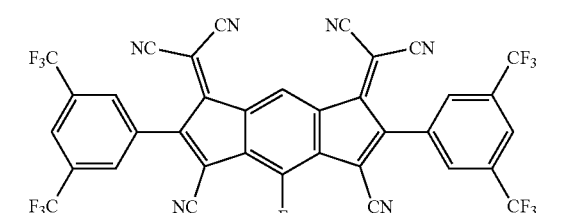

-continued
S32
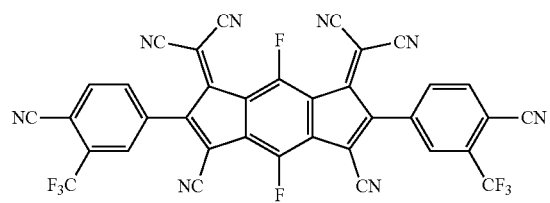
S33
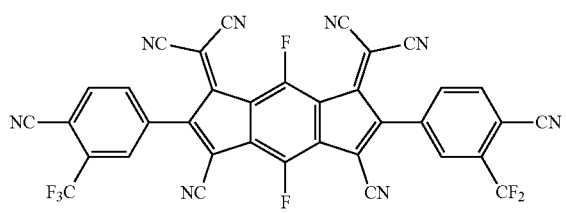
S34
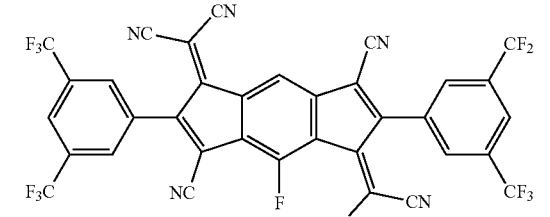
S35
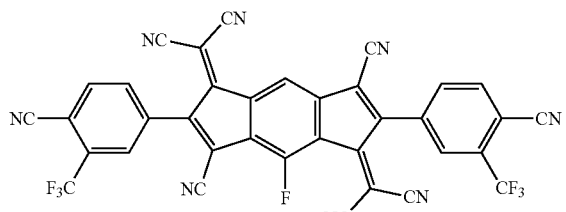
S36
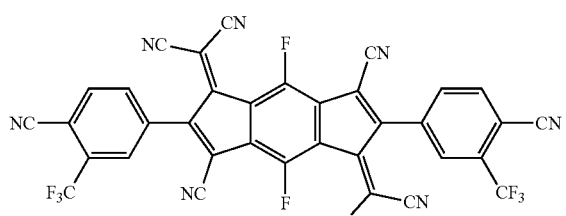
S38
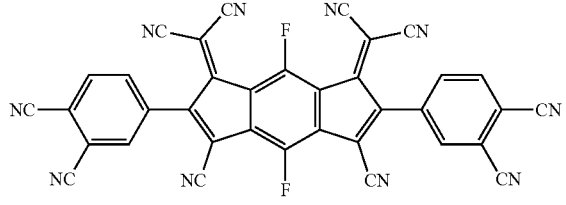
-continued
S39
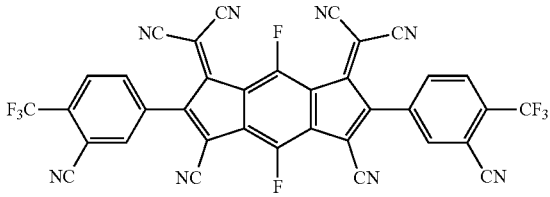
S40
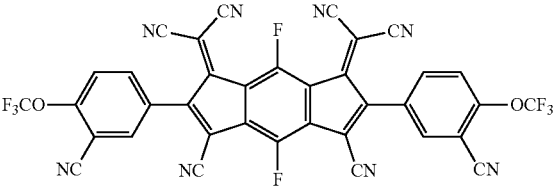
S41
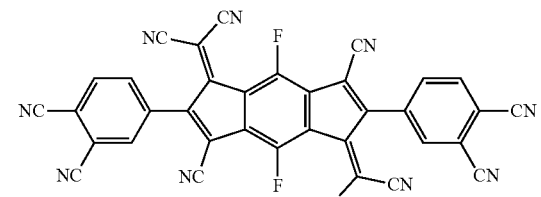
S42
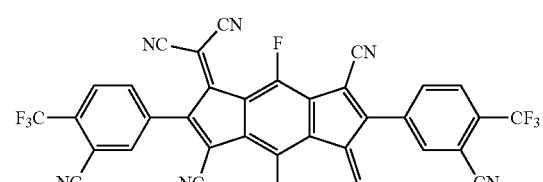
S43
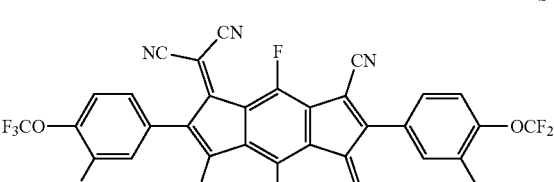
S44
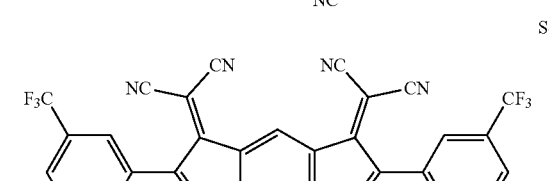
S45
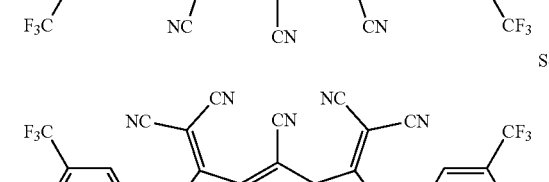
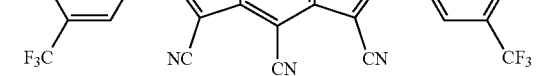

S46
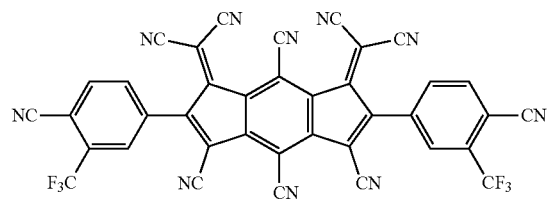
S47
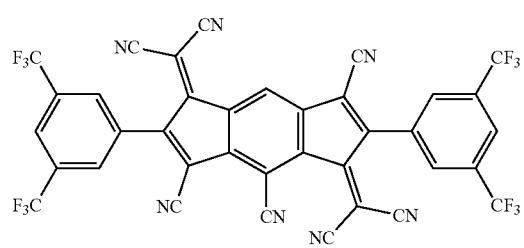
S48
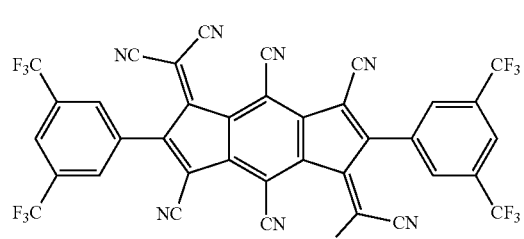
S49
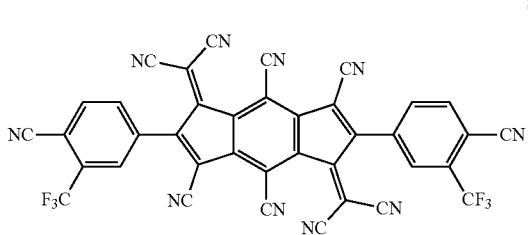
A01
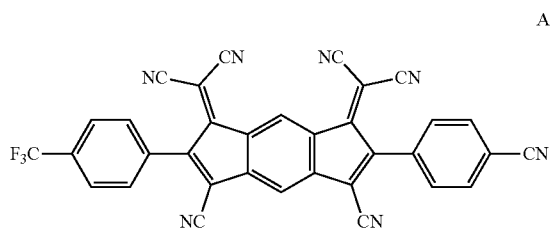
A02
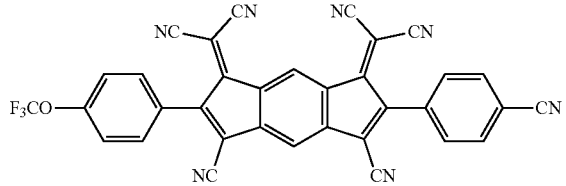
A03
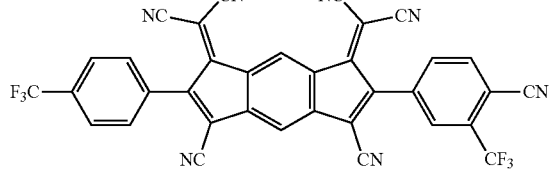
A04
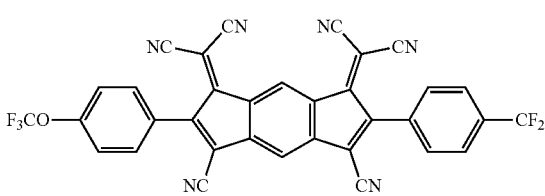
A05
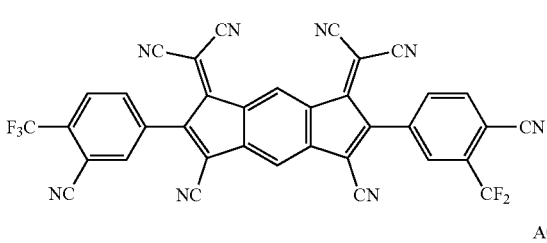
A06
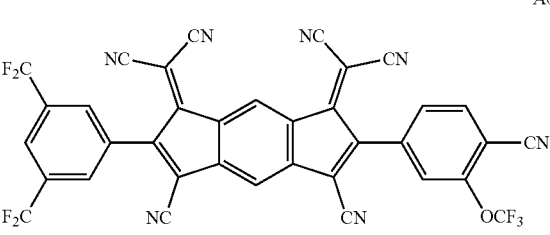
A07
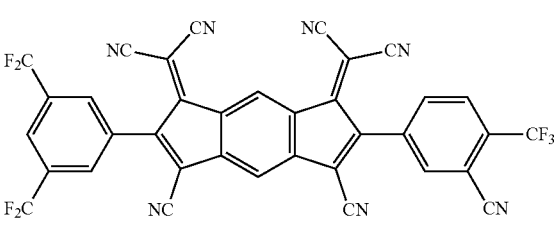
A08
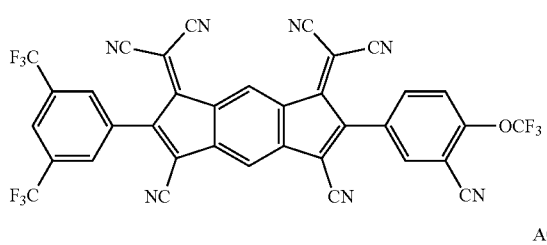
A09
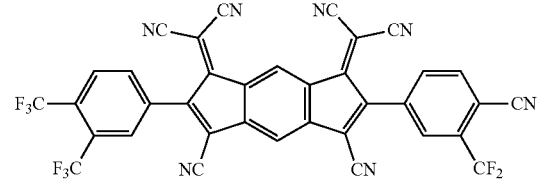
A10
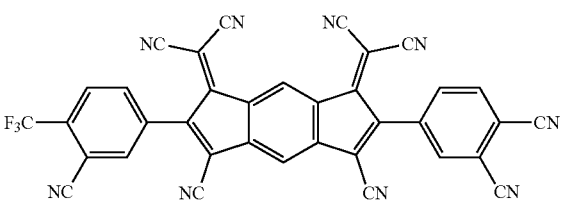

A11
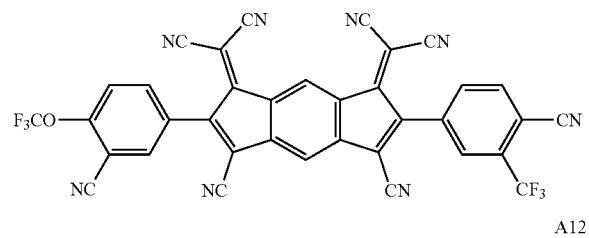
A12
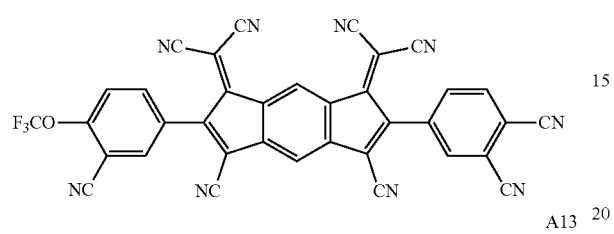
A13
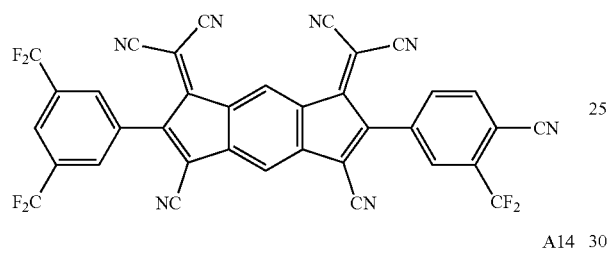
A14
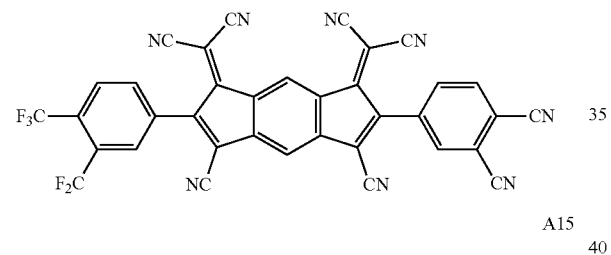
A15
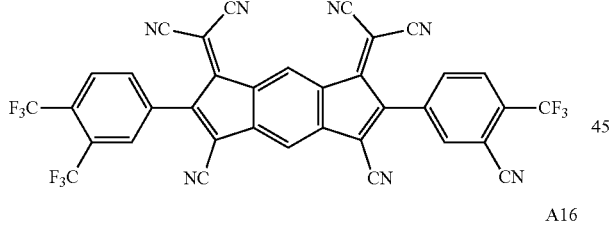
A16
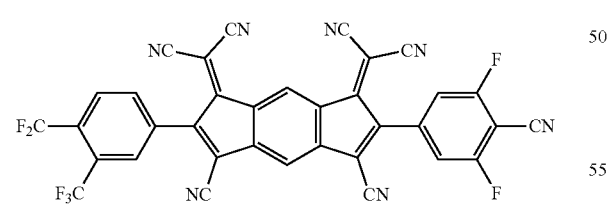
A17
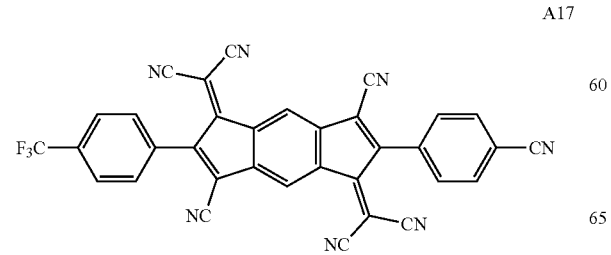
A18
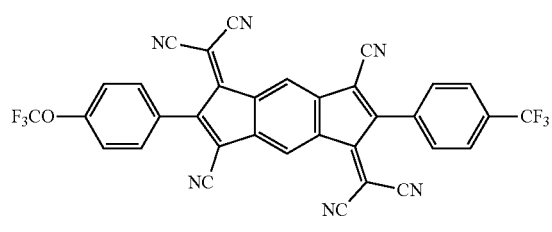
A19
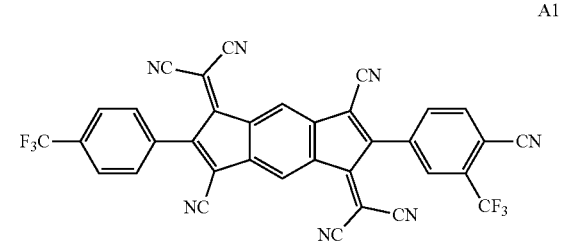
A20
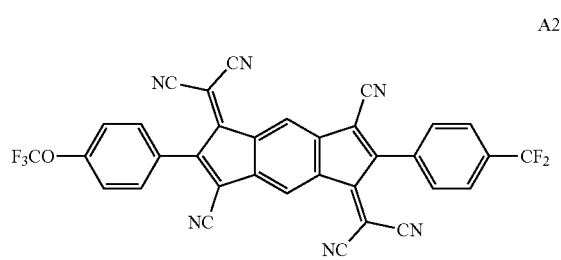
A21
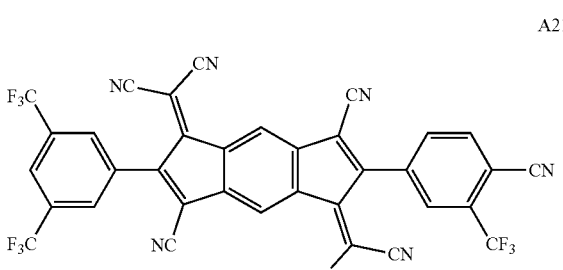
A22
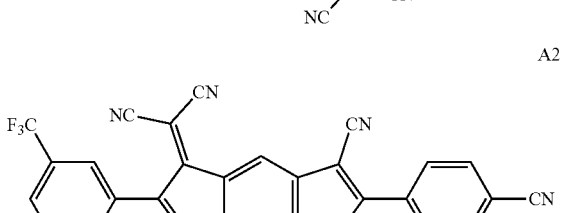
A23
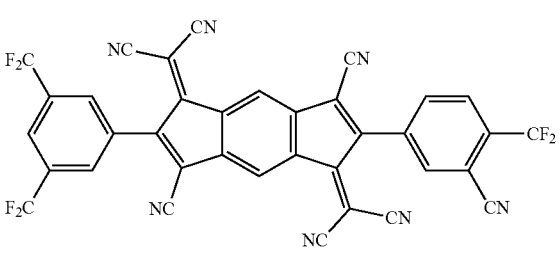

-continued
A24
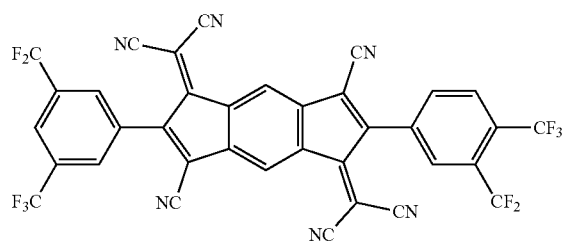
A25
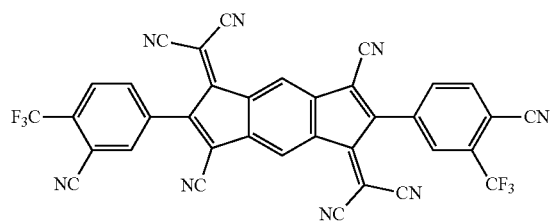
A26
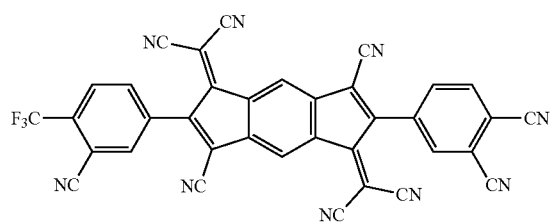
A27
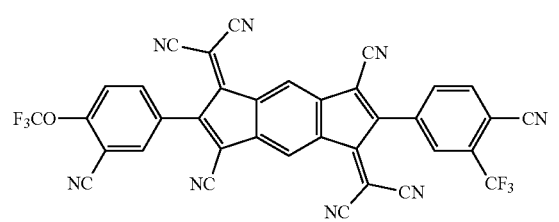
A28
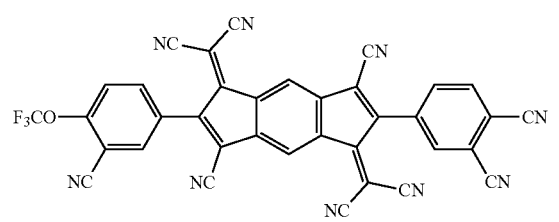
A29
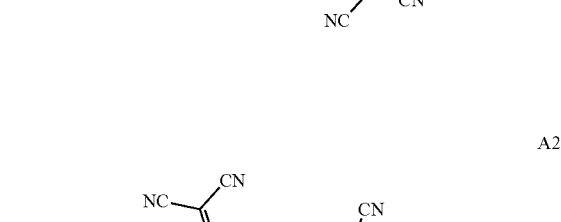
-continued
A30
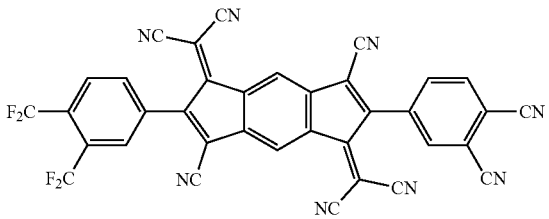
A31
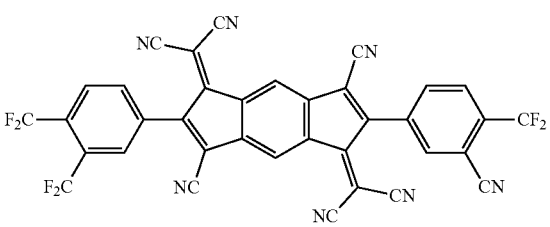
A32
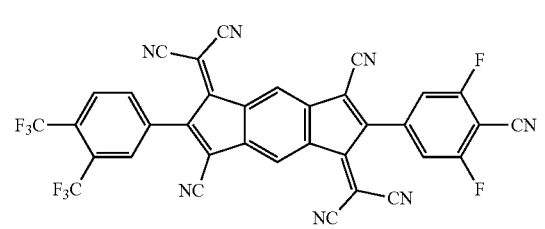
A33
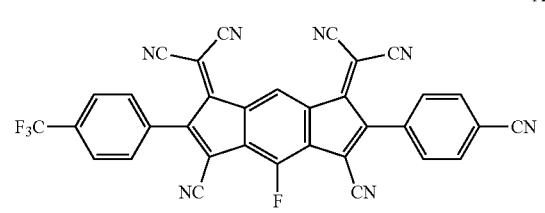
A34
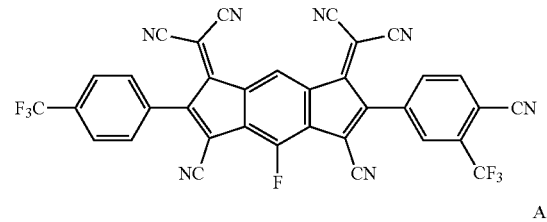
A35
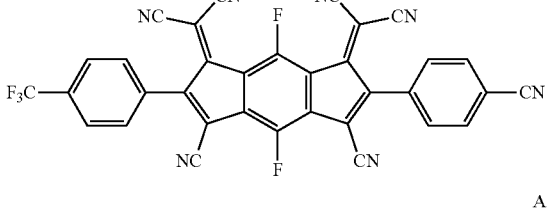
A36
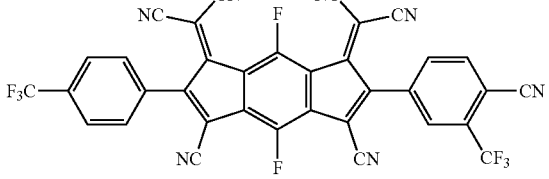

-continued
A37
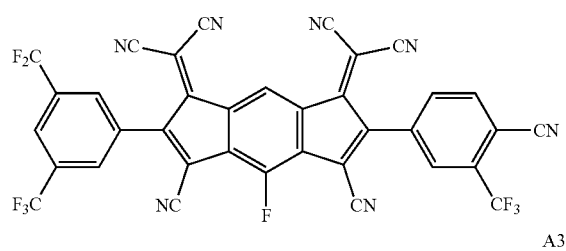
A38
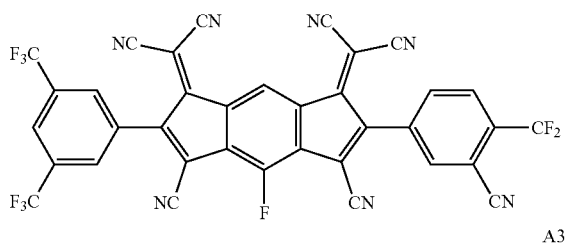
A39
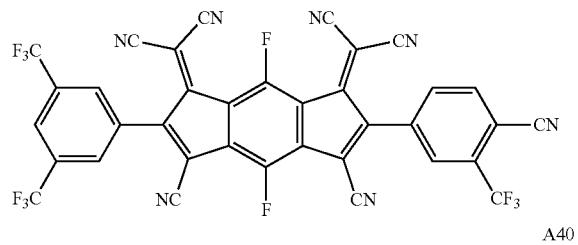
A40
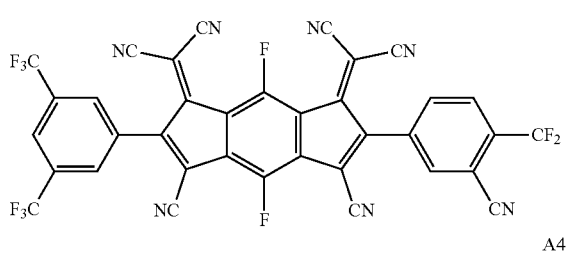
A41
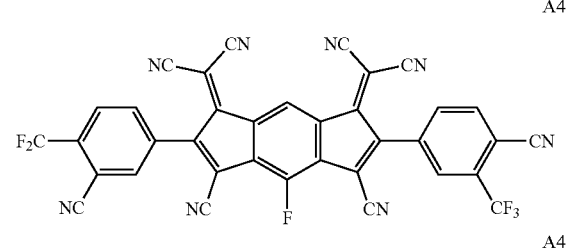
A42
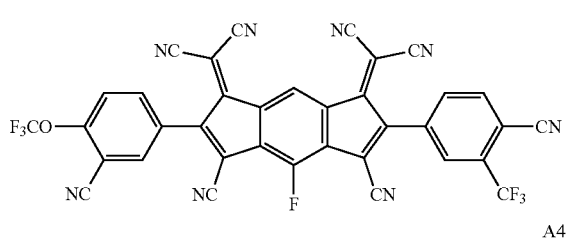
A43
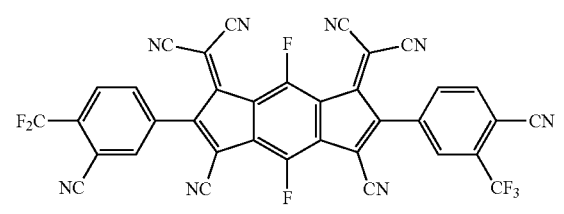
-continued
A44
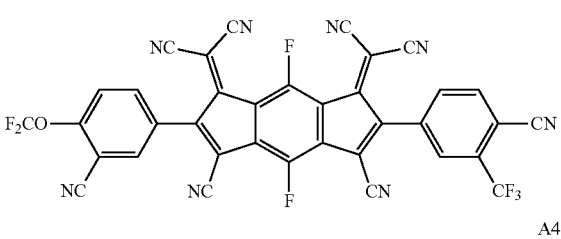
A45
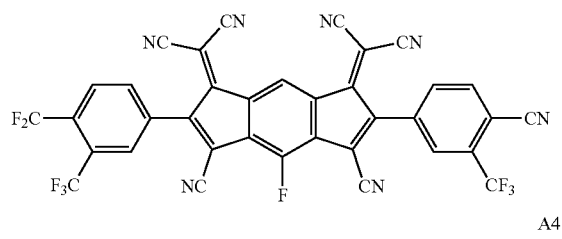
A46
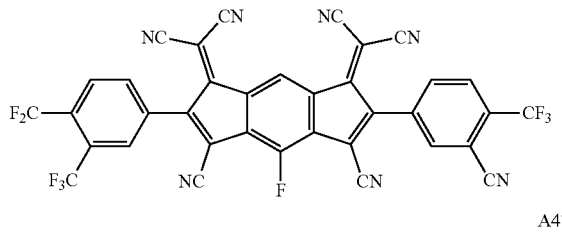
A47
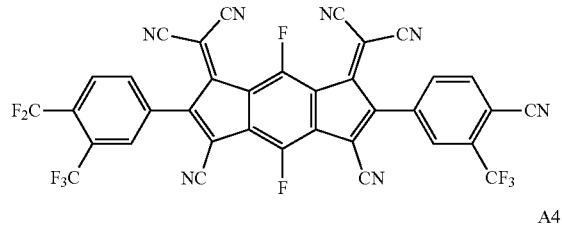
A48
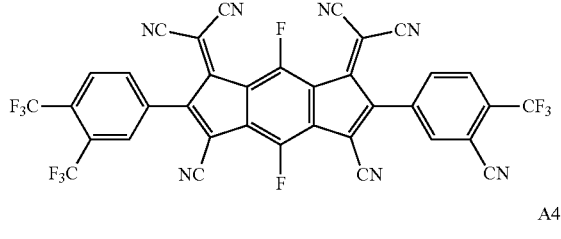
A49
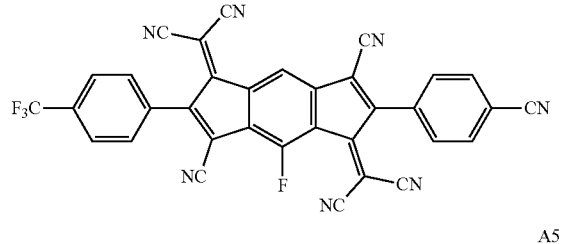
A50
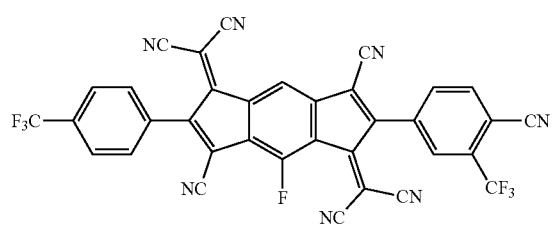

-continued
A51
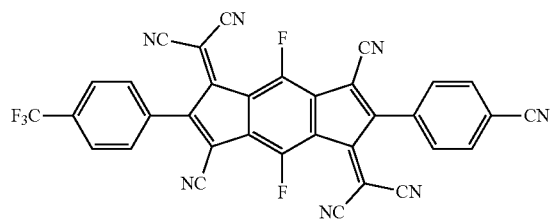
A52
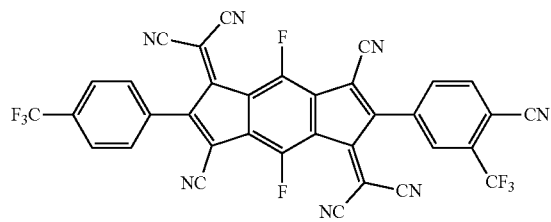
A53
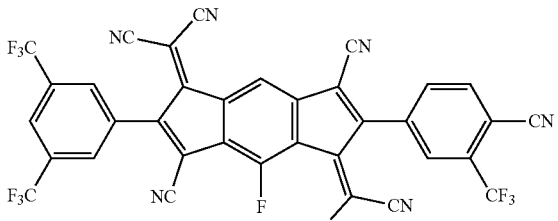
A54
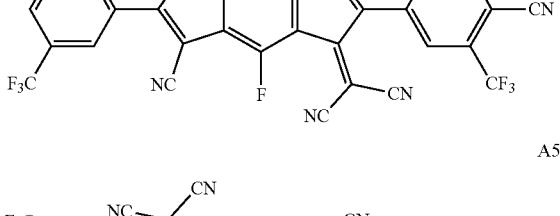
A55
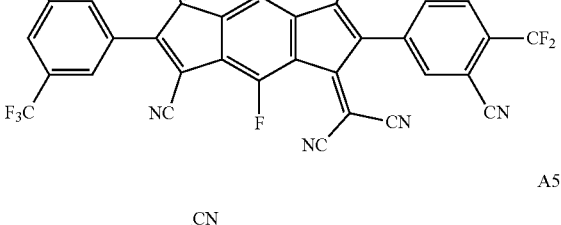
A56
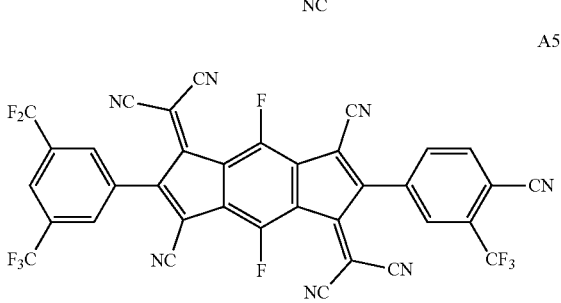
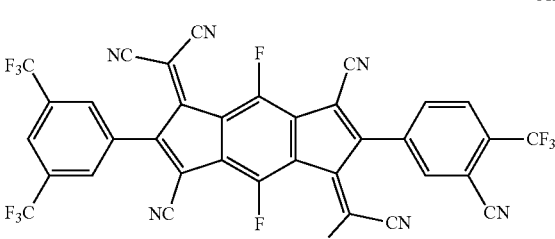
-continued
A57
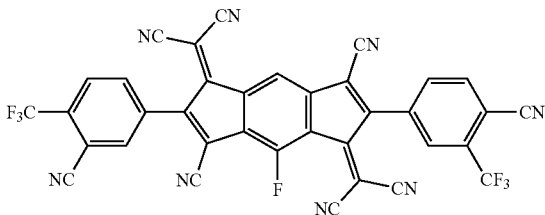
A58
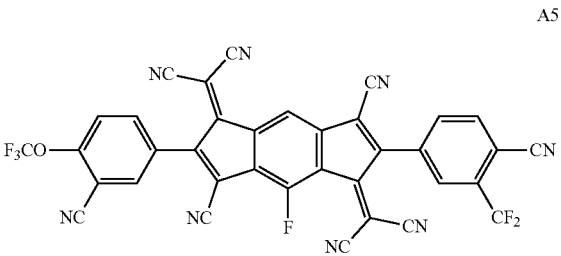
A59
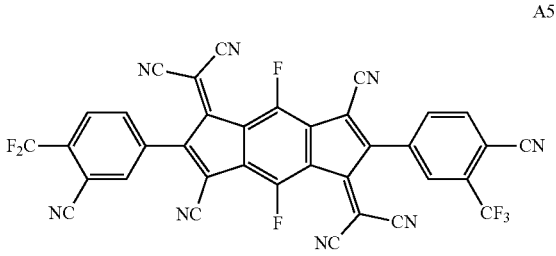
A60
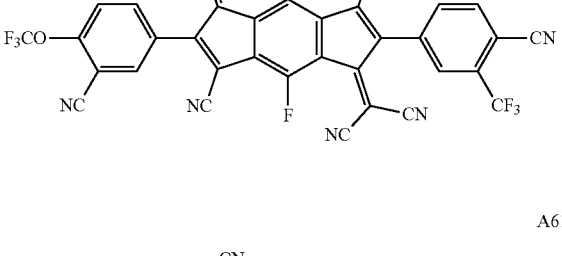
A61
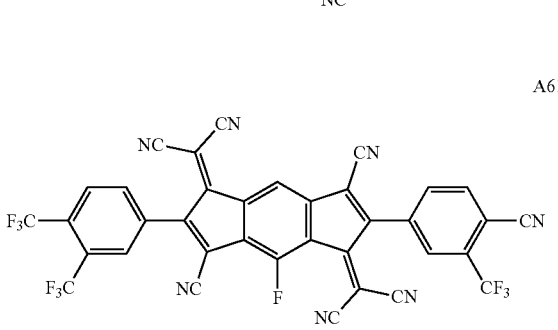
A62
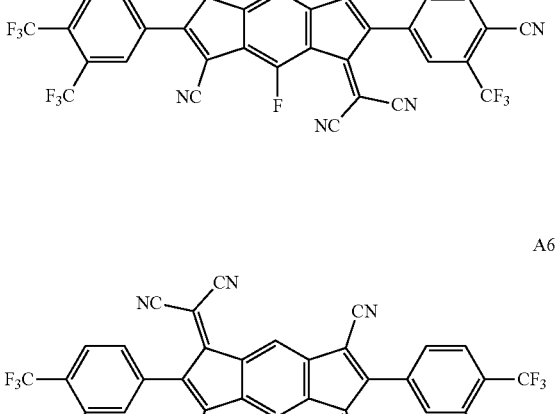

A63
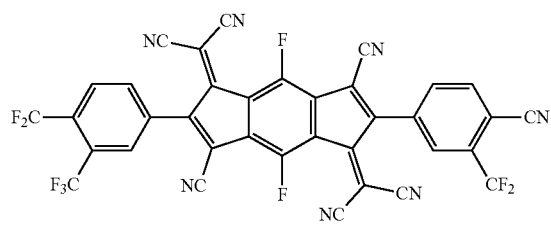
A64
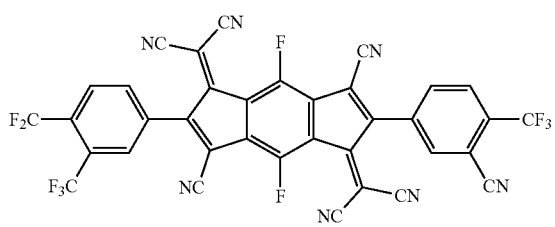
A65
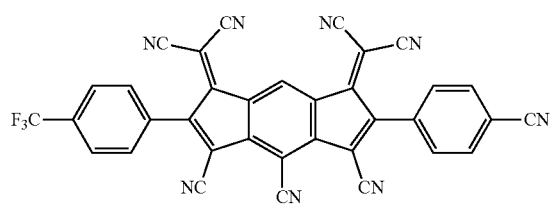
A66
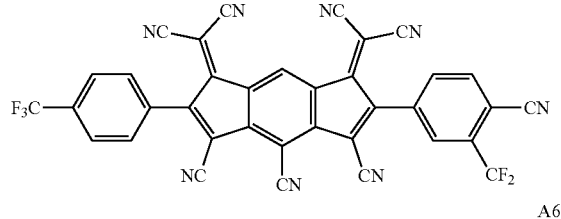
A67
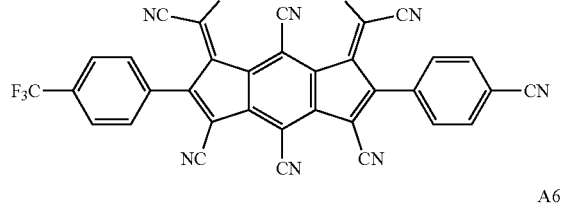
A68
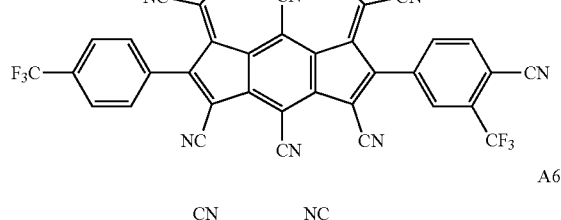
A69
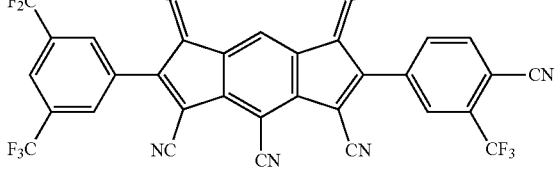
A70
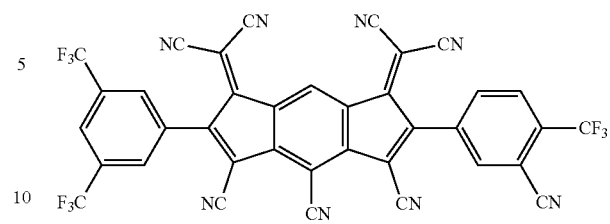
A71
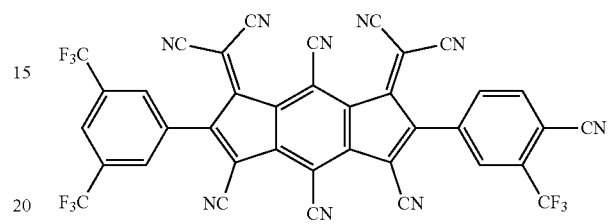
A72
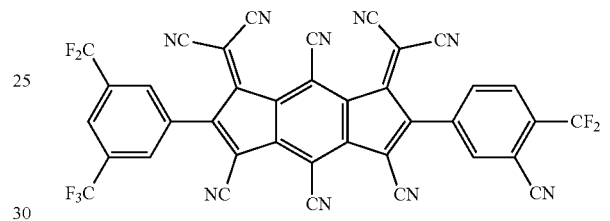
A73
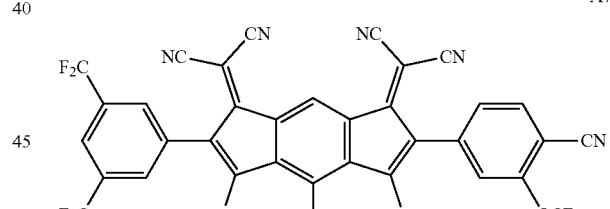
A74
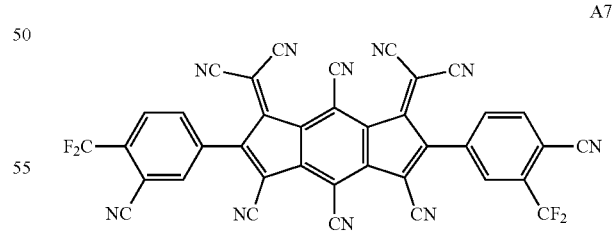
A75
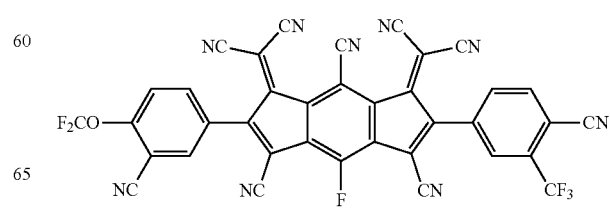
A76

-continued
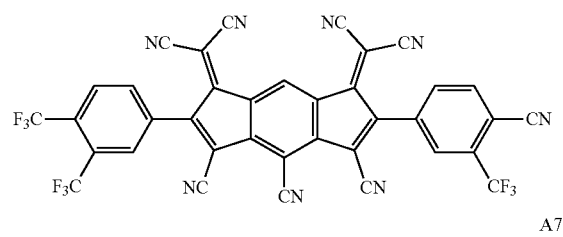
A77
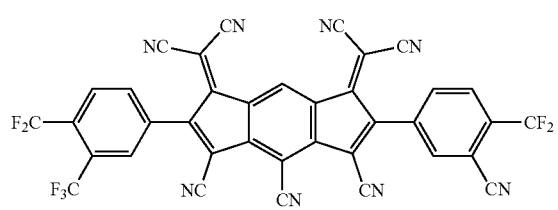
A78
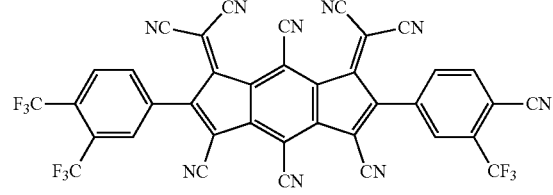
A79
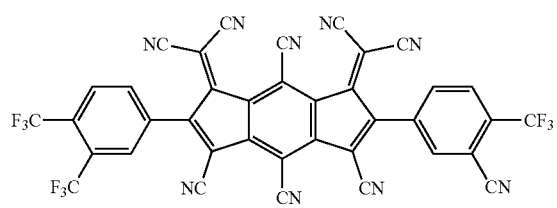
A80
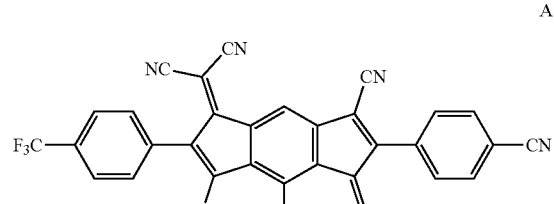
A81
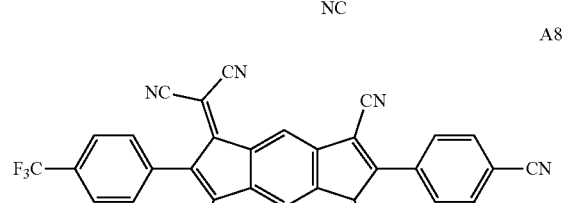
A82
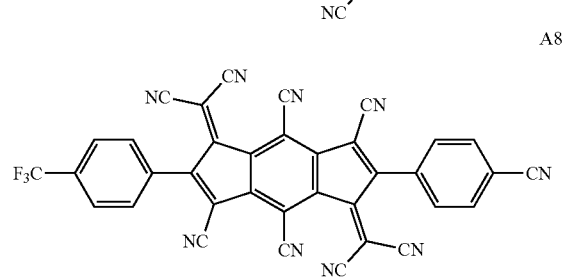
A83
-continued
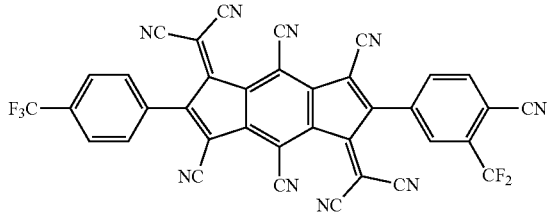
A84
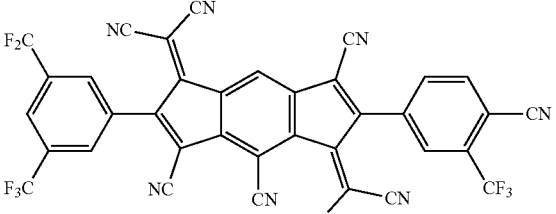
A85
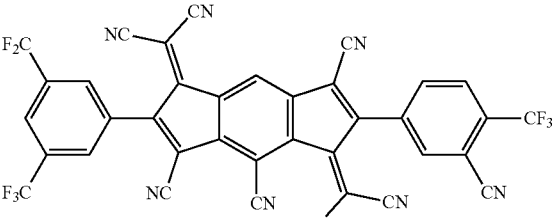
A86
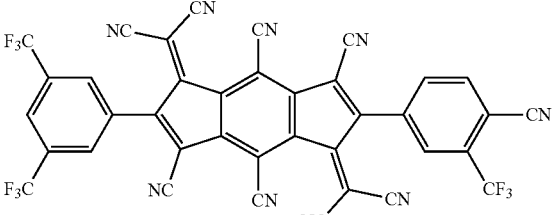
A87
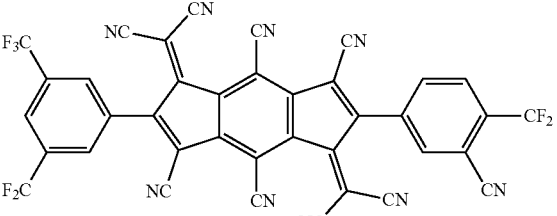
A88
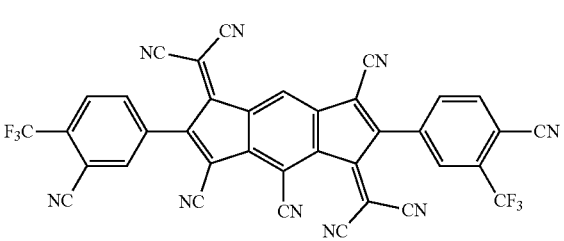
A89

A90
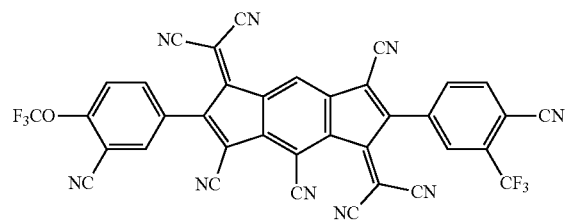
A91
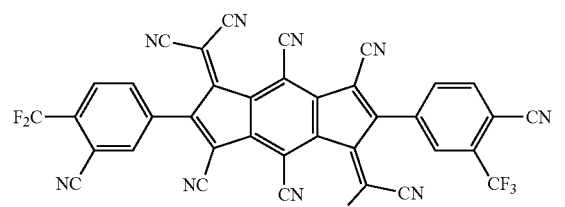
A92
A93
A94
A95
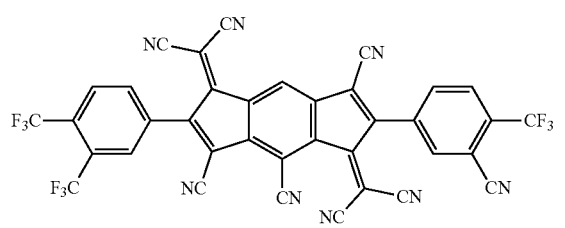
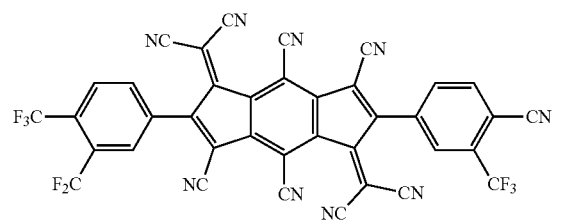
A96
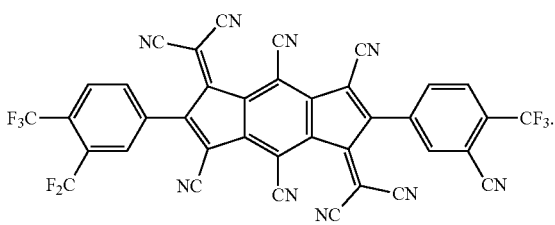
18. The organic light emitting device according to claim 14, wherein the second organic compounds is one of compounds in Formula 4:
[Formula 4]
C1
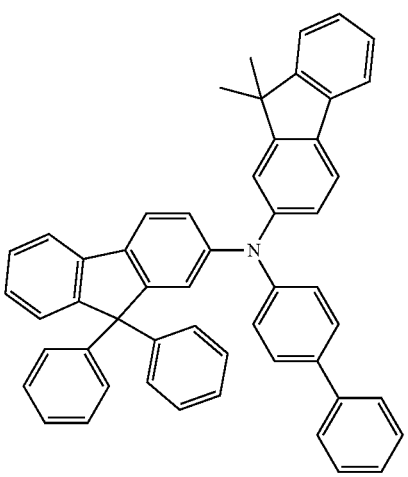
C2
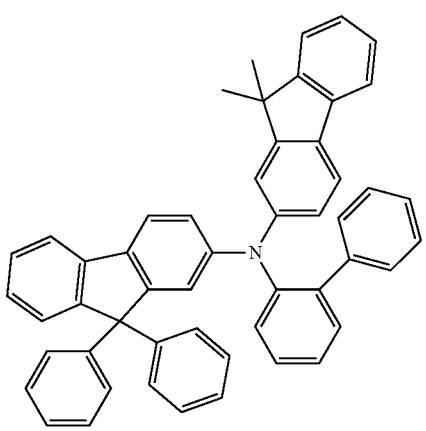

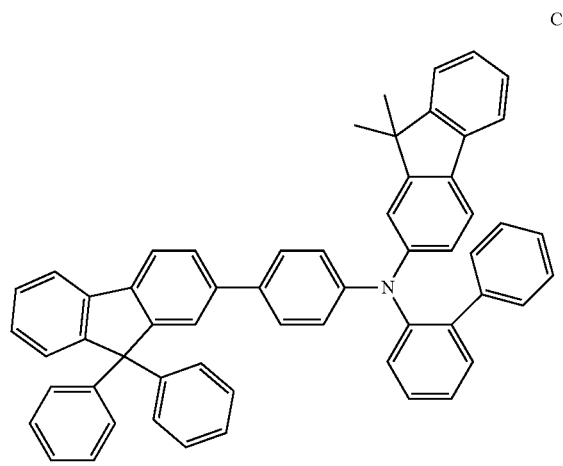
C3
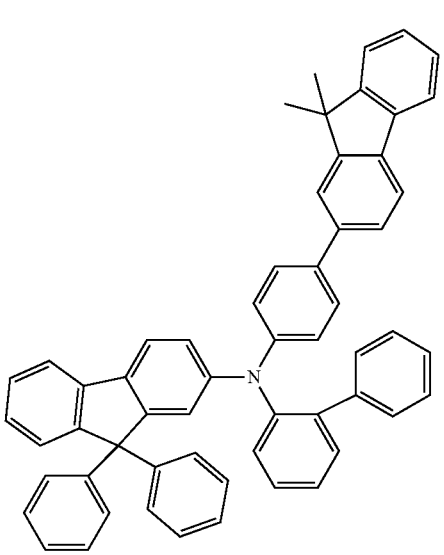
C6
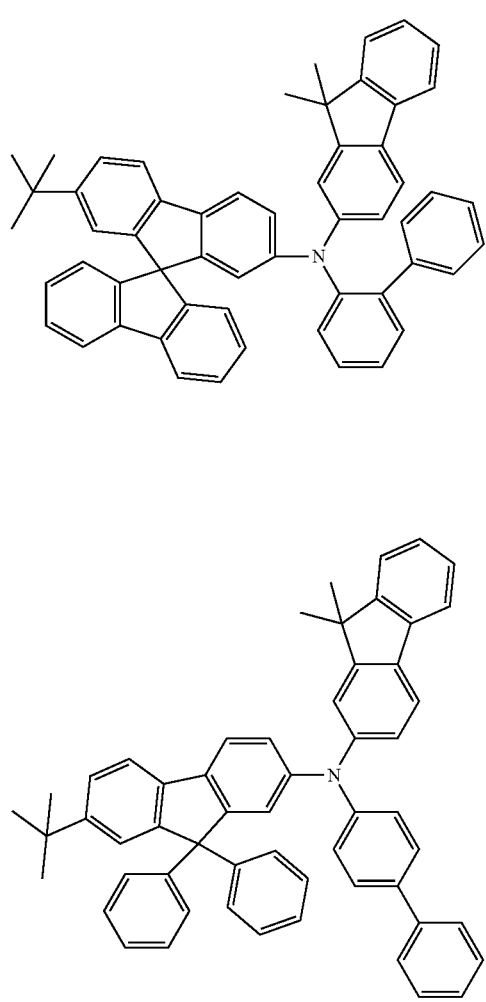
C4
C5
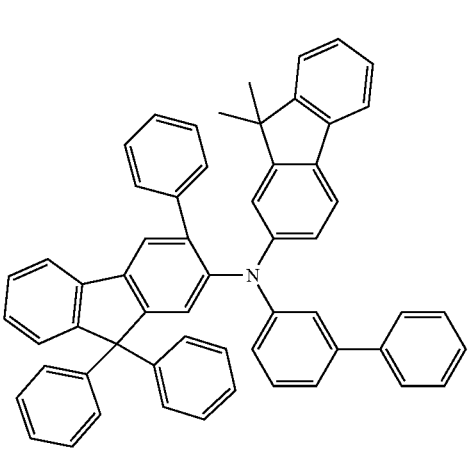
C7
C8

-continued
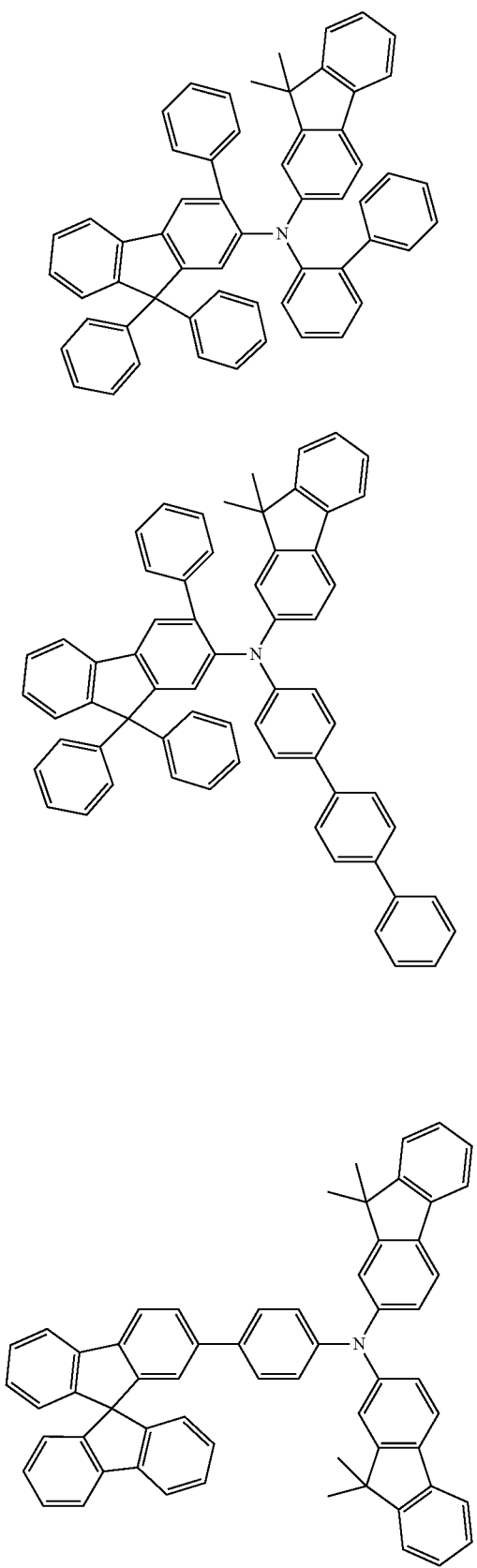
-continued
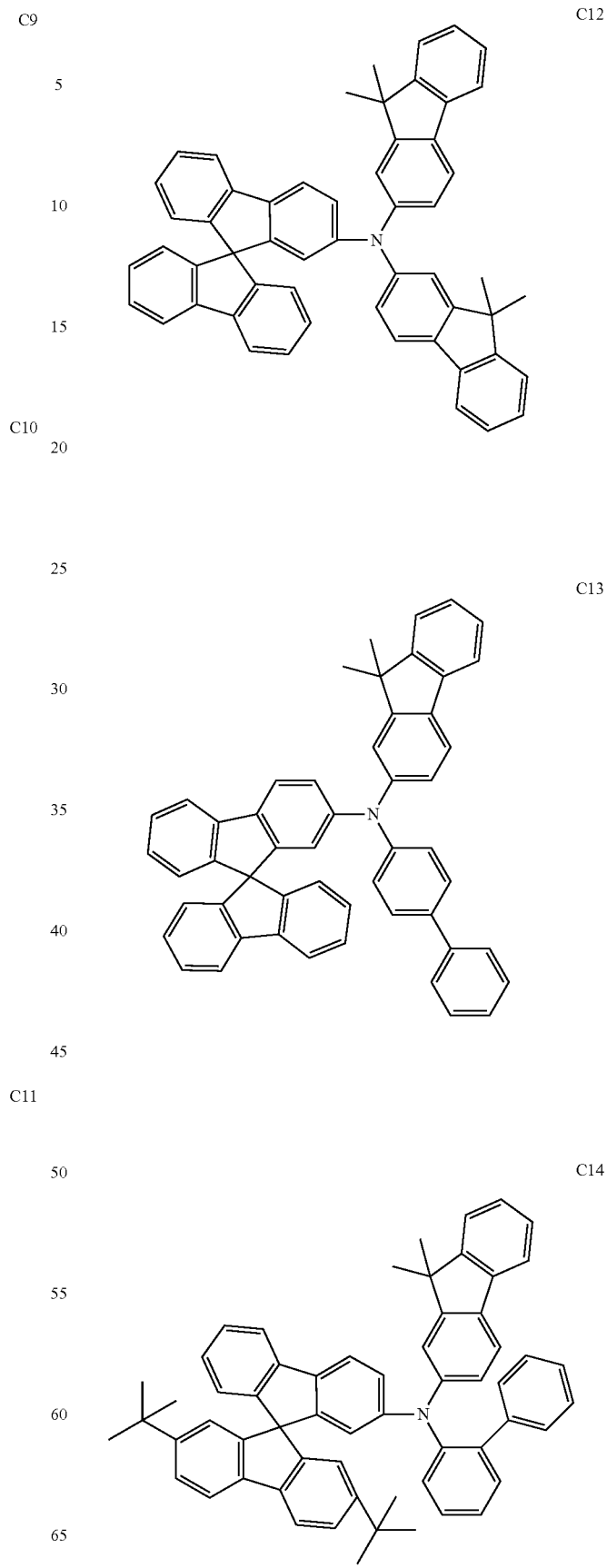

C15
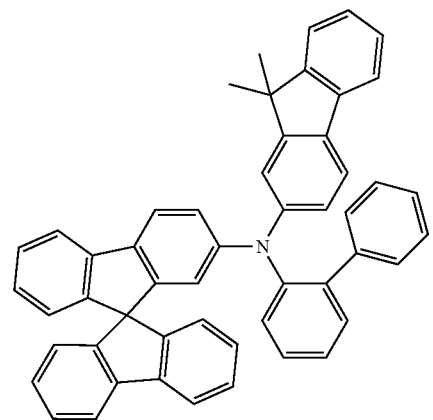
D1
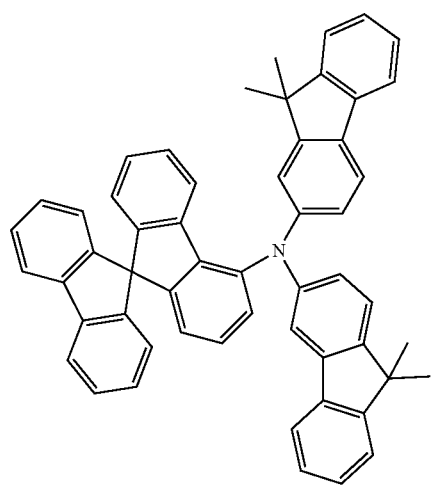
D2
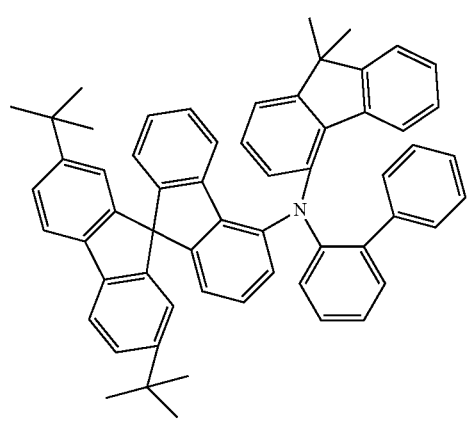
D3
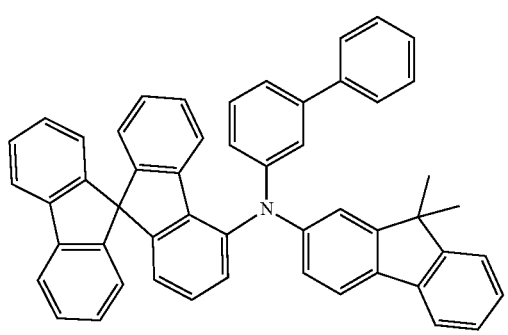
D4
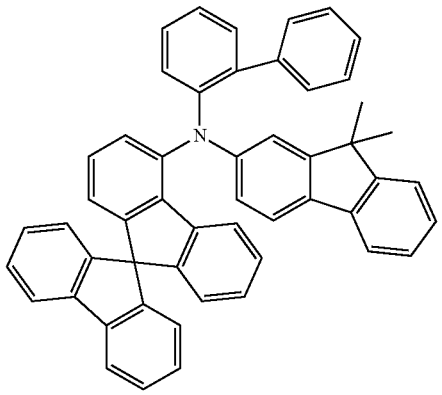
D5
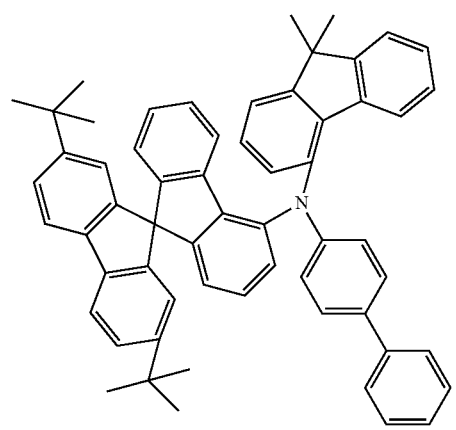
D6
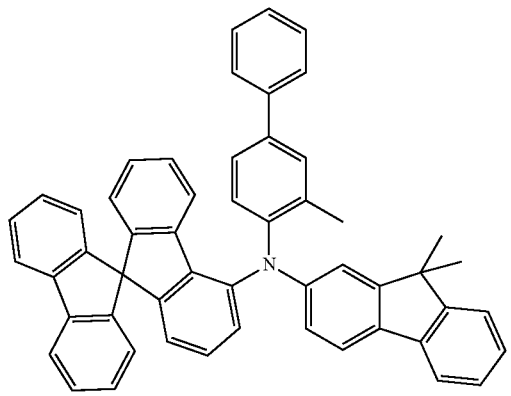
D7
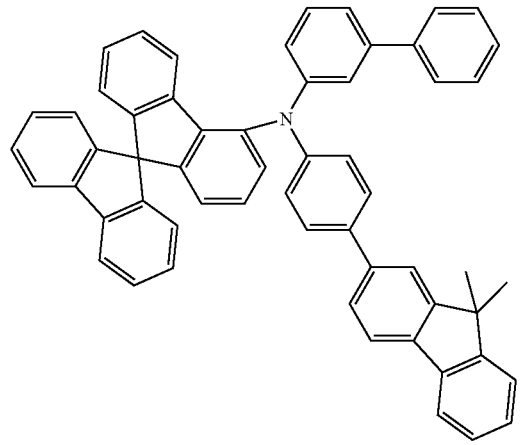

D8
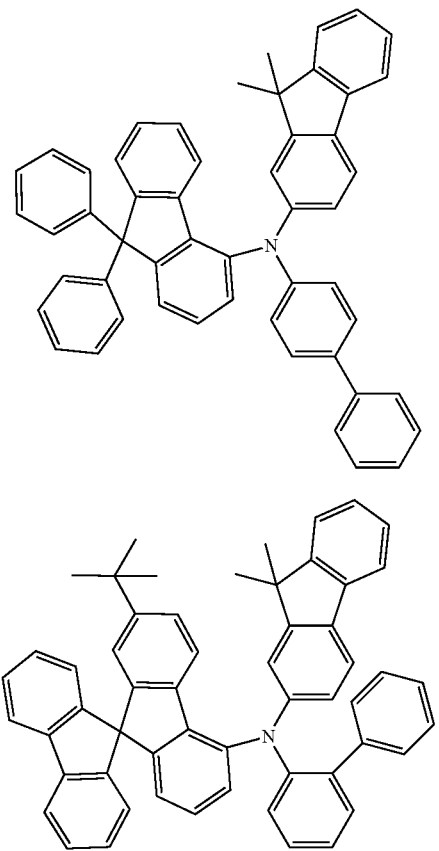
D9
D10
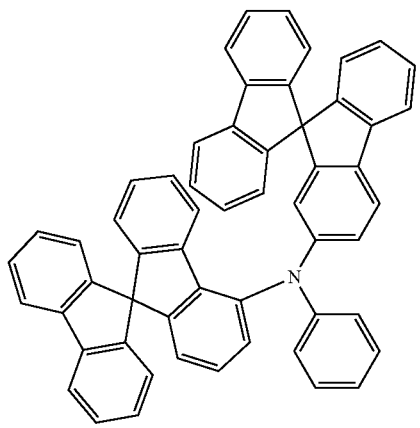
D11
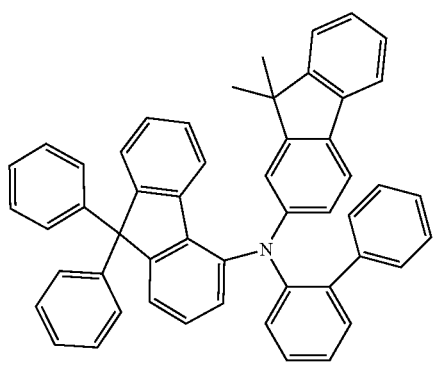
* * * * *